United States Patent
Shibazaki

(10) Patent No.: US 10,197,924 B2
(45) Date of Patent: *Feb. 5, 2019

(54) MOVABLE BODY DRIVE METHOD AND MOVABLE BODY DRIVE SYSTEM, PATTERN FORMATION METHOD AND APPARATUS, EXPOSURE METHOD AND APPARATUS, DEVICE MANUFACTURING METHOD, AND CALIBRATION METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/946,030

(22) Filed: Apr. 5, 2018

(65) Prior Publication Data

US 2018/0224758 A1    Aug. 9, 2018

Related U.S. Application Data

(62) Division of application No. 15/812,592, filed on Nov. 14, 2017, now Pat. No. 9,971,253, which is a division
(Continued)

(30) Foreign Application Priority Data

Sep. 1, 2006    (JP) .................................. 2006-237692

(51) Int. Cl.
*G03F 7/20*    (2006.01)
*H01L 21/68*    (2006.01)
(Continued)

(52) U.S. Cl.
CPC ....... *G03F 7/70775* (2013.01); *G01B 21/042* (2013.01); *G03F 7/70341* (2013.01);
(Continued)

(58) Field of Classification Search
CPC ............. G03F 7/70716; G03F 7/70725; G03F 7/70775; G03F 9/70; G03F 9/7019;
(Continued)

(56) References Cited

U.S. PATENT DOCUMENTS 4,215,938 A    8/1980 Farrand et al.
4,346,164 A    8/1982 Tabarelli et al.
(Continued)

FOREIGN PATENT DOCUMENTS

DE    221 563 A1    4/1985
DE    224 448 A1    7/1985
(Continued)

OTHER PUBLICATIONS

Dec. 11, 2007 Written Opinion of the Search Authority for International Patent Application No. PCT/JP2007/067123.
(Continued)

*Primary Examiner* — Colin Kreutzer
(74) *Attorney, Agent, or Firm* — Oliff PLC

(57) ABSTRACT

A first stage system having a first stage and a first drive system that moves the first stage is configured to hold a mask illuminated with illumination light. A second stage system having a second stage and a second drive system that moves the second stage is configured to hold a substrate. A measurement system having a first encoder system and a second encoder system measures positional information of the first and second stages, respectively. The second encoder system measures the positional information of the second stage with a plurality of heads that face a grating section. The first and second drive systems are controlled based on correction information for compensating for a measurement error of the second encoder system that occurs due to the heads and measurement information of the first and the second encoder systems.

48 Claims, 34 Drawing Sheets

Related U.S. Application Data of application No. 15/650,439, filed on Jul. 14, 2017, now Pat. No. 9,846,374, which is a division of application No. 15/433,269, filed on Feb. 15, 2017, now Pat. No. 9,740,114, which is a division of application No. 15/216,840, filed on Jul. 22, 2016, now Pat. No. 9,625,834, which is a division of application No. 14/459,883, filed on Aug. 14, 2014, now Pat. No. 9,429,854, which is a division of application No. 13/363,079, filed on Jan. 31, 2012, now Pat. No. 9,081,301, which is a division of application No. 11/896,579, filed on Sep. 4, 2007, now Pat. No. 8,134,688.

(51) Int. Cl.
*G03F 9/00* (2006.01)
*G01B 21/04* (2006.01)

(52) U.S. Cl.
CPC ...... *G03F 7/70483* (2013.01); *G03F 7/70716* (2013.01); *G03F 7/70725* (2013.01); *G03F 7/70975* (2013.01); *G03F 9/70* (2013.01); *G03F 9/7046* (2013.01); *G03F 9/7049* (2013.01); *H01L 21/68* (2013.01); *H01L 21/681* (2013.01); *Y10T 29/49002* (2015.01)

(58) Field of Classification Search
CPC .............. G03F 9/7049; G03F 9/7092; H01L 21/68–21/682
USPC ...... 310/12.05, 12.06, 12.19; 355/72, 75, 77
See application file for complete search history.

(56) References Cited

U.S. PATENT DOCUMENTS

| | | |
|---|---|---|
| 4,465,368 A | 8/1984 | Matsuura et al. |
| 4,480,910 A | 11/1984 | Takanashi et al. |
| 4,737,920 A | 4/1988 | Ozawa |
| 4,780,617 A | 10/1988 | Umatate et al. |
| 5,021,649 A | 6/1991 | Nishimura et al. |
| 5,070,250 A | 12/1991 | Komatsu et al. |
| 5,160,849 A | 11/1992 | Ota et al. |
| 5,247,165 A | 9/1993 | Hiruta et al. |
| 5,448,332 A | 9/1995 | Sakakibara et al. |
| 5,461,237 A | 10/1995 | Wakamoto et al. |
| 5,489,986 A | 2/1996 | Magome et al. |
| 5,506,684 A | 4/1996 | Ota et al. |
| 5,523,843 A | 6/1996 | Yamane et al. |
| 5,581,324 A | 12/1996 | Miyai et al. |
| 5,583,609 A | 12/1996 | Mizutani et al. |
| 5,610,683 A | 3/1997 | Takahashi |
| 5,610,715 A | 3/1997 | Yoshii et al. |
| 5,625,453 A | 4/1997 | Matsumoto et al. |
| 5,650,840 A | 7/1997 | Taniguchi |
| 5,715,039 A | 2/1998 | Fukuda et al. |
| 5,825,043 A | 10/1998 | Suwa |
| 5,917,580 A | 6/1999 | Ebinuma et al. |
| 6,008,610 A | 12/1999 | Yuan et al. |
| 6,020,964 A | 2/2000 | Loopstra et al. |
| 6,122,036 A | 9/2000 | Yamasaki et al. |
| 6,262,796 B1 | 7/2001 | Loopstra et al. |
| 6,335,787 B1 | 1/2002 | Nishi |
| 6,341,007 B1 | 1/2002 | Nishi et al. |
| 6,381,004 B1 | 4/2002 | Hagiwara et al. |
| 6,486,955 B1 | 11/2002 | Nishi |
| 6,495,847 B1 | 12/2002 | Asano et al. |
| 6,501,532 B2 | 12/2002 | Suzuki |
| 6,611,316 B2 | 8/2003 | Sewell |
| 6,639,686 B1 | 10/2003 | Ohara |
| 6,674,510 B1 | 1/2004 | Jasper et al. |
| 6,778,257 B2 | 8/2004 | Bleeker et al. |
| 6,819,425 B2 | 11/2004 | Kwan |
| 7,023,610 B2 | 4/2006 | Ohtsuki et al. |
| 7,025,498 B2 | 4/2006 | del Puerto |
| 7,075,616 B2 | 7/2006 | Derksen et al. |
| 7,102,729 B2 | 9/2006 | Renkens et al. |
| 7,161,659 B2 | 1/2007 | Van Den Brink et al. |
| 7,224,436 B2 | 5/2007 | Derksen et al. |
| 7,230,682 B2 | 6/2007 | Shimizu et al. |
| 7,253,875 B1 | 8/2007 | Luttikhuis et al. |
| 7,256,871 B2 | 8/2007 | Loopstra et al. |
| 7,257,902 B2 | 8/2007 | Gao et al. |
| 7,289,212 B2 | 10/2007 | Kwan |
| 7,292,312 B2 | 11/2007 | Loopstra et al. |
| 7,333,174 B2 | 2/2008 | Koenen et al. |
| 7,348,574 B2 | 3/2008 | Pril et al. |
| 7,349,069 B2 | 3/2008 | Beems et al. |
| 7,362,446 B2 | 4/2008 | Van Der Pasch et al. |
| 7,405,811 B2 | 7/2008 | Beems et al. |
| 7,408,655 B2 | 8/2008 | Loopstra et al. |
| 7,483,120 B2 | 1/2009 | Luttikhuis et al. |
| 7,515,281 B2 | 4/2009 | Loopstra et al. |
| 7,515,719 B2 | 4/2009 | Hooley et al. |
| 7,528,965 B2 | 5/2009 | Loopstra et al. |
| 7,602,489 B2 | 10/2009 | Van Der Pasch et al. |
| 7,619,207 B2 | 11/2009 | Loopstra et al. |
| 7,636,165 B2 | 12/2009 | Klaver et al. |
| 7,710,540 B2 | 5/2010 | Loopstra et al. |
| 7,859,686 B2 | 12/2010 | Loopstra et al. |
| 7,880,901 B2 | 2/2011 | Loopstra et al. |
| 8,013,982 B2 | 9/2011 | Shibazaki |
| 8,203,697 B2 | 6/2012 | Shibazaki |
| 8,675,171 B2 | 3/2014 | Shibazaki |
| 9,377,698 B2 | 6/2016 | Shibazaki |
| 9,429,854 B2 | 8/2016 | Shibazaki |
| 9,740,114 B2 | 8/2017 | Shibazaki |
| 9,874,822 B2 | 1/2018 | Shibazaki |
| 9,971,253 B2* | 5/2018 | Shibazaki ........... G03F 7/70725 |
| 2001/0013927 A1 | 8/2001 | Itoh et al. |
| 2001/0028456 A1 | 10/2001 | Nishi |
| 2001/0029674 A1 | 10/2001 | Cutler |
| 2002/0021450 A1 | 2/2002 | Aoki |
| 2002/0041377 A1 | 4/2002 | Hagiwara et al. |
| 2002/0041380 A1 | 4/2002 | Kwan |
| 2002/0061469 A1 | 5/2002 | Tanaka |
| 2003/0011771 A1 | 1/2003 | Moriyama |
| 2003/0025890 A1 | 2/2003 | Nishinaga |
| 2003/0164934 A1 | 9/2003 | Nishi et al. |
| 2004/0130691 A1 | 7/2004 | Boonman et al. |
| 2004/0165159 A1 | 8/2004 | Lof et al. |
| 2004/0263846 A1 | 12/2004 | Kwan |
| 2005/0030507 A1 | 2/2005 | Teunissen et al. |
| 2005/0128461 A1 | 6/2005 | Beems et al. |
| 2005/0168714 A1 | 8/2005 | Renkens et al. |
| 2005/0190375 A1 | 9/2005 | Akimoto |
| 2005/0231694 A1 | 10/2005 | Kolesnychenko et al. |
| 2005/0274878 A1 | 12/2005 | Goldman et al. |
| 2006/0023178 A1 | 2/2006 | Loopstra et al. |
| 2006/0023194 A1 | 2/2006 | Loopstra et al. |
| 2006/0082784 A1 | 4/2006 | Akimoto |
| 2006/0092419 A1 | 5/2006 | Gui |
| 2006/0132737 A1 | 6/2006 | Magome et al. |
| 2006/0139595 A1 | 6/2006 | Koenen et al. |
| 2006/0139660 A1 | 6/2006 | Kwan |
| 2006/0170892 A1 | 8/2006 | Koenen et al. |
| 2006/0227308 A1 | 10/2006 | Brink et al. |
| 2006/0227309 A1 | 10/2006 | Loopstra et al. |
| 2006/0238731 A1 | 10/2006 | Beems et al. |
| 2006/0238733 A1 | 10/2006 | Beems et al. |
| 2007/0035267 A1 | 2/2007 | Gao et al. |
| 2007/0051160 A1 | 3/2007 | Pril et al. |
| 2007/0052976 A1 | 3/2007 | Pril et al. |
| 2007/0058146 A1 | 3/2007 | Yamaguchi |
| 2007/0076218 A1 | 4/2007 | Van Empel et al. |
| 2007/0195296 A1 | 8/2007 | Van Der Pasch et al. |
| 2007/0211235 A1 | 9/2007 | Shibazaki |
| 2007/0223007 A1 | 9/2007 | Klaver et al. |
| 2007/0256471 A1 | 11/2007 | Loopstra et al. |
| 2007/0258079 A1 | 11/2007 | Kamidi et al. |
| 2007/0263191 A1 | 11/2007 | Shibazaki |
| 2007/0263197 A1 | 11/2007 | Luttikhuis et al. |
| 2007/0288121 A1 | 12/2007 | Shibazaki |

(56) References Cited

U.S. PATENT DOCUMENTS

| | | |
|---|---|---|
| 2008/0032234 A1 | 2/2008 | Mizutani |
| 2008/0043212 A1 | 2/2008 | Shibazaki |
| 2008/0074681 A1 | 3/2008 | Loopstra et al. |
| 2008/0088843 A1 | 4/2008 | Shibazaki |
| 2008/0094592 A1 | 4/2008 | Shibazaki |
| 2008/0094604 A1 | 4/2008 | Shibazaki |
| 2008/0105026 A1 | 5/2008 | Loopstra et al. |
| 2008/0106722 A1 | 5/2008 | Shibazaki |
| 2008/0123067 A1 | 5/2008 | Yoda et al. |
| 2008/0218713 A1 | 9/2008 | Shibazaki |
| 2008/0240501 A1 | 10/2008 | Van Der Wijst et al. |
| 2008/0246936 A1 | 10/2008 | Loopstra et al. |
| 2008/0309950 A1 | 12/2008 | Kwan |
| 2009/0033900 A1 | 2/2009 | Kanaya |
| 2009/0207422 A1 | 8/2009 | Loopstra et al. |
| 2009/0268178 A1 | 10/2009 | Shibazaki |
| 2010/0220335 A1 | 9/2010 | Loopstra et al. |
| 2011/0075154 A1 | 3/2011 | Loopstra et al. |

FOREIGN PATENT DOCUMENTS

| | | |
|---|---|---|
| EP | 0 482 553 A2 | 4/1992 |
| EP | 1 079 223 A1 | 2/2001 |
| EP | 1 420 298 A2 | 5/2004 |
| EP | 1 621 933 A2 | 2/2006 |
| EP | 1 630 585 A1 | 3/2006 |
| EP | 2 003 680 A1 | 12/2008 |
| EP | 2 071 612 A1 | 6/2009 |
| JP | S57-117238 A | 7/1982 |
| JP | S58-202448 A | 11/1983 |
| JP | S59-019912 A | 2/1984 |
| JP | S61-44429 A | 3/1986 |
| JP | S62-065326 A | 3/1987 |
| JP | S63-157419 A | 6/1988 |
| JP | S63-292005 A | 11/1988 |
| JP | H03-167419 A | 7/1991 |
| JP | H04-265805 A | 9/1992 |
| JP | H04-305915 A | 10/1992 |
| JP | H04-305917 A | 10/1992 |
| JP | H05-062871 A | 3/1993 |
| JP | H05-062877 A | 3/1993 |
| JP | H05-129184 A | 5/1993 |
| JP | H06-124873 A | 5/1994 |
| JP | H06-283403 A | 10/1994 |
| JP | H07-190741 A | 7/1995 |
| JP | H07-220990 A | 8/1995 |
| JP | H07-270122 A | 10/1995 |
| JP | H08-316125 A | 11/1996 |
| JP | H09-223650 A | 8/1997 |
| JP | H09-318321 A | 12/1997 |
| JP | H10-063011 A | 3/1998 |
| JP | H10-214783 A | 8/1998 |
| JP | H10-223528 A | 8/1998 |
| JP | H10-303114 A | 11/1998 |
| JP | H10-340846 A | 12/1998 |
| JP | H11-016816 A | 1/1999 |
| JP | H11-176727 A | 7/1999 |
| JP | H11-233420 A | 8/1999 |
| JP | 2000-058436 A | 2/2000 |
| JP | 2000-068192 A | 3/2000 |
| JP | 2000-323405 A | 11/2000 |
| JP | 2001-188017 A | 7/2001 |
| JP | 2001-313250 A | 11/2001 |
| JP | 2002-014005 A | 1/2002 |
| JP | 2002-090114 A | 3/2002 |
| JP | 2002-151405 A | 5/2002 |
| JP | 3303386 B2 | 7/2002 |
| JP | 2003-022959 A | 1/2003 |
| JP | 2003-249443 A | 9/2003 |
| JP | 2003-347184 A | 12/2003 |
| JP | 2004-101362 A | 4/2004 |
| JP | 2004-519850 A | 7/2004 |
| JP | 2005-249452 A | 9/2005 |
| JP | 2005-252246 A | 9/2005 |
| JP | 2005-268608 A | 9/2005 |
| JP | 2005-268742 A | 9/2005 |
| JP | 2005-286286 A | 10/2005 |
| JP | 2005-308592 A | 11/2005 |
| JP | 2006-054452 A | 2/2006 |
| JP | 2006-114891 A | 4/2006 |
| JP | 2006-120699 A | 5/2006 |
| JP | 2006-201586 A | 8/2006 |
| JP | 2006-210570 A | 8/2006 |
| JP | 2007-071874 A | 3/2007 |
| JP | 2007-093546 A | 4/2007 |
| JP | 2012-138621 A | 7/2012 |
| TW | 200604755 A | 2/2006 |
| WO | 98/40791 A1 | 9/1998 |
| WO | 99/46835 A1 | 9/1999 |
| WO | 99/49504 A1 | 9/1999 |
| WO | 99/60361 A1 | 11/1999 |
| WO | 01/35168 A1 | 5/2001 |
| WO | 02/069049 A2 | 9/2002 |
| WO | 03/065428 A1 | 8/2003 |
| WO | 2004/019128 A2 | 3/2004 |
| WO | 2004/053955 A1 | 6/2004 |
| WO | 2004/092833 A2 | 10/2004 |
| WO | 2004/107011 A1 | 12/2004 |
| WO | 2005/074014 A1 | 8/2005 |
| WO | 2005/090902 A1 | 9/2005 |
| WO | 2005/124834 A1 | 12/2005 |
| WO | 2006/030902 A1 | 3/2006 |
| WO | 2006/038952 A2 | 4/2006 |
| WO | 2006/057263 A1 | 6/2006 |

OTHER PUBLICATIONS

Dec. 11, 2007 International Search Report for International Patent Application No. PCT/JP2007/067124.
Dec. 11, 2007 Written Opinion of the Search Authority for International Patent Application No. PCT/JP2007/067124.
Mar. 3, 2011 Office Action issued in U.S. Appl. No. 11/896,411.
Aug. 17, 2011 Office Action issued in U.S. Appl. No. 11/896,577.
Jul. 13, 2011 Office Action issued in Chinese Patent Application No. 200780010439.0.
May 7, 2014 Office Action issued in Japanese Patent Application No. 2013-162193.
McCarthy, Kevin, "Accuracy in Positioning Systems", New England Affiliated Technologies, reprinted from The Motion Control Technology Conference Proceedings, Mar. 19-21, 1991.
May 27, 2014 Office Action issued in Japanese Patent Application No. 2013-160145.
Apr. 25, 2014 Search Report issued in European Patent Application No. 07 80 6596.8.
Apr. 24, 2014 Search Report issued in European Patent Application No. 07 80 6597.6.
May 12, 2014 Office Action issued in U.S. Appl. No. 13/363,079.
Sep. 2, 2014 Office Action issued in Japanese Patent Application No. 2014-000972.
Oct. 7, 2015 Office Action issued in Taiwanese Patent Application No. 102132751.
May 18, 2016 Search Report issued in European Patent Application No. 15185017.9.
Sep. 2, 2015 Office Action issued in Japanese Patent Application No. 2015-002314.
Nov. 12, 2013 Office Action issued in Japanese Patent Application No. 2012-245015.
Sep. 1, 2015 Office Action issued in European Patent Application No. 14 153 959.3.
Sep. 15, 2015 Office Action issued in Japanese Patent Application No. 2015-002677.
Dec. 18, 2014 Office Action issued in U.S. Appl. No. 13/363,079.
Dec. 8, 2015 Office Action issued in European Patent Application No. 07806536.4.
Feb. 1, 2016 Office Action issued in U.S. Appl. No. 14/168,299.
Mar. 28, 2016 Office Action issued in U.S. Appl. No. 14/067,110.
Apr. 5, 2016 Office Action issued in U.S. Appl. No. 14/067,503.
Jun. 8, 2016 Office Action issued in European Application No. 15185017.9.

(56) References Cited

OTHER PUBLICATIONS

Nov. 20, 2015 Office Action issued in U.S. Appl. No. 14/067,503.
Nov. 18, 2015 Office Action issued in U.S. Appl. No. 14/067,110.
Oct. 31, 2014 Office Action issued in Japanese Patent Application No. 2014-016312.
"Displacement Sensors for Positioning", Journal of the Japan Society for Precision Engineering vol. 67 (2001) No. 2, pp. 193-197.
Apr. 27, 2016 Notice of Allowance issued in U.S. Appl. No. 14/459,883.
Jul. 18, 2016 Office Action issued in U.S. Appl. No. 14/168,299.
Jul. 20, 2016 Office Action issued in U.S. Appl. No. 14/459,757.
Mar. 21, 2011 Notice of Allowance issued in U.S. Appl. No. 11/896,412.
May 18, 2011 Notice of Allowance issued in U.S. Appl. No. 11/896,412.
Apr. 10, 2014 Search Report issued in European Patent Application No. 07806536.4.
Apr. 10, 2014 Search Report issued in European Patent Application No. 07806547.1.
Apr. 21, 2017 Notice of Allowance issued in U.S. Appl. No. 15/433,269.
Dec. 21, 2016 Notice of Allowance issued in U.S. Appl. No. 15/216,840.
Aug. 16, 2017 Notice of Allowance issued in U.S. Appl. No. 15/650,439.
Jan. 18, 2018 Notice of Allowance issued in U.S. Appl. No. 15/812,592.
U.S. Appl. No. 14/168,299, filed Jan. 30, 2014 in the name of Shibazaki.
U.S. Appl. No. 13/469,828, filed May 11, 2012 in the name of Shibazaki.
U.S. Appl. No. 13/469,869, filed May 11, 2012 in the name of Shibazaki.
U.S. Appl. No. 14/067,503, filed Oct. 30, 2013 in the name of Shibazaki.
U.S. Appl. No. 14/067,110, filed Oct. 30, 2013 in the name of Shibazaki.
Jul. 1, 2013 Office Action issued in U.S. Appl. No. 13/469,869.
Jul. 2, 2013 Office Action issued in U.S. Appl. No. 13/469,828.
Jan. 24, 2014 Office Action issued in U.S. Appl. No. 11/896,577.
Nov. 20, 2012 Office Action issued in U.S. Appl. No. 11/896,448.
Mar. 19, 2013 Office Action issued in U.S. Appl. No. 11/896,411.
Aug. 30, 2013 Office Action issued in U.S. Appl. No. 11/896,411.
Sep. 18, 2013 Office Action issued in Japanese Application No. 2012-079012.
Dec. 10, 2012 Office Action issued in Japanese Application No. 2008-532135.
Nov. 22, 2012 Office Action issued in Japanese Application No. 2008-532137.
Dec. 10, 2012 Office Action issued in Japanese Application No. 2008-533143.
Dec. 20, 2012 Office Action issued in U.S. Appl. No. 13/469,828.
Dec. 21, 2012 Office Action issued in U.S. Appl. No. 13/469,869.
Sep. 14, 2012 Office Action issued in Japanese Application No. 2008-532135.
Sep. 14, 2012 Office Action issued in Japanese Application No. 2008-532137.
Sep. 14, 2012 Office Action issued in Japanese Application No. 2008-533143.
Jun. 5, 2012 Office Action issued in U.S. Appl. No. 11/896,448.
Jan. 11, 2012 Office Action issued in Chinese Application No. 200780009923.1.
Mar. 9, 2012 Office Action issued in Japanese Application No. 2008-533142.
Mar. 22, 2012 Office Action issued in Japanese Application No. 2008-532138.
Dec. 11, 2007 International Search Report issued in International Application No. PCT/JP2007/067123.
Jul. 9, 2010 Office Action issued in U.S. Appl. No. 11/896,579.
Dec. 30, 2010 Office Action issued in U.S. Appl. No. 11/896,579.
Aug. 15, 2011 Office Action issued in U.S. Appl. No. 11/896,579.
Dec. 13, 2011 Notice of Allowance issued in U.S. Appl. No. 11/896,579.
Dec. 22, 2011 Office Action issued in Chinese Patent Application No. 200780009833.2.
Apr. 3, 2007 Written Opinion issued in International Patent Application No. PCT/JP2007/050821.
Feb. 12, 2010 Office Action issued in Chinese Patent Application No. 2007-800104390.
Jan. 29, 2010 Office Action issued in Chinese Patent Application No. 2007-800102592.
Mar. 1, 2010 Office Action issued in Chinese Patent Application No. 2007-80009833.2.
Dec. 11, 2007 Written Opinion issued in International Application No. PCT/JP2007/067074.
Feb. 5, 2010 Office Action issued in Chinese Patent Application No. 2007800099231.
Jan. 28, 2009 Office Action issued in U.S. Appl. No. 11/896,448.
Sep. 30, 2009 Office Action issued in U.S. Appl. No. 11/896,448.
May 13, 2010 Office Action issued in U.S. Appl. No. 11/896,448.
Sep. 10, 2010 Office Action issued in U.S. Appl. No. 11/896,577.
Sep. 8, 2010 Office Action issued in U.S. Appl. No. 11/896,411.
Apr. 30, 2010 Office Action issued in U.S. Appl. No. 11/896,412.
Aug. 11, 2010 Office Action issued in U.S. Appl. No. 11/896,412.
Mar. 1, 2011 Office Action issued in U.S. Appl. No. 11/896,577.
Mar. 21, 2011 Supplementary European Search Report for European Patent Application No. 07806512.5.
Dec. 11, 2007 International Search Report for International Patent Application No. PCT/JP2007/067039.
Dec. 11, 2007 Written Opinion of the Search Authority for International Patent Application No. PCT/JP2007/067039.
Dec. 11, 2007 International Search Report for International Patent Application No. PCT/JP2007/067063.
Dec. 11, 2007 Written Opinion of the Search Authority for International Patent Application No. PCT/JP2007/067063.
Dec. 11, 2007 International Search Report for International Patent Application No. PCT/JP2007/067074.

\* cited by examiner

MOVABLE BODY DRIVE METHOD AND MOVABLE BODY DRIVE SYSTEM, PATTERN FORMATION METHOD AND APPARATUS, EXPOSURE METHOD AND APPARATUS, DEVICE MANUFACTURING METHOD, AND CALIBRATION METHOD

This is a Division of U.S. patent application Ser. No. 15/812,592 filed Nov. 14, 2017 (now U.S. Pat. No. 9,971,253), which in turn is a Division of U.S. patent application Ser. No. 15/650,439 filed Jul. 14, 2017 (now U.S. Pat. No. 9,846,374), which is a Division of U.S. patent application Ser. No. 15/433,269 filed Feb. 15, 2017 (now U.S. Pat. No. 9,740,114), which is a Division of U.S. patent application Ser. No. 15/216,840 filed Jul. 22, 2016 (now U.S. Pat. No. 9,625,834), which is a Division of U.S. patent application Ser. No. 14/459,883 filed Aug. 14, 2014 (now U.S. Pat. No. 9,429,854), which is a Division of U.S. patent application Ser. No. 13/363,079 filed Jan. 31, 2012 (now U.S. Pat. No. 9,081,301), which is a Divisional of U.S. patent application Ser. No. 11/896,579 filed Sep. 4, 2007 (now U.S. Pat. No. 8,134,688). The disclosure of each of the prior applications is hereby incorporated by reference herein in its entirety.

BACKGROUND OF THE INVENTION

Field of the Invention

The present invention relates to movable body drive methods and movable body drive systems, pattern formation methods and apparatuses, exposure methods and apparatuses, device manufacturing methods, and calibration methods, and more particularly to a movable body drive method in which a movable body is driven within a movement plane and a movable body drive system, a pattern formation method using the movable body drive method and a pattern formation apparatus equipped with the movable body drive system, an exposure method using the movable body drive method and an exposure apparatus equipped with the movable body drive system, a device manufacturing method using the pattern formation method, and a calibration method used in an encoder system that measures positional information of a movable body in a movement plane.

Description of the Background Art

Conventionally, in a lithography process for manufacturing microdevices (electron devices and the like) such as semiconductor devices and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are relatively frequently used.

In this kind of exposure apparatus, in order to transfer a pattern of a reticle (or a mask) on a plurality of shot areas on a wafer, a wafer stage holding the wafer is driven in an XY two-dimensional direction, for example, by linear motors and the like. Especially in the case of a scanning stepper, not only the wafer stage but also a reticle stage is driven in by predetermined strokes in a scanning direction by linear motors and the like. Position measurement of the reticle stage and the wafer stage is generally performed using a laser interferometer whose stability of measurement values is good for over a long time and has a high resolution.

However, requirements for a stage position control with higher precision are increasing due to finer patterns that accompany higher integration of semiconductor devices, and now, short-term variation of measurement values due to temperature fluctuation of the atmosphere on the beam optical path of the laser interferometer has come to occupy a large percentage in the overlay budget.

Meanwhile, as a measurement unit besides the laser interferometer used for position measurement of the stage, an encoder can be used, however, because the encoder uses a scale, which lacks in mechanical long-term stability (drift of grating pitch, fixed position drift, thermal expansion and the like), it makes the encoder have a drawback of lacking measurement value linearity and being inferior in long-term stability when compared with the laser interferometer.

In view of the drawbacks of the laser interferometer and the encoder described above, various proposals are being made (refer to Kokai (Japanese Patent Unexamined Application Publication) No. 2002-47405 bulletin, Kokai (Japanese Patent Unexamined Application Publication) No. 2004-101362 bulletin and the like) of a unit that measures the position of a stage using both a laser interferometer and an encoder (a position detection sensor which uses a diffraction grating) together.

Further, the measurement resolution of the conventional encoder was inferior when compared with an interferometer, however, recently, an encoder which has a nearly equal or a better measurement resolution than a laser interferometer has appeared (for example, refer to Kokai (Japanese Patent Unexamined Application Publication) No. 2005-308592 bulletin), and the technology to put the laser interferometer and the encoder described above together is beginning to gather attention.

However, for example, in the case position measurement of the movement plane of the wafer stage is performed of the exposure apparatus that moves two-dimensionally holding a wafer using an encoder, in order to avoid an unnecessary increase in the size of the wafer stage and the like, it becomes essential to control the movement of the wafer stage using a plurality of encoders, while switching the encoder used for control during the movement of the wafer stage. That is, it becomes necessary to control the position of the wafer stage using an encoder system which includes a plurality of heads.

SUMMARY OF THE INVENTION

The present invention has been made in consideration of the circumstances described above, and according to a first aspect of the present invention, there is provided a movable body drive method in which a movable body is driven along a substantially predetermined plane, the method comprising: a drive process in which positional information of the movable body in a first direction is measured, using at least one first head of an encoder system that includes a plurality of first heads which irradiates a measurement beam on a grating whose periodic direction is the first direction parallel to the plane and receives the beam from the grating and is arranged in a direction intersecting the first direction, and the movable body is driven along the plane, based on a measurement result of the positional information and positional information in a surface parallel to the plane of the measurement beam emitted from at least one of the first heads.

According to this method, positional information of the movable body in the first direction is measured using at least one first head of the encoder system, and based on the measurement results of the positional information and positional information of the measurement beam emitted from the at least one first head used for measurement of the positional information in a surface parallel to the predetermined plane, the movable body is driven along a predetermined plane. Accordingly, it becomes possible to control the movement of the movable body, using the encoder system including a plurality of first heads.

According to a second aspect of the present invention, there is provided a pattern formation method, comprising: a mount process in which an object is mounted on a movable body that can move in a movement plane; and a drive process in which the movable body is driven by the movable body drive method of the present invention, to form a pattern to the object.

According to this method, a desired pattern can be formed on the object by forming a pattern on the object mounted on the movable body, which is driven using anyone of the movable body drive methods of the present invention.

According to a third aspect of the present invention, there is provided a first device manufacturing method including a pattern formation process wherein in the pattern formation process, a pattern is formed on an object using the pattern formation method of the present invention.

According to a fourth aspect of the present invention, there is provided a first exposure method in which a pattern is formed on an object by an irradiation of an energy beam wherein for relative movement of the energy beam and the object, a movable body on which the object is mounted is driven, using the movable body drive method according of the present invention.

According to this method, for relative movement between an energy beam irradiated on the object and the object, the movable body on which the object is mounted is driven with good precision, using anyone of the movable body drive methods of the present invention. Accordingly, it becomes possible to form a desired pattern on the object by scanning exposure According to a fifth aspect of the present invention, there is provided a second exposure method of exposing an object with an energy beam, the method comprising: mounting the object on a movable body that can move at least in a first and second direction orthogonal in a predetermined plane, and controlling a position of the movable body in the predetermined plane, based on measurement information of an encoder system, which has one of a grating section and a head unit arranged on a surface of the movable body where the object is mounted and the other also arranged facing the surface of the movable body and also measures positional information of the movable body in the predetermined plane with a head that faces the grating section among a plurality of heads of the head unit, and positional information of a detection point of the head used for the measurement in a surface parallel to the predetermined plane.

According to this method, it becomes possible to control the position of the movable body in the predetermined plane using the encoder system including a plurality of heads with good precision, without being affected by the measurement error of the encoder system that occurs due to the position of the detection point of each head, which in turn, makes it possible to expose the object on the movable body with high precision.

According to a sixth aspect of the present invention, there is provided a third exposure method of exposing an object with an energy beam, the method comprising: mounting the object on a movable body that can move at least in a first and second direction orthogonal in a predetermined plane; measuring positional information of the movable body using an encoder system, which has one of a grating section and a head unit arranged on a surface of the movable body where the object is held and the other is also arranged facing the surface of the movable body and measures positional information of the movable body in the predetermined plane with a head that faces the grating section among a plurality of heads of the head unit; and controlling the position of the movable body in the predetermined plane, based on correction information to compensate for the measurement error of the encoder system that occurs due to the position or displacement of the detection point of the head used for measurement and measurement information of the encoder system.

According to this method, it becomes possible to control the position of the movable body in the predetermined plane using the encoder system with good precision, without being affected by the measurement error of the encoder system that occurs due to the position or displacement of the detection point of each head used for the measurement, which in turn, makes it possible to expose the object on the movable body with high precision.

According to a seventh aspect of the present invention, there is provided a second device manufacturing method including a lithography process wherein in the lithography process, an exposure method according to one of the second and third exposure method of the present invention is used to expose a sensitive object mounted on the movable body, and to form a pattern on the sensitive object.

According to an eighth aspect of the present invention, there is provided a movable body drive system in which a movable body is driven along a substantially predetermined plane, the system comprising: a grating whose periodic direction is a first direction parallel to the plane; an encoder system which includes a plurality of first heads that irradiates a measurement beam on the grating and receives the beam from the grating, arranged in a direction intersecting the first direction; and a controller which measures positional information of the movable body in the first direction using at least one first head of the plurality of first heads and drives the movable body along the plane, based on the measurement result of the positional information and positional information of the measurement beam emitted from the at least one first head used for measurement of the positional information in a surface parallel to the plane.

According to this system, the controller measures the positional information of the movable body in the first direction using at least one first head of the encoder system, and based on the measurement results of the positional information and positional information of the measurement beam emitted from the at least one first head used for measurement of the positional information in the surface parallel to the predetermined plane, the movable body is driven along the predetermined plane. Accordingly, it becomes possible to control the movement of the movable body, using the encoder system including a plurality of first heads. According to a ninth aspect of the present invention, there is provided a pattern formation apparatus, the apparatus comprising: a movable body on which the object is mounted, and is movable in a movement plane holding the object; and a movable body drive system of the present invention that drives the movable body to perform pattern formation with respect to the object.

According to this apparatus, by generating a pattern on the object on the movable body driven by the movable body drive systems of the present invention with a patterning unit, it becomes possible to form a desired pattern on the object.

According to a tenth aspect of the present invention, there is provided a first exposure apparatus that forms a pattern on an object by an irradiation of an energy beam, the apparatus comprising: a patterning unit that irradiates the energy beam on the object; and the movable body drive system according to the present invention, whereby the movable body drive system drives the movable body on which the object is mounted for relative movement of the energy beam and the object.

According to this apparatus, for relative movement of the energy beam irradiated on the object from the patterning unit and the object, the movable body on which the object is mounted is driven by the movable body drive system of the present invention. Accordingly, it becomes possible to form a desired pattern on the object by scanning exposure.

According to an eleventh aspect of the present invention, there is provided a second exposure apparatus that exposes an object with an energy beam, the apparatus comprising: a movable body that holds the object and is movable at least in a first and second directions which are orthogonal in a predetermined plane; an encoder system in which one of a grating section and a head unit is arranged on a surface of the movable body where the object is held and the other is arranged facing the surface, and positional information of the movable body in the predetermined plane is measured by a head that faces the grating section of a plurality of heads of the head unit; and a controller that controls a position of the movable body in the predetermined plane, based on measurement information of the encoder system and positional information of a detection point of the head used for the measurement in a surface parallel to the predetermined plane.

According to this method, it becomes possible to control the position of the movable body in the predetermined plane using the encoder system including a plurality of heads with good precision, without being affected by the measurement error of the encoder system that occurs due to the position of the detection point of each head, which in turn, makes it possible to expose the object on the movable body with high precision.

According to a twelfth aspect of the present invention, there is provided a third exposure apparatus that exposes an object with an energy beam, the apparatus comprising: a movable body that holds the object and is movable at least in a first and second directions which are orthogonal in a predetermined plane; an encoder system in which one of a grating section and a head unit is arranged on a surface of the movable body where the object is held and the other is arranged facing the surface, and positional information of the movable body in the predetermined plane is measured by a head that faces the grating section of a plurality of heads of the head unit; and a controller that controls the position of the movable body in the predetermined plane, based on correction information to compensate for the measurement error of the encoder system that occurs due to the position or displacement of the detection point of the head used for measurement and measurement information of the encoder system.

According to this method, it becomes possible to control the position of the movable body in the predetermined plane using the encoder system with good precision, without being affected by the measurement error of the encoder system that occurs due to the position or displacement of the detection point of each head used for the measurement, which in turn, makes it possible to expose the object on the movable body with high precision.

According to a thirteenth aspect of the present invention, there is provided a calibration method used in an encoder system that measures positional information of a movable body that moves along a substantially predetermined plane in a surface parallel to the plane, the method comprising: an acquisition process in which the movable body is rotated at a predetermined angle in the surface parallel to the plane and a measurement value of a head of the encoder system that measures the positional information of the movable body in a measurement direction parallel to the plane and a measurement value of a measurement unit that measures a rotation angle of the movable body in the surface parallel to the plane are acquired; and a computing process in which positional information of a measurement beam emitted from the head in a direction perpendicular to the measurement direction in the surface parallel to the plane is computed, based on the measurement value of the head that has been acquired and the rotation angle that has been measured by the measurement unit.

According to this method, the movable body is rotated at a predetermined angle in the surface parallel to the plane and the measurement value of the head of the encoder system that measures the positional information of the movable body in the measurement direction parallel to the plane and the measurement value of the measurement unit that measures a rotation angle of the movable body in the surface parallel to the plane are acquired, and based on the measurement value of the head that has been acquired and the rotation angle that has been measured by the measurement unit, positional information of the measurement beam emitted from the head in the direction perpendicular to the measurement direction in the surface parallel to the plane is computed. Accordingly, it becomes possible to calibrate the positional information of the measurement beam emitted from a head in a direction perpendicular to the measurement direction, which shows a tendency of having an error to the design value larger than the measurement direction of the head, with good precision.

BRIEF DESCRIPTION OF THE DRAWINGS

In the accompanying drawings.

DESCRIPTION OF THE EMBODIMENTS

An embodiment of the present invention will be described below, with reference to FIGS. 1 to 35.

Figure 1:
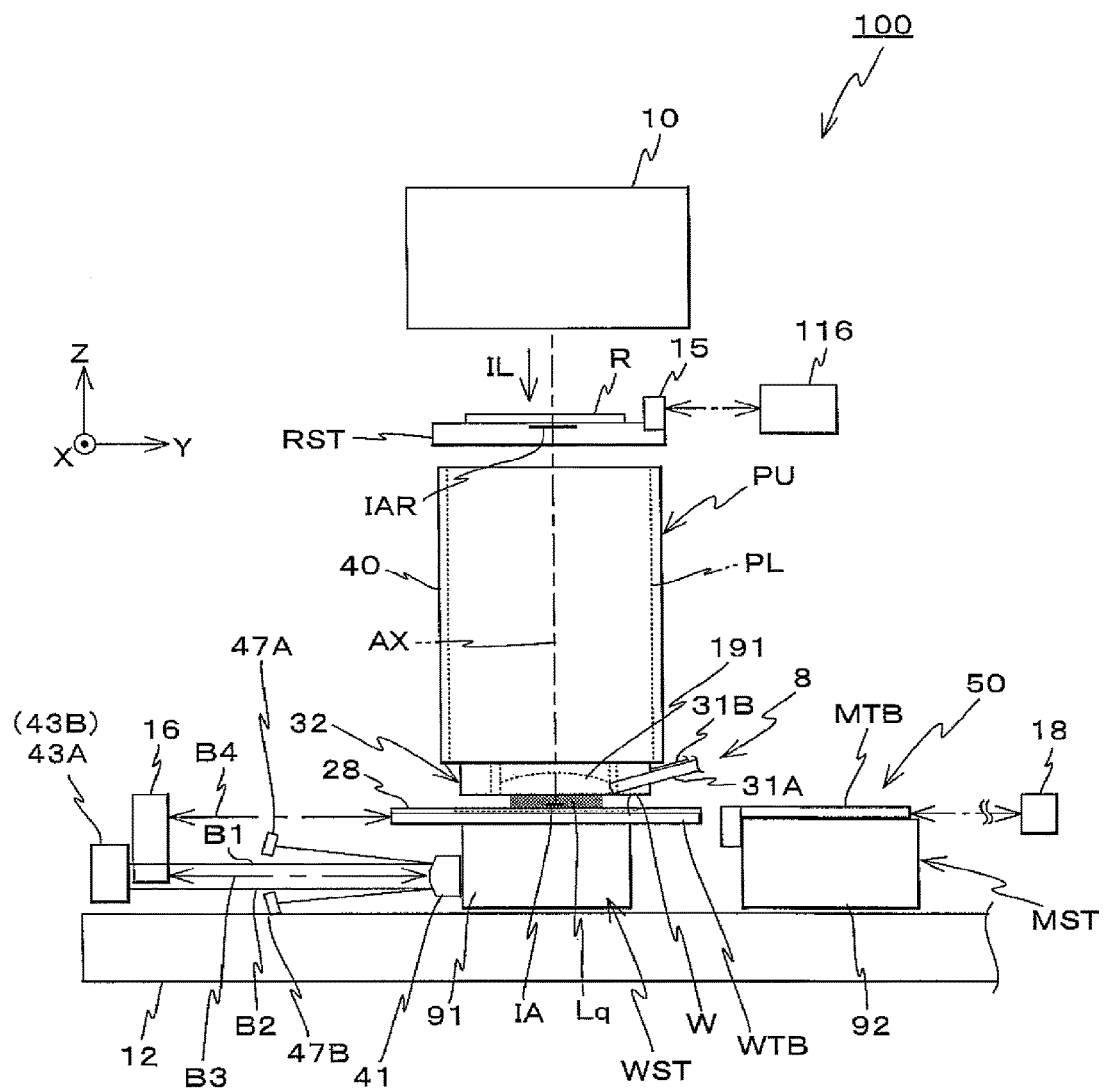
FIG. 1 is a view schematically showing the configuration of an exposure apparatus related to an embodiment.

FIG. 1 shows a schematic configuration of an exposure apparatus 100 related to the embodiment. Exposure apparatus 100 is a scanning exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 includes an illumination system 10, a reticle stage RST that holds a reticle R that is illuminated by an illumination light for exposure (hereinafter, referred to as "illumination light" or "exposure light") IL from illumination system 10, a projection unit PU that includes projection optical system PL that projects illumination light IL emitted from reticle R on a wafer W, a stage unit 50 that has a wafer stage WST and a measurement stage MST, their control system, and the like. On wafer stage WST, wafer W is mounted.

Illumination system 10 is configured including a light source, an illuminance uniformity optical system, which includes an optical integrator and the like, and n illumination optical system that has a reticle blind and the like (none of which are shown), as is disclosed in, for example, Kokai (Japanese Patent Unexamined Application Publication) No. 2001-313250 bulletin (the corresponding U.S. Patent Application Publication No. 2003/0025890 description) and the like. In illumination system 10, a slit-shaped illumination area extending in the X-axis direction which is set on reticle R with a reticle blind (a masking system) is illuminated by illumination light (exposure light) IL with a substantially uniform illuminance. In this case, as illumination light IL, for example, an ArF excimer laser beam (wavelength 193 nm) is used. Further, as the optical integrator, for example, a fly-eye lens, a rod integrator (an internal reflection type integrator), a diffractive optical element or the like can be used.

On reticle stage RST, reticle R on which a circuit pattern or the like is formed on its pattern surface (the lower surface in FIG. 1) is fixed, for example, by vacuum chucking. Reticle stage RST is finely drivable or movable in within an XY plane by a reticle stage drive section 11 (not shown in FIG. 1, refer to FIG. 6) that includes a linear motor or the like, and reticle stage RST is also drivable in a predetermined scanning direction (in this case, the Y-axis direction, which is the lateral direction of the page surface in FIG. 1) at a designated scanning speed.

The positional information (including rotation information in the θz direction) of reticle stage RST in the movement plane is constantly detected, for example, at a resolution of around 0.5 to 1 nm by a reticle laser interferometer (hereinafter referred to as a "reticle interferometer") 116, via a movable mirror 15 (the mirrors actually arranged are a Y movable mirror that has a reflection surface which is orthogonal to the Y-axis direction and an X movable mirror that has a reflection surface orthogonal to the X-axis direction). The measurement values of reticle interferometer 116 are sent to a main controller 20 (not shown in FIG. 1, refer to FIG. 6). Main controller 20 computes the position of reticle stage RST in the X-axis direction, Y-axis direction, and the θz direction based on the measurement values of reticle interferometer 116, and also controls the position (and velocity) of reticle stage RST by controlling reticle stage drive section 11 based on the computation results. Incidentally, instead of movable mirror 15, the edge surface of reticle stage RSV can be mirror polished so as to form a reflection surface (corresponding to the reflection surface of movable mirror 15). Further, reticle interferometer 116 can measure positional information of reticle stage RST related to at least one of the Z-axis, θx, or θy directions.

Projection unit PU is placed below reticle stage RST in FIG. 1. Projection unit PU includes a barrel 40, and projection optical system PL that has a plurality of optical elements which are held in a predetermined positional relation inside barrel 40. As projection optical system PL, for example, a dioptric system is used, consisting of a plurality of lenses (lens elements) that is disposed along an optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, a reduced image of the circuit pattern (a reduced image of apart of the circuit pattern) of the reticle is formed within illumination area IAR, with illumination light IL that has passed through reticle R which is placed so that its pattern surface substantially coincides with a first plane (an object plane) of projection optical system PL, in an area conjugate to illumination area IAR on wafer W (exposure area) whose surface is coated with a resist (a sensitive agent) and is placed on a second plane (an image plane) side, via projection optical system PL (projection unit PU) and liquid Lq (refer to FIG. 1). And by reticle stage RST and wafer stage WST being synchronously driven, the reticle is relatively moved in the scanning direction (the Y-axis direction) with respect to illumination area IAR (illumination light IL) while wafer W is relatively moved in the scanning direction (the Y-axis direction) with respect to the exposure area (illumination light IL), thus scanning exposure of a shot area (divided area) on wafer W is performed, and the pattern of the reticle is transferred onto the shot area. That is, in the embodiment, the pattern is generated on wafer W according to illumination system 10, the reticle, and projection optical system PL, and then by the exposure of the sensitive layer (resist layer) on wafer W with illumination light IL, the pattern is formed on wafer W. Although it is not shown in the drawings, projection unit PU is mounted on a barrel platform supported by three struts via a vibration isolation mechanism, however, as is disclosed in, for example, the pamphlet of International Publication No. WO 2006/038952 and the like, projection unit PU can be supported by suspension with respect to a mainframe member (not shown) placed above projection unit PU or with respect to a base member on which reticle stage RST is placed.

Figure 3:
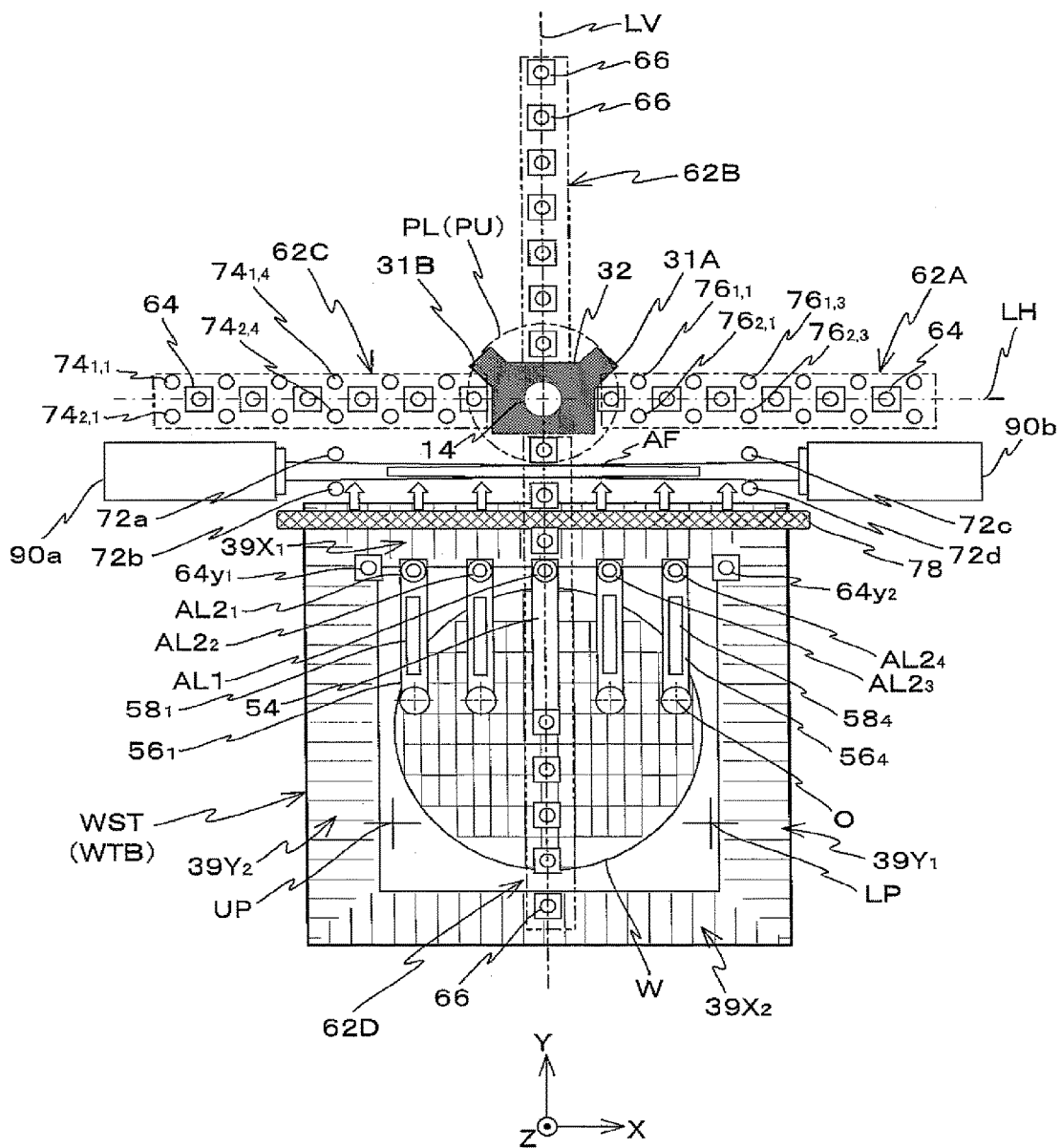
FIG. 3 is a planar view showing the placement of various measuring apparatuses (such as encoders, alignment systems, a multipoint AF system, and Z sensors) that are equipped in the exposure apparatus in FIG. 1.

Further, in exposure apparatus 100 of the embodiment, in order to perform exposure applying the liquid immersion method, a nozzle unit 32 that constitutes part of a local liquid immersion unit 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. In the embodiment, as shown in FIG. 1, the lower end surface of nozzle unit 32 is set to be substantially flush with the lower end surface of tip lens 191. Further, nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively. As shown in FIG. 3, liquid supply pipe 31A and liquid recovery pipe 31B are inclined at an angle of 45 degrees with respect to the X-axis direction and the Y-axis direction in a planer view (when viewed from above) and are symmetrically placed with respect to a straight line LV in the Y-axis direction that passes through optical axis AX of projection optical system PL.

Figure 6:
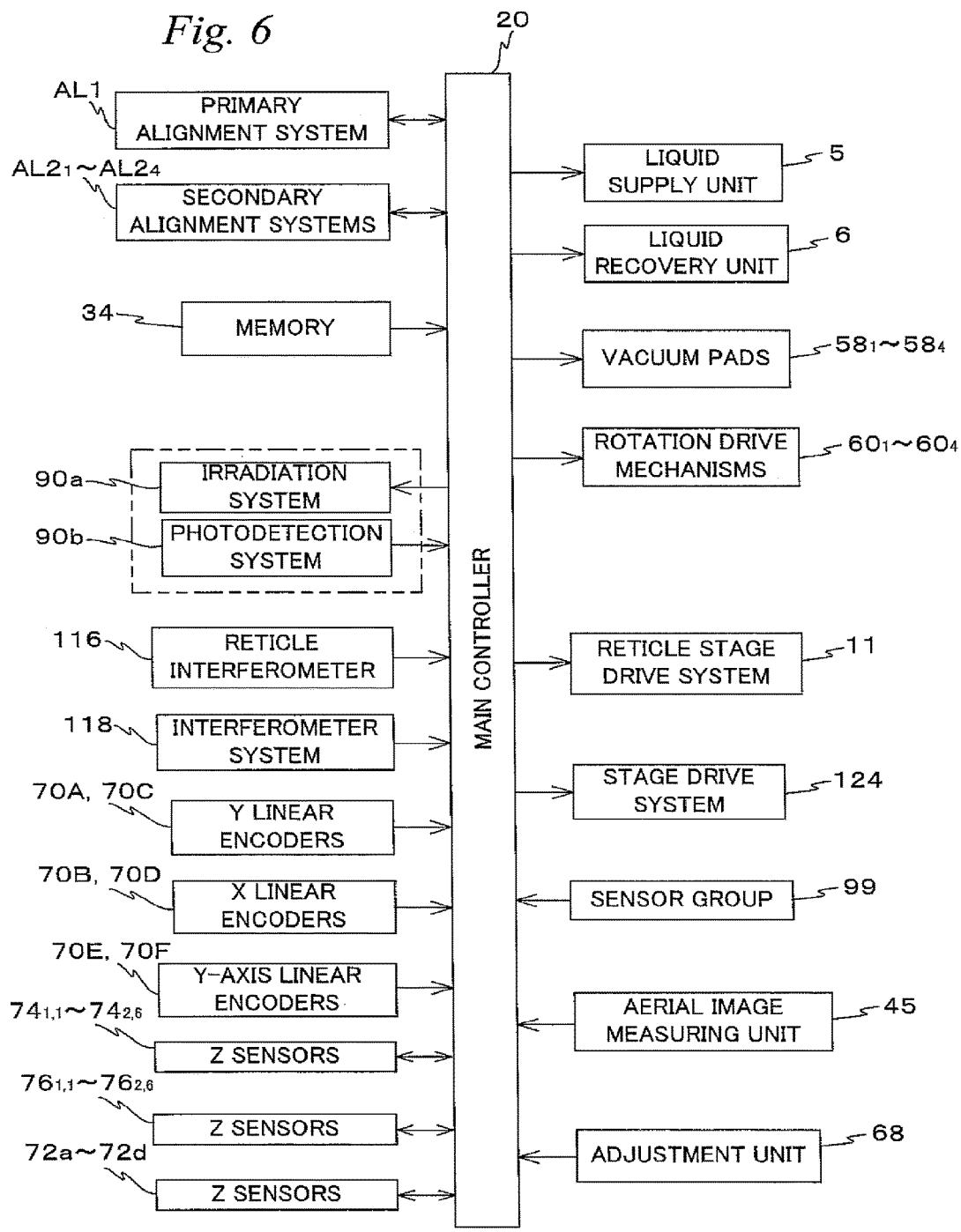
FIG. 6 is a block diagram showing a main configuration of a control system of the exposure apparatus related to an embodiment.

One end of a supply pipe (not shown) is connected to liquid supply pipe 31A while the other end of the supply pipe is connected to a liquid supply unit 5 (not shown in FIG. 1, refer to FIG. 6), and one end of a recovery pipe (not shown) is connected to liquid recovery pipe 31B while the other end of the recovery pipe is connected to a liquid recovery unit 6 (not shown in FIG. 1, refer to FIG. 6).

Liquid supply unit 5 includes a liquid tank, a compression pump, a temperature controller, a valve for controlling supply/stop of the liquid to liquid supply pipe 31A, and the like. As the valve, for example, a flow rate control valve is preferably used so that not only the supply/stop of the liquid but also the adjustment of flow rate can be performed. The temperature controller adjusts the temperature of the liquid within the liquid tank to nearly the same temperature, for example, as the temperature within the chamber (not shown) where the exposure apparatus is housed. Incidentally, the tank for supplying the liquid, the compression pump, the temperature controller, the valve, and the like do not all have to be equipped in exposure apparatus 100, and at least part of them can also be substituted by the equipment or the like available in the plant where exposure apparatus 100 is installed.

Liquid recovery unit 6 includes a liquid tank, a suction pump, a valve for controlling recovery/stop of the liquid via liquid recovery pipe 31B, and the like. As the valve, a flow rate control valve is preferably used corresponding to the valve of liquid supply unit 5. Incidentally, the tank for recovering the liquid, the suction pump, the valve, and the like do not all have to be equipped in exposure apparatus 100, and at least part of them can also be substituted by the equipment or the like available in the plant where exposure apparatus 100 is installed.

In the embodiment, as the liquid described above, pure water (hereinafter, it will simply be referred to as "water" besides the case when specifying is necessary) that transmits the ArF excimer laser light (light with a wavelength of 193 nm) is to be used. Pure water can be obtained in large quantities at a semiconductor manufacturing plant or the like without difficulty, and it also has an advantage of having no adverse effect on the photoresist on the wafer, to the optical lenses or the like.

Refractive index n of the water with respect to the ArF excimer laser light is around 1.44. In the water the wavelength of illumination light IL is 193 nm×1/n, shorted to around 134 nm.

Liquid supply unit 5 and liquid recovery unit 6 each have a controller, and the respective controllers are controlled by main controller 20 (refer to FIG. 6). According to instructions from main controller 20, the controller of liquid supply unit 5 opens the valve connected to liquid supply pipe 31A to a predetermined degree to supply water Lq (refer to FIG. 1) to the space between tip lens 191 and wafer W via liquid supply pipe 31A, the supply flow channel and the supply opening. Further, when the water is supplied, according to instructions from main controller 20, the controller of liquid recovery unit 6 opens the valve connected to liquid recovery pipe 31B to a predetermined degree to recover water Lq from the space between tip lens 191 and wafer W into liquid recovery unit 6 (the liquid tank) via the recovery opening, the recovery flow channel and liquid recovery pipe 31B. During the supply and recovery operations, main controller 20 gives commands to the controllers of liquid supply unit 5 and liquid recovery unit 6 so that the quantity of water supplied to the space between tip lens 191 and wafer W constantly equals the quantity of water recovered from the space. Accordingly, a constant quantity of water Lq is held (refer to FIG. 1) in the space between tip lens 191 and wafer W. In this case, water Lq held in the space between tip lens 191 and wafer W is constantly replaced.

As is obvious from the above description, in the embodiment, local liquid immersion unit 8 is configured including nozzle unit 32, liquid supply unit 5, liquid recovery unit 6, liquid supply pipe 31A and liquid recovery pipe 31B, and the like. Local liquid immersion unit 8 fills liquid Lq in the space between tip lens 191 and wafer W by nozzle unit 32, so that a local liquid immersion space (equivalent to a liquid immersion area 14) which includes the optical path space of illumination light IL is formed. Accordingly, nozzle unit 32 is also called a liquid immersion space formation member or a containment member (or, a confinement member). Incidentally, part of local liquid immersion unit 8, for example, at least nozzle unit 32 may also be supported in a suspended state by a main frame (including the barrel platform) that holds projection unit PU, or may also be arranged at another frame member that is separate from the main frame. Or, in the case projection unit PU is supported in a suspended state as is described earlier, nozzle unit 32 may also be supported in a suspended state integrally with projection unit PU, but in the embodiment, nozzle unit 32 is arranged on a measurement frame that is supported in a suspended state independently from projection unit PU. In this case, projection unit PU does not have to be supported in a suspended state.

Incidentally, also in the case measurement stage MST is located below projection unit PU, the space between a measurement table (to be described later) and tip lens 191 can be filled with water in a similar manner to the manner described above.

Incidentally, in the description above, one liquid supply pipe (nozzle) and one liquid recovery pipe (nozzle) were arranged as an example, however, the present invention is not limited to this, and a configuration having multiple nozzles as is disclosed in, for example, the pamphlet of International Publication No. WO 99/49504, may also be employed, in the case such an arrangement is possible taking into consideration a relation with adjacent members. Further, the lower surface of nozzle unit 32 can be placed near the image plane (more specifically, a wafer) of projection optical system PL rather than the outgoing plane of tip lens 191, or, in addition to the optical path of the image plane side of tip lens 191, a configuration in which the optical path on the object plane side of tip lens 191 is also filled with liquid can be employed. The point is that any configuration can be employed, as long as the liquid can be supplied in the space between optical member (tip lens) 191 in the lowest end constituting projection optical system PL and wafer W. For example, the liquid immersion mechanism disclosed in the pamphlet of International Publication No. WO 2004/053955, or the liquid immersion mechanism disclosed in the EP Patent Application Publication No. 1 420 298 description can also be applied to the exposure apparatus of the embodiment.

Referring back to FIG. 1, stage unit 50 is equipped with wafer stage WST and measurement stage MST that are placed above a base board 12, an interferometer system 118 (refer to FIG. 6) including Y interferometers 16 and 18 that measure position information of stages WST and MST, an encoder system (to be described later) that is used for measuring position information of wafer stage WST on exposure or the like, a stage drive system 124 (refer to FIG. 6) that drives stages WST and MST, and the like.

On the bottom surface of each of wafer stage WST and measurement stage MST, a noncontact bearing (not shown), for example, a vacuum preload type hydrostatic air bearing (hereinafter, referred to as an "air pad") is arranged at a plurality of points. Wafer stage WST and measurement stage MST are supported in a noncontact manner via a clearance of around several μm above base board 12, by static pressure of pressurized air that is blown out from the air pad toward the upper surface of base board 12. Further, stages WST and MST are independently drivable in two-dimensional directions, which are the Y-axis direction (a horizontal direction of the page surface of FIG. 1) and the X-axis direction (an orthogonal direction to the page surface of FIG. 1) in a predetermined plane (the XY plane), by stage drive system 124.

Figure 2:
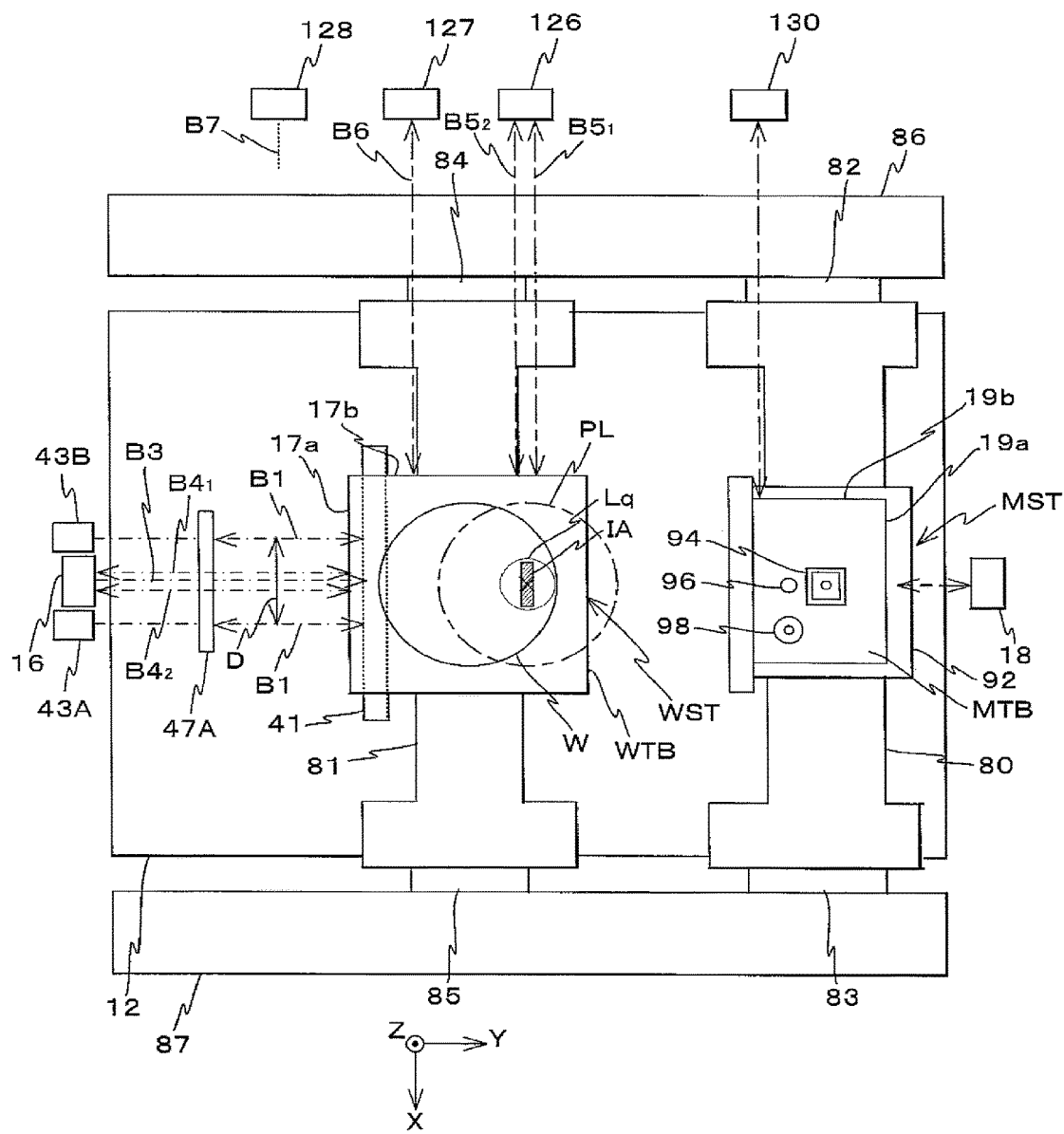
FIG. 2 is a planar view showing a stage unit in FIG. 1.

To be more specific, on a floor surface, as shown in the planar view in FIG. 2, a pair of Y-axis stators 86 and 87 extending in the Y-axis direction are respectively placed on one side and the other side in the X-axis direction with base board 12 in between. Y-axis stators 86 and 87 are each composed of, for example, a magnetic pole unit that incorporates a permanent magnet group that is made up of a plurality of sets of a north pole magnet and a south pole magnet that are placed at a predetermined distance and alternately along the Y-axis direction. At Y-axis stators 86 and 87, two Y-axis movers 82 and 84, and two Y-axis movers 83 and 85 are respectively arranged in a noncontact engaged state. In other words, four Y-axis movers 82, 84, 83 and 85 in total are in a state of being inserted in the inner space of Y-axis stator 86 or 87 whose XZ sectional surface has a U-like shape, and are severally supported in a noncontact manner via a clearance of, for example, around several µm via the air pad (not shown) with respect to corresponding Y-axis stator 86 or 87. Each of Y-axis movers 82, 84, 83 and 85 is composed of, for example, an armature unit that incorporates armature coils placed at a predetermined distance along the Y-axis direction. That is, in the embodiment, Y-axis movers 82 and 84 made up of the armature units and Y-axis stator 86 made up of the magnetic pole unit constitute moving coil type Y-axis linear motors respectively. Similarly, Y-axis movers 83 and 85 and Y-axis stator 87 constitute moving coil type Y-axis linear motors respectively. In the following description, each of the four Y-axis linear motors described above is referred to as a Y-axis linear motor 82, a Y-axis linear motor 84, a Y-axis linear motor 83 and a Y-axis linear motor 85 as needed, using the same reference codes as their movers 82, 84, 83 and 85.

Movers 82 and 83 of two Y-axis linear motors 82 and 83 out of the four Y-axis linear motors are respectively fixed to one end and the other end in a longitudinal direction of an X-axis stator 80 that extends in the X-axis direction. Further, movers 84 and 85 of the remaining two Y-axis linear motors 84 and 85 are fixed to one end and the other end of an X-axis stator 81 that extends in the X-axis direction. Accordingly, X-axis stators 80 and 81 are driven along the Y-axis by a pair of Y-axis linear motors 82 and 83 and a pair of Y-axis linear motors 84 and 85 respectively.

Each of X-axis stators 80 and 81 is composed of, for example, an armature unit that incorporates armature coils placed at a predetermined distance along the X-axis direction.

One X-axis stator, X-axis stator 81 is arranged in a state of being inserted in an opening (not shown) formed at a stage main section 91 (not shown in FIG. 2, refer to FIG. 1) that constitutes part of wafer stage WST. Inside the opening of stage main section 91, for example, a magnetic pole unit, which has a permanent magnet group that is made up of a plurality of sets of a north pole magnet and a south pole magnet placed at a predetermined distance and alternately along the X-axis direction, is arranged. This magnetic pole unit and X-axis stator 81 constitute a moving magnet type X-axis linear motor that drives stage main section 91 in the X-axis direction. Similarly, the other X-axis stator, X-axis stator 80 is arranged in a state of being inserted in an opening formed at a stage main section 92 (not shown in FIG. 2, refer to FIG. 1) that constitutes part of measurement stage MST. Inside the opening of stage main section 92, a magnetic pole unit, which is similar to the magnetic pole unit on the wafer stage WST side (stage main section 91 side), is arranged. This magnetic pole unit and X-axis stator 80 constitute a moving magnet type X-axis linear motor that drives measurement stage MST in the X-axis direction.

In the embodiment, each of the linear motors described above that constitute stage drive system 124 is controlled by main controller 20 shown in FIG. 6. Incidentally, each linear motor is not limited to either one of the moving magnet type or the moving coil type, and the types can appropriately be selected as needed.

Incidentally, by making thrust forces severally generated by a pair of Y-axis linear motors 84 and 85 be slightly different, yawing (rotation quantity in the θz direction) of wafer stage WST can be controlled. Further, by making thrust forces severally generated by a pair of Y-axis linear motors 82 and 83 be slightly different, yawing of measurement stage MST can be controlled.

Wafer stage WST includes stage main section 91 previously described and a wafer table WTB that is mounted on stage main section 91. Wafer table WTB and stage main section 91 are finely driven relative to base board 12 and X-axis stator 81 in the Z-axis direction, the θx direction, and the θy direction by a Z leveling mechanism (not shown) (including, for example, a voice coil motor and the like). More specifically, wafer table WTB is finely movable in the Z-axis direction and can also be inclined (tilted) with respect to the XY plane (or the image plane of projection optical system PL). Incidentally, in FIG. 6, stage drive system 124 is shown including each of the linear motors and the Z-leveling mechanism described above. Further, wafer table WTB can also be configured finely movable in at least one of the X-axis, the Y-axis, and the θz directions.

On wafer table WTB, a wafer holder (not shown) that holds wafer W by vacuum suction or the like is arranged. The wafer holder may also be formed integrally with wafer table WTB, but in the embodiment, the wafer holder and wafer table WTB are separately configured, and the wafer holder is fixed inside a recessed portion of wafer table WTB, for example, by vacuum suction or the like. Further, on the upper surface of wafer table WTB, a plate (liquid repellent plate) 28 is arranged, which has the surface (liquid repellent surface) substantially flush with the surface of a wafer mounted on the wafer holder to which liquid repellent processing with respect to liquid Lq is performed, has a rectangular outer shape (contour), and has a circular opening that is formed in the center portion and is slightly larger than the wafer holder (a mounting area of the wafer). Plate 28 is made of materials with a low coefficient of thermal expansion, such as glasses or ceramics (such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon (registered trademark)), acrylic resin materials, or silicon series resin materials. Further, as shown in a planer view of wafer table WTB (wafer stage WST) in FIG. 4A, plate 28 has a first liquid repellent area 28a whose outer shape (contour) is rectangular enclosing a circular opening, and a second liquid repellent area 28b that has a rectangular frame (annular) shape placed around the first liquid repellent area 28a. On the first liquid repellent area 28a, for example, at the time of an exposure operation, at least part of a liquid immersion area 14 that is protruded from the surface of the wafer is formed, and on the second liquid repellent area 28b, scales for an encoder system (to be described later) are formed. Incidentally, at least part of the surface of plate 28 does not have to be flush with the surface of the wafer, that is, may have a different height from that of the surface of the wafer. Further, plate 28 may be a single plate, but in the embodiment, plate 28 is configured by combining a plurality of plates, for example, first and second liquid repellent plates that correspond to the first liquid repellent area 28a and the second liquid repellent area 28b respectively. In the embodiment, pure water is used as liquid Lq as is described above, and therefore, hereinafter the first liquid repellent area 28a and the second liquid repellent area 28b are also referred to as a first water repellent plate 28a and a second water repellent plate 28b.

In this case, exposure light IL is irradiated to the first water repellent plate 28a on the inner side, while exposure light IL is hardly irradiated to the second water repellent plate 28b on the outer side. Taking this fact into consideration, in the embodiment, a first water repellent area to which water repellent coat having sufficient resistance to exposure light IL (light in a vacuum ultraviolet region, in this case) is applied is formed on the surface of the first water repellent plate 28a, and a second water repellent area to which water repellent coat having resistance to exposure light IL inferior to the first water repellent area is applied is formed on the surface of the second water repellent plate 28b. In general, since it is difficult to apply water repellent coat having sufficient resistance to exposure light IL (light in a vacuum ultraviolet region, in this case) to a glass plate, it is effective to separate the water repellent plate into two sections in this manner, i.e. the first water repellent plate 28a and the second water repellent plate 28b around it. Incidentally, the present invention is not limited to this, and two types of water repellent coat that have different resistance to exposure light IL may also be applied on the upper surface of the same plate in order to form the first water repellent area and the second water repellent area. Further, the same kind of water repellent coat may be applied to the first and second water repellent areas. For example, only one water repellent area may also be formed on the same plate.

Figure 4A:
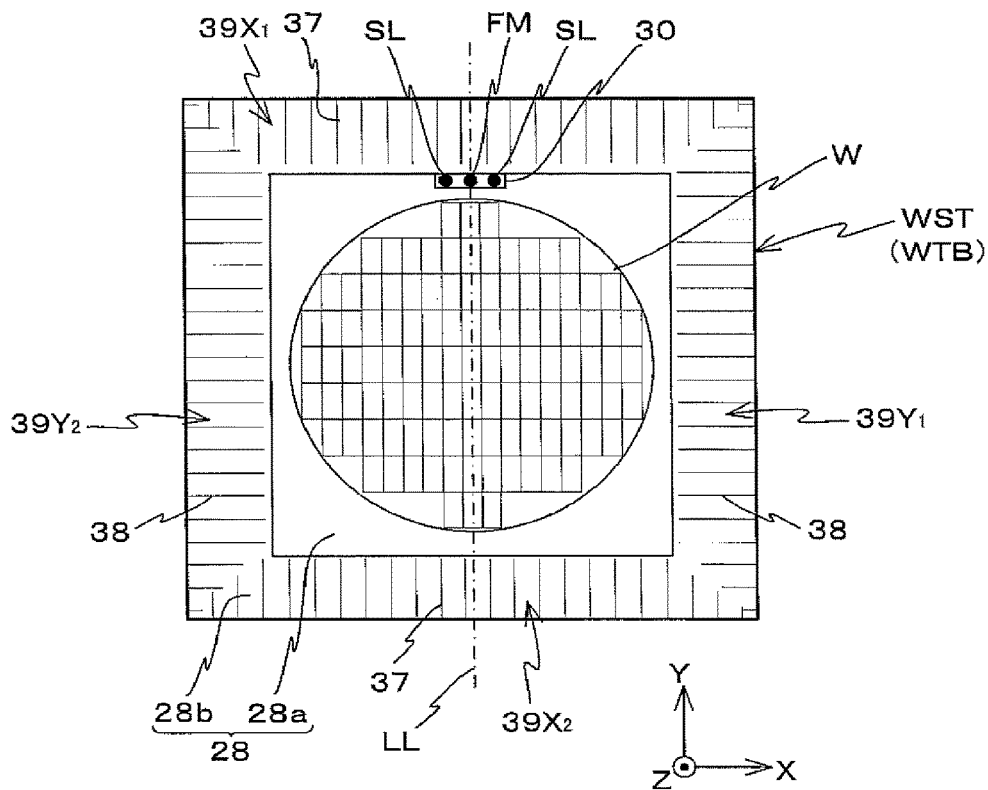
FIG. 4A is a planar view showing a wafer stage.

Further, as is obvious from FIG. 4A, at the end portion on the +Y side of the first water repellent plate 28a, a rectangular cutout is formed in the center portion in the X-axis direction, and a measurement plate 30 is embedded inside the rectangular space (inside the cutout) that is enclosed by the cutout and the second water repellent plate 28b. A fiducial mark FM is formed in the center in the longitudinal direction of measurement plate 30 (on a centerline LL of wafer table WTB), and a pair of aerial image measurement slit patterns (slit-shaped measurement patterns) SL are formed in a symmetrical placement with respect to the center of fiducial mark FM on one side and the other side in the X-axis direction of fiducial mark FM. As each of aerial image measurement slit patterns SL, an L-shaped slit pattern having sides along the Y-axis direction and X-axis direction can be used, as an example.

Figure 4B:
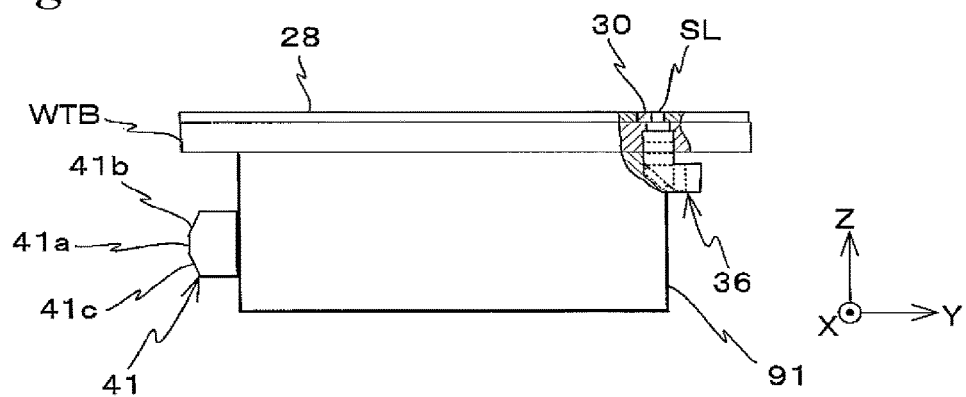
FIG. 4B is a schematic side view of a partially sectioned wafer stage WST.

Further, as shown in FIG. 4B, at the wafer stage WST section below each of aerial image measurement slit patterns SL, an L-shaped housing 36 in which an optical system containing an objective lens, a mirror, a relay lens and the like is housed is attached in a partially embedded state penetrating through part of the inside of wafer table WTB and stage main section 91. Housing 36 is arranged in pairs corresponding to the pair of aerial image measurement slit patterns SL, although omitted in the drawing.

The optical system inside housing 36 guides illumination light IL that has been transmitted through aerial image measurement slit pattern SL along an L-shaped route and emits the light toward a −Y direction. Incidentally, in the following description, the optical system inside housing 36 is described as a light-transmitting system 36 by using the same reference code as housing 36 for the sake of convenience.

Moreover, on the upper surface of the second water repellent plate 28b, multiple grid lines are directly formed in a predetermine pitch along each of four sides. More specifically, in areas on one side and the other side in the X-axis direction of the second water repellent plate 28b (both sides in the horizontal direction in FIG. 4A), Y scales $39Y_1$ and $39Y_2$ are formed, respectively. Y scales $39Y_1$ and $39Y_2$ are each composed of a reflective grating (e.g. diffraction grating) having a periodic direction in the Y-axis direction in which grid lines 38 having the longitudinal direction in the X-axis direction are formed in a predetermined pitch along a direction parallel to the Y-axis (Y-axis direction).

Similarly, in areas on one side and the other side in the Y-axis direction of the second water repellent plate 28b (both sides in the vertical direction in FIG. 4A), X scales $39X_1$ and $39X_2$ are formed respectively. X scales $39X_1$ and $39X_2$ are each composed of a reflective grating (e.g. diffraction grating) having a periodic direction in the X-axis direction in which grid lines 37 having the longitudinal direction in the Y-axis direction are formed in a predetermined pitch along a direction parallel to the X-axis (X-axis direction). As each of the scales, the scale made up of a reflective diffraction grating RG (refer to FIG. 8) that is created by, for example, hologram or the like on the surface of the second water repellent plate 28b is used. In this case, each scale has gratings made up of narrow slits, grooves or the like that are marked at a predetermined distance (pitch) as graduations. The type of diffraction grating used for each scale is not limited, and not only the diffraction grating made up of grooves or the like that are mechanically formed, but also, for example, the diffraction grating that is created by exposing interference fringe on a photosensitive resin may be used. However, each scale is created by marking the graduations of the diffraction grating, for example, in a pitch between 138 nm to 4 μm, for example, a pitch of 1 μm on a thin plate shaped glass. These scales are covered with the liquid repellent film (water repellent film) described above. Incidentally, the pitch of the grating is shown much wider in FIG. 4A than the actual pitch, for the sake of convenience. The same is true also in other drawings.

In this manner, in the embodiment, since the second water repellent plate 28b itself constitutes the scales, a glass plate with low-thermal expansion is to be used as the second water repellent plate 28b. However, the present invention is not limited to this, and a scale member made up of a glass plate or the like with low-thermal expansion on which a grating is formed may also be fixed on the upper surface of wafer table WTB, by a plate spring (or vacuum suction) or the like so as to prevent local shrinkage/expansion. In this case, a water repellent plate to which the same water repellent coat is applied on the entire surface may be used instead of plate 28. Or, wafer table WTB may also be formed by a low thermal expansion material, and in such a case, a pair of Y scales and a pair of X scales may be directly formed on the upper surface of wafer table WTB.

Incidentally, in order to protect the diffraction grating, it is also effective to cover the grating with a glass plate with low thermal expansion that has liquid repellency. In this case, the thickness of the glass plate, for example, is 1 mm, and the glass plate is set on the upper surface of the wafer table WST so that its surface is at the same height same as the wafer surface. Therefore, the distance between the surface (substantially flush with the upper surface of wafer stage WST in the embodiment) of wafer W held (mounted) on wafer stage WST and the grating surface of the scale in the Z-axis direction is to be 1 mm.

Incidentally, a lay out pattern is arranged for deciding the relative position between an encoder head and a scale near the edge of the scale (to be described later). The lay out pattern is configured from grid lines that have different reflectivity, and when the encoder head scans the pattern, the intensity of the output signal of the encoder changes. Therefore, a threshold value is determined beforehand, and the position where the intensity of the output signal exceeds the threshold value is detected. Then, the relative position between the encoder head and the scale is set, with the detected position as a reference.

In the embodiment, main controller 20 can obtain the displacement of wafer stage WST in directions of six degrees of freedom (the Z, X, Y, θz, θx, and θy directions) in the entire stroke area from the measurement results of interferometer system 118 (refer to FIG. 6). In this case, interferometer system 118 includes X interferometers 126 to 128, Y interferometer 16, and Z interferometers 43A and 43B.

To the −Y edge surface and the −X edge surface of wafer table WTB, mirror-polishing is applied, respectively, and a reflection surface 17a and a reflection surface 17b shown in FIG. 2 are formed. By severally projecting an interferometer beam (measurement beam) to reflection surface 17a and reflection surface 17b and receiving a reflected light of each beam, Y interferometer 16 and X interferometers 126, 127, and 128 (X interferometers 126 to 128 are not shown in FIG. 1, refer to FIG. 2) of interferometer system 118 (refer to FIG. 6) measure a displacement of each reflection surface from a datum position (generally, a fixed mirror is placed on the side surface of projection unit PU, and the surface is used as a reference surface), that is, positional information of wafer stage WST within the XY plane, and the measurement values are supplied to main controller 20. In the embodiment, as it will be described later on, as each interferometer a multiaxial interferometer that has a plurality of measurement axes is used with an exception for a part of the interferometers.

Meanwhile, to the side surface on the −Y side of stage main section 91, a movable mirror 41 having the longitudinal direction in the X-axis direction is attached via a kinematic support mechanism (not shown), as shown in FIGS. 1 and 4B.

A pair of Z interferometers 43A and 43B (refer to FIGS. 1 and 2) that configures a part of interferometer system 118 (refer to FIG. 6) and irradiates measurement beams on movable mirror 41 is arranged facing movable mirror 41. To be more specific, as it can be seen when viewing FIGS. 2 and 4B together, movable mirror 41 is designed so that the length in the X-axis direction is longer than reflection surface 17a of wafer table WTB by at least the interval of Z interferometers 43A and 43B. Further, movable mirror 41 is composed of a member having a hexagonal cross-section shape as in a rectangle and an isosceles trapezoid that has been integrated. Mirror-polishing is applied to the surface on the −Y side of movable mirror 41, and three reflection surfaces 41b, 41a, and 41c are formed.

Reflection surface 41a configures the edge surface on the −Y side of movable mirror 41, and reflection surface 41a is parallel with the XZ plane and also extends in the X-axis direction. Reflection surface 41b configures a surface adjacent to the +Z side of reflection surface 41a, and reflection surface 41b is parallel with a plane inclined in a clockwise direction in FIG. 4B at a predetermined angle with respect to the XZ plane and also extends in the X-axis direction. Reflection surface 41c configures a surface adjacent to the −Z side of reflection surface 41a, and is arranged symmetrically with reflection surface 41b, with reflection surface 41b in between.

As it can be seen when viewing FIGS. 1 and 2 together, Z interferometers 43A and 43B are placed apart on one side and the other side of Y interferometer 16 in the X-axis direction at a substantially equal distance and at positions slightly lower than Y interferometer 16, respectively.

From each of the Z interferometers 43A and 43B, as shown in FIG. 1, measurement beam B1 along the Y-axis direction is projected toward reflection surface 41b, and measurement beam B2 along the Y-axis direction is projected toward reflection surface 41c (refer to FIG. 4B). In the embodiment, fixed mirror 47A having a reflection surface orthogonal to measurement beam B1 reflected off reflection surface 41b and a fixed mirror 47B having a reflection surface orthogonal to measurement beam B2 reflected off reflection surface 41c are arranged, each extending in the X-axis direction at a position distanced apart from movable mirror 41 in the −Y-direction by a predetermined distance in a state where the fixed mirrors do not interfere with measurement beams B1 and B2.

Fixed mirrors 47A and 47B are supported, for example, by the same support body (not shown) arranged in the frame (not shown) which supports projection unit PU. Incidentally, fixed mirrors 47A and 47B can be arranged in the measurement frame or the like previously described. Further, in the embodiment, movable mirror 41 having three reflection surfaces 41b, 41a, and 41c and fixed mirrors 47A and 47B were arranged, however, the present invention is not limited to this, and for example, a configuration in which a movable mirror having an inclined surface of 45 degrees is arranged on the side surface of stage main section 91 and a fixed mirror is placed above wafer stage WST can be employed. In this case, the fixed mirror can be arranged in the support body previously described or in the measurement frame.

Y interferometer 16, as shown in FIG. 2, projects measurement beams $B4_1$ and $B4_2$ on reflection surface 17a of wafer table WTB along a measurement axis in the Y-axis direction spaced apart by an equal distance to the −X side and the +X side from a straight line that is parallel to the Y-axis which passes through the projection center (optical axis AX, refer to FIG. 1) of projection optical system PL, and by receiving each reflected light, detects the position of wafer table WTB in the Y-axis direction (a Y position) at the irradiation point of measurement beams $B4_1$ and $B4_2$. Incidentally, in FIG. 1, measurement beams $B4_1$ and $B4_2$ are representatively shown as measurement beam B4.

Further, Y interferometer 16 projects a measurement beam B3 toward reflection surface 41a along a measurement axis in the Y-axis direction with a predetermined distance in the Z-axis direction spaced between measurement beams $B4_1$ and $B4_2$, and by receiving measurement beam B3 reflected off reflection surface 41a, detects the Y position of reflection surface 41a (more specifically wafer stage WST) of movable mirror 41.

Main controller 20 computes the Y position (or to be more precise, displacement ΔY in the Y-axis direction) of reflection surface 17a, or more specifically, wafer table WTB (wafer stage WST), based on an average value of the measurement values of the measurement axes corresponding to measurement beams $B4_1$ and $B4_2$ of Y interferometer 16. Further, main controller 20 computes displacement (yawing amount) $\Delta\theta z^{(Y)}$ in the θz direction of wafer table WTB, based on a difference of the measurement values of the measurement axes corresponding to measurement beams $B4_1$ and $B4_2$. Further, main controller 20 computes displacement (pitching amount) Δθx in the θx direction of wafer stage WST, based on the Y position (displacement ΔY in the Y-axis direction) in reflection surface 17a and reflection surface 41a.

Further, as shown in FIG. 2, X interferometer 126 projects measurement beams B5$_1$ and B5$_2$ on wafer table WTB along the dual measurement axes spaced apart from straight line LH in the X-axis direction that passes the optical axis of projection optical system PL by the same distance, and based on the measurement values of the measurement axes corresponding to measurement beams B5$_1$ and B5$_2$, main controller 20 computes a position (an X position, or to be more precise, displacement ΔX in the X-axis direction) of wafer table WTB in the X-axis direction. Further, main controller 20 computes displacement (yawing amount) Δθz$^{(X)}$ of wafer table WTB in the θz direction from a difference of the measurement values of the measurement axes corresponding to measurement beams B5$_1$ and B5$_2$. Incidentally, Δθz$^{(X)}$ obtained from X interferometer 126 and Δθz$^{(Y)}$ obtained from Y interferometer 16 are equal to each other, and represents displacement (yawing amount) Δθz of wafer table WTB in the θz direction.

Further, as is indicated in a dotted line in FIG. 2, a measurement beam B7 is emitted from X interferometer 128 along a measurement axis parallel to the X-axis. X interferometer 128 actually projects measurement beam B7 on reflection surface 17b of wafer table WTB located in the vicinity of an unloading position UP and a loading position LP along a measurement axis, which is parallel to the X-axis and joins unloading position UP and loading position LP (refer to FIG. 3) as in the description later on. Further, as shown in FIG. 2, a measurement beam B6 from X interferometer 127 is projected on reflection surface 17b of wafer table WTB. Measurement beam B6 is actually projected on reflection surface 17b of wafer table WTB along a measurement axis parallel to the X-axis that passes through the detection center of a primary alignment system AL1.

Figure 22:
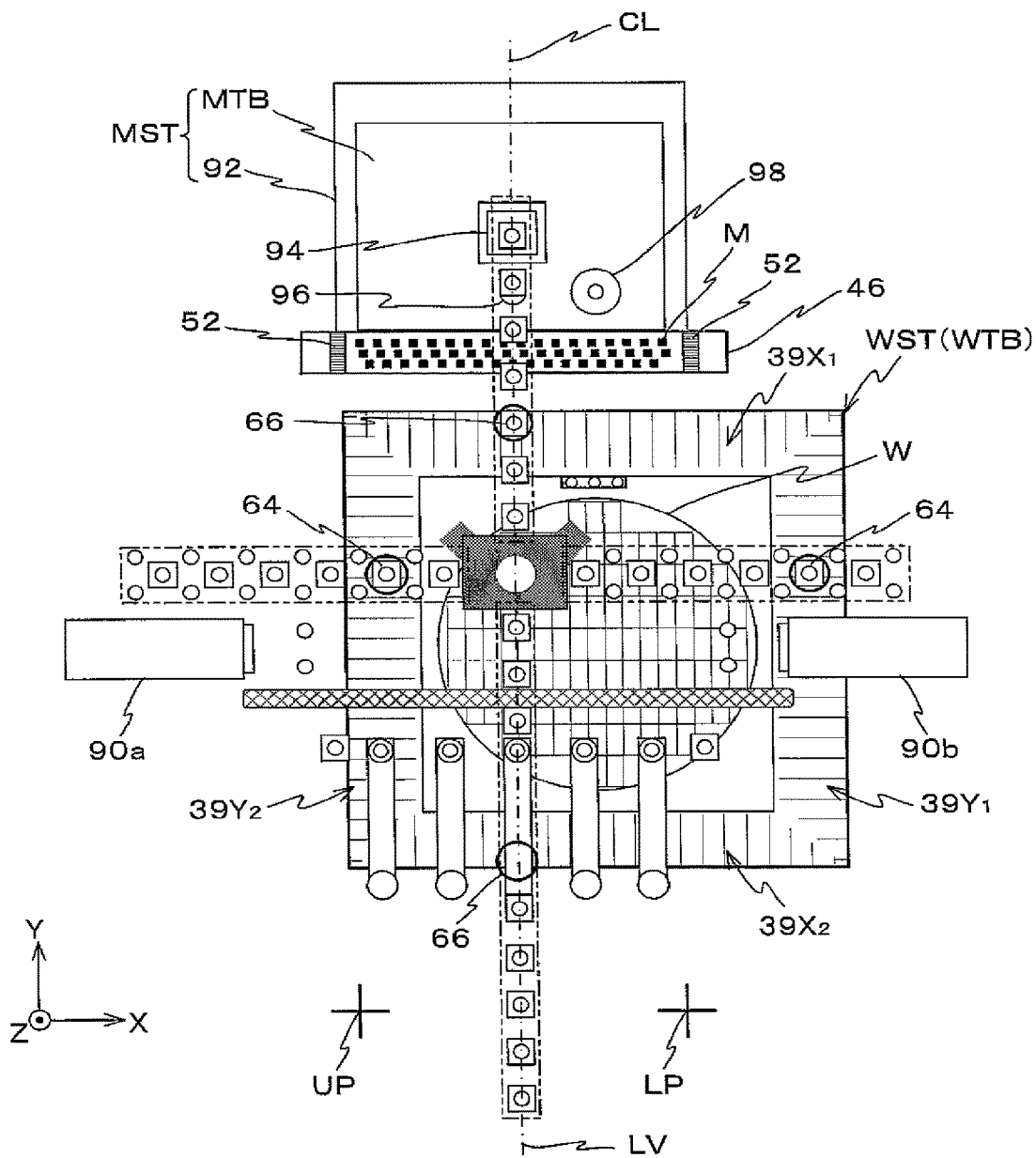
FIG. 22 is a view showing a state of the wafer stage and the measurement stage while exposure by a step-and-scan method is being performed to a wafer on the wafer stage.
Figure 29:
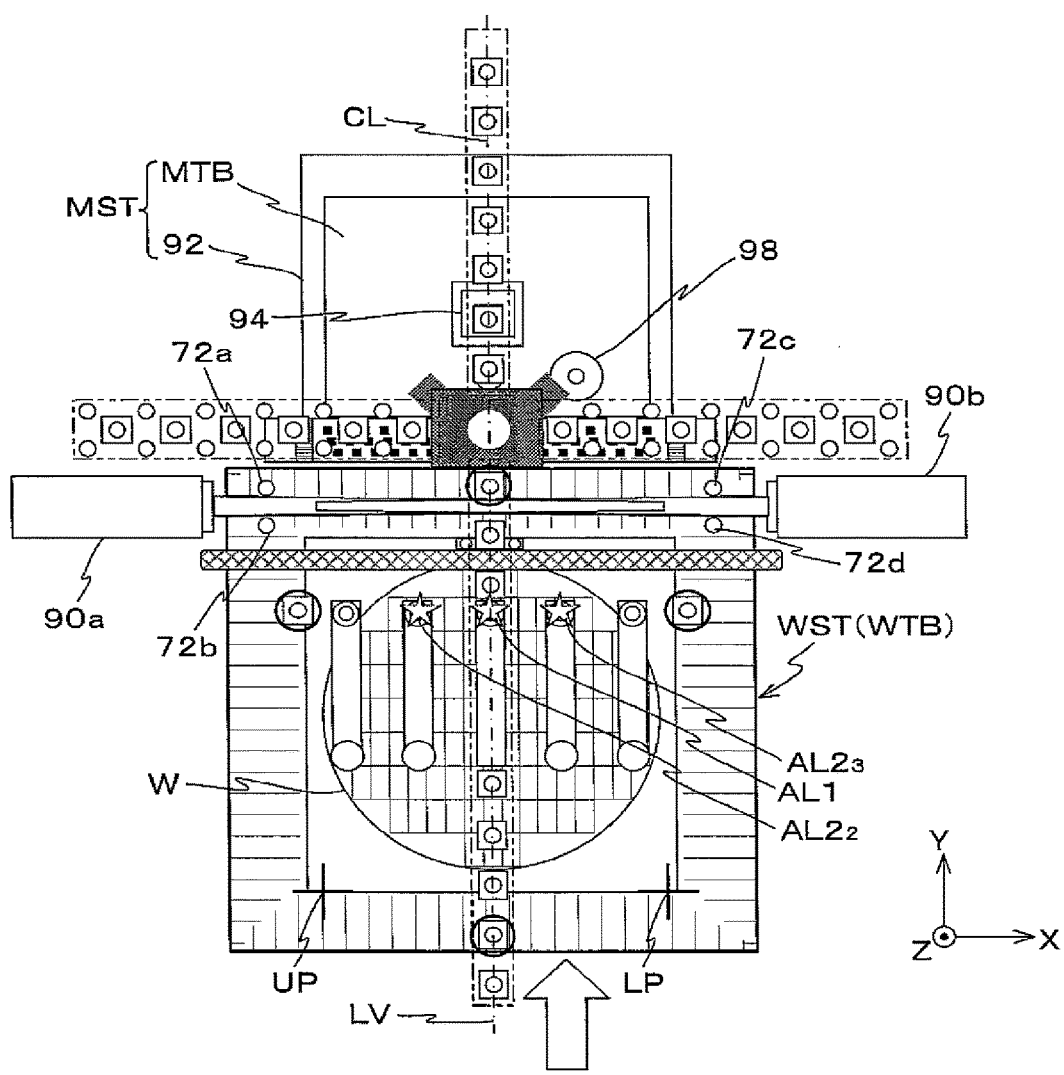
FIG. 29 is a view showing a state of the wafer stage and the measurement stage when alignment marks arranged in three first alignment shot areas are being simultaneously detected using alignment systems AL1, $AL2_2$ and $AL2_3$.

Main controller 20 can obtain displacement ΔX of wafer table WTB in the X-axis direction from the measurement values of length measurement beam B6 of X interferometer 127 and the measurement values of length measurement beam B7 of X interferometer 128. However, the three X interferometers 126, 127, and 128 are placed differently regarding the Y-axis direction, and X interferometer 126 is used at the time of exposure as shown in FIG. 22, X interferometer 127 is used at the time of wafer alignment as shown in FIG. 29 and the like, and X interferometer 128 is used at the time of wafer loading shown in FIGS. 26 and 27 and wafer unloading shown in FIG. 25.

Further from Z interferometers 43A and 43B, measurement beams B1 and B2 that proceed along the Y-axis are projected toward movable mirror 41, respectively. These measurement beams B1 and B2 are incident on reflection surfaces 41b and 41c of movable mirror 41, respectively, at a predetermined angle of incidence (the angle is to be θ/2). Then, measurement beams B1 and B2 are reflected off reflection surfaces 41b and 41c, respectively, and are incident on the reflection surfaces of fixed mirrors 47A and 47B perpendicularly. Then, measurement beams B1 and B2, which were reflected off the reflection surface of fixed mirrors 47A and 47B, are reflected off reflection surfaces 41b and 41c again (returns the optical path at the time of incidence), respectively, and are received by Z interferometers 43A and 43B.

In this case, when displacement of wafer stage WST (more specifically movable mirror 41) in the Y-axis direction is ΔYo and displacement in the Z-axis direction is ΔZo, an optical path length change ΔL1 of measurement beam B1 and an optical path length change ΔL2 of measurement beam B2 received at of Z interferometers 43A and 43B can respectively be expressed as in formulas (1) and (2) below.

$$\Delta L1=\Delta Yo^*(1+\cos\theta)-\Delta Zo^*\sin\theta \quad (1)$$

$$\Delta L2=\Delta Yo^*(1+\cos\theta)+\Delta Zo^*\sin\theta \quad (2)$$

Accordingly, from formulas (1) and (2), ΔZo and ΔYo can be obtained using the following formulas (3) and (4).

$$\Delta Zo=(\Delta L2-\Delta L1)/2\sin\theta \quad (3)$$

$$\Delta Yo=(\Delta L1+\Delta L2)/\{2(1+\cos\theta)\} \quad (4)$$

Displacements ΔZo and ΔYo above can be obtained with Z interferometers 43A and 43B. Therefore, displacement which is obtained using Z interferometer 43A is to be ΔZoR and ΔYoR, and displacement which is obtained using Z interferometer 43B is to be ΔZoL and ΔYoL. And the distance between measurement beams B1 and B2 projected by Z interferometers 43A and 43B, respectively, in the X-axis direction is to be a distance D (refer to FIG. 2). Under such premises, displacement (yawing amount) Δθz of movable mirror 41 (more specifically wafer stage WST) in the θz direction and displacement (rolling amount) Δθy of movable mirror 41 (more specifically wafer stage WST) in the θy direction can be obtained by the following formulas (5) and (6).

$$\Delta\theta z\approx(\Delta YoR-\Delta YoL)/D \quad (5)$$

$$\Delta\theta y\approx(\Delta ZoL-\Delta ZoR)/D \quad (6)$$

Accordingly, by using the formulas (3) to (6) above, main controller 20 can compute displacement of wafer stage WST in four degrees of freedom, ΔZo, ΔYo, Δθz, and Δθy, based on the measurement results of Z interferometers 43A and 43B.

In the manner described above, from the measurement results of interferometer system 118, main controller 20 can obtain displacement of wafer stage WST in directions of six degrees of freedom (Z, X, Y, θz, θx, and θy directions). Incidentally, in the embodiment, interferometer system 118 could measure the positional information of wafer stage WST in directions of six degrees of freedom, however, the measurement direction is not limited to directions of six degrees of freedom, and the measurement direction can be directions of five degrees of freedom or less.

Incidentally, in the embodiment, the case has been described where wafer stage WST (91, WTB) is a single stage that can move in six degrees of freedom, however, the present invention is not limited to this, and wafer stage WST can be configured including stage main section 91 which can move freely in the XY plane, and wafer table WTB mounted on stage main section 91 that can be finely driven relative to stage main section 91 at least in the Z-axis direction, the θx direction, and the θy direction. In this case, movable mirror 41 described earlier is arranged in wafer table WTB. Further, instead of reflection surface 17a and reflection surface 17b, a movable mirror consisting of a plane mirror can be arranged in wafer table WTB.

However, in the embodiment, positional information (positional information in directions of three degrees of freedom including rotary information in the θz direction) of wafer stage WST (wafer table WTB) in the XY plane is mainly measured by an encoder system described later on, and the measurement values of interferometer 16, 126, and 127 are used secondarily as backup or the like, such as in the case of correcting (calibrating) a long-term change (due to, for example, temporal deformation of a scale) of the measurement values of the encoder system, or in the case of output abnormality in the encoder. Incidentally, in the embodiment, of the positional information of wafer stage WST in directions of six degrees of freedom, positional information in directions of three degrees of freedom including the X-axis direction, the Y-axis direction and the θz direction is measured by the encoder system described later on, and the remaining directions of three degrees of freedom, or more specifically, the positional information in the Z-axis direction, the θx direction, and the θy direction is measured by a measurement system which will also be described later that has a plurality of Z sensors. Positional information of the remaining directions of three degrees of freedom can be measured by both the measurement system and interferometer system 118. For example, positional information in the Z-axis direction and the θy direction can be measured by the measurement system, and positional information in the θx direction can be measured by interferometer system 118.

Incidentally, at least part of interferometer system 118 (such as an optical system) may be arranged at the main frame that holds projection unit PU, or may also be arranged integrally with projection unit PU that is supported in a suspended state as is described above, however, in the embodiment, interferometer system 118 is to be arranged at the measurement frame described above.

Measurement stage MST includes stage main section 92 previously described, and measurement table MTB mounted on stage main section 92. Measurement table MTB is mounted on stage main section 92, via the Z leveling mechanism (not shown). However, the present invention is not limited to this, and for example, measurement stage MST can employ the so-called coarse and fine movement structure in which measurement table MTB can be finely driven in the X-axis direction, the Y-axis direction, and the θz direction with respect to stage main section 92, or measurement table MTB can be fixed to stage main section 92, and all of measurement stage MST including measurement table MTB and stage main section 92 can be configured drivable in directions of six degrees of freedom.

Figure 5A:
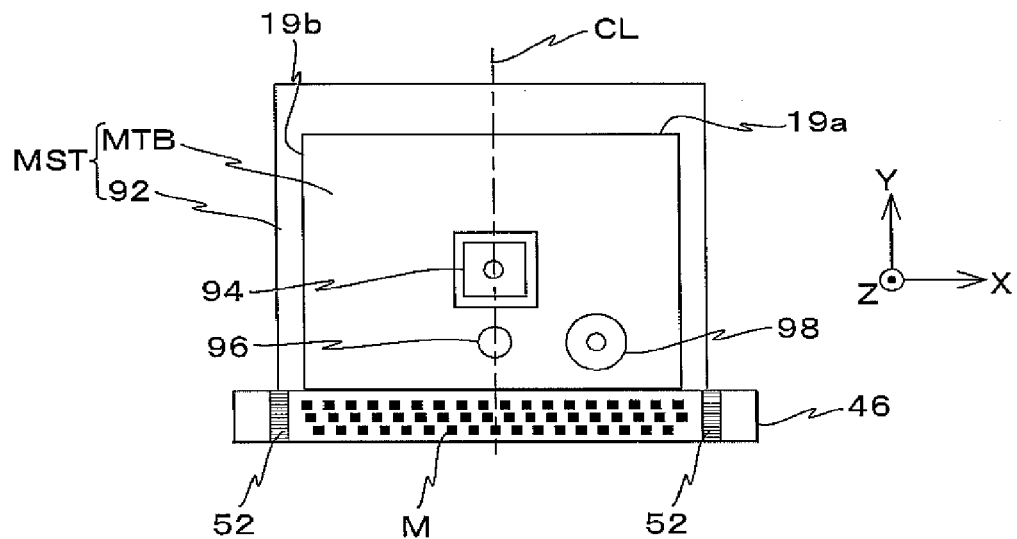
FIG. 5A is a planar view showing a measurement stage.

Various measurement members are arranged at measurement table MTB (and stage main section 92). As such measurement members, for example, as shown in FIGS. 2 and 5A, members such as an irregular illuminance sensor 94 that has a pinhole-shaped light-receiving section which receives illumination light IL on an image plane of projection optical system PL, an aerial image measuring instrument 96 that measures an aerial image (projected image) of a pattern projected by projection optical system PL, a wavefront aberration measuring instrument 98 by the Shack-Hartman method that is disclosed in, for example, the pamphlet of International Publication No. WO 03/065428 and the like are employed. As wavefront aberration measuring instrument 98, the one disclosed in, for example, the pamphlet of International Publication No. WO 99/60361 (the corresponding EP Patent Application Publication No. 1 079 223 description) can also be used.

As irregular illuminance sensor 94, the configuration similar to the one that is disclosed in, for example, Kokai (Japanese Unexamined Patent Application Publication) No. 57-117238 bulletin (the corresponding U.S. Pat. No. 4,465,368 description) and the like can be used. Further, as aerial image measuring instrument 96, the configuration similar to the one that is disclosed in, for example, Kokai (Japanese Unexamined Patent Application Publication) No. 2002-014005 bulletin (the corresponding U.S. Patent Application Publication No. 2002/0041377 description) and the like can be used. Incidentally, three measurement members (94, 96 and 98) are to be arranged at measurement stage MST in the embodiment, however, the types and/or the number of measurement members are/is not limited to them. As the measurement members, for example, measurement members such as a transmittance measuring instrument that measures a transmittance of projection optical system PL, and/or a measuring instrument that observes local liquid immersion unit 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

In the embodiment, as it can be seen from FIG. 5A, the sensors that are frequently used such as irregular illuminance sensor 94 and aerial image measuring instrument 96 are placed on a centerline CL (Y-axis passing through the center) of measurement stage MST. Therefore, in the embodiment, measurement using theses sensors can be performed by moving measurement stage MST only in the Y-axis direction without moving the measurement stage in the X-axis direction.

In addition to each of the sensors described above, an illuminance monitor that has a light-receiving section having a predetermined area size that receives illumination light IL on the image plane of projection optical system. PL may also be employed, which is disclosed in, for example, Kokai (Japanese Unexamined Patent Application Publication) No. 11-016816 bulletin (the corresponding U.S. Patent Application Publication No. 2002/0061469 description) and the like. The illuminance monitor is also preferably placed on the centerline.

Incidentally, in the embodiment, liquid immersion exposure is performed in which wafer W is exposed with exposure light (illumination light) IL via projection optical system PL and liquid (water) Lq, and accordingly irregular illuminance sensor 94 (and the illuminance monitor), aerial image measuring instrument 96 and wavefront aberration measuring instrument 98 that are used in measurement using illumination light IL receive illumination light IL via projection optical system PL and water Lq. Further, only part of each sensor such as the optical system may be mounted on measurement table MTB (and stage main section 92), or the entire sensor may be placed on measurement table MTB (and stage main section 92).

Figure 5B:
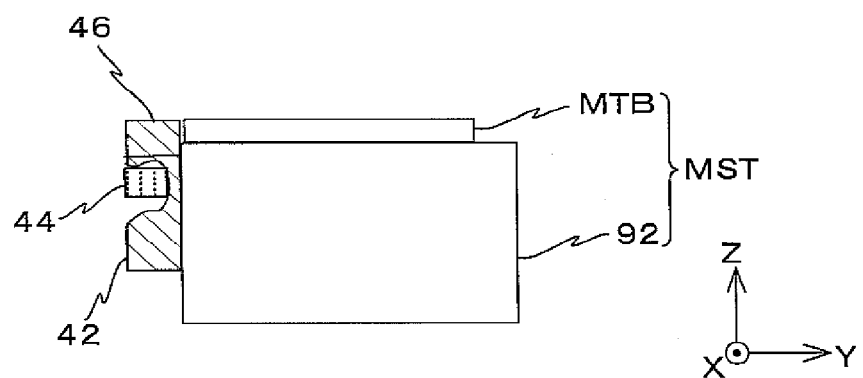
FIG. 5B is a schematic side view showing a partial cross section of the measurement stage.

As shown in FIG. 5B, a frame-shaped attachment member 42 is fixed to the end surface on the −Y side of stage main section 92 of measurement stage MST. Further, to the end surface on the −Y side of stage main section 92, a pair of photodetection systems 44 are fixed in the vicinity of the center position in the X-axis direction inside an opening of attachment member 42, in the placement capable of facing a pair of light-transmitting systems 36 described previously. Each of photodetection systems 44 is composed of an optical system such as a relay lens, a light receiving element such as a photomultiplier tube, and a housing that houses them. As it can be easily imagined from FIGS. 4B and 5B and the description so far, in the embodiment, in a state where wafer stage WST and measurement stage MST are closer together within a predetermined distance in the Y-axis direction (including a contact state), illumination light IL that has been transmitted through each aerial image measurement slit pattern SL of measurement plate 30 is guided by each light-transmitting system 36 and received by the light-receiving element of each photodetection system 44. That is, measurement plate 30, light-transmitting systems 36 and photodetection systems 44 constitute an aerial image measuring unit 45 (refer to FIG. 6), which is similar to the one disclosed in Kokai (Japanese Unexamined Patent Application Publication) No. 2002-014005 bulletin (the corresponding U.S. Patent Application Publication No. 2002/0041377 description) referred to previously, and the like.

On attachment member 42, a confidential bar (hereinafter, shortly referred to as a "CD bar") 46 that is made up of a bar-shaped member having a rectangular sectional shape and serves as a reference member is arranged extending in the X-axis direction. CD bar 46 is kinematically supported on measurement stage MST by a full-kinematic mount structure.

Since CD bar 46 serves as a prototype standard (measurement standard), optical glass ceramics with a low coefficient of thermal expansion, such as Zerodur (the brand name) of Schott AG are employed as the materials. The flatness degree of the upper surface (the surface) of CD bar 46 is set high to be around the same level as a so-called datum plane plate. Further, as shown in FIG. 5A, a reference grating (e.g. diffraction grating) 52 whose periodic direction is the Y-axis direction is respectively formed in the vicinity of the end portions on one side and the other side in the longitudinal direction of CD bar 46. The pair of reference gratings 52 is formed placed apart from each other at a predetermined distance (which is to be "L") in the symmetrical placement with respect to the center in the X-axis direction of CD bar 46, that is, centerline CL described above.

Further, on the upper surface of CD bar 46, a plurality of reference marks M are formed in the placement as shown in FIG. 5A. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by a primary alignment system and secondary alignment systems (to be described later) is used. Reference mark M may also be different in shape (constitution) from fiducial mark FM, but in the embodiment, reference mark M and fiducial mark FM have the same constitution and also they have the same constitution with that of an alignment mark of wafer W. Incidentally, in the embodiment, the surface of CD bar 46 and the surface of measurement table MTB (which may include the measurement members described above) are also covered with a liquid repellent film (water repellent film) severally.

Also on the +Y end surface and the −X end surface of measurement table MTB, reflection surfaces 19a and 19b are formed similar to wafer table WTB as is described above (refer to FIGS. 2 and 5A). By projecting an interferometer beam (measurement beam), as shown in FIG. 2, on reflection surfaces 19a and 19b and receiving a reflected light of each interferometer beam, a Y interferometer 18 and an X interferometer 130 (X-axis interferometer 130 is not shown in FIG. 1, refer to FIG. 2) of interferometer system 118 (refer to FIG. 6) measure a displacement of each reflection surface from a datum position, that is, positional information of measurement stage MST (e.g. including at least positional information in the X-axis and Y-axis directions and rotation information in the θz direction), and the measurement values are supplied to main controller 20.

In exposure apparatus 100 of the embodiment, in actual, a primary alignment system AL1 is placed on straight line LV passing through the center of projection unit PU (optical axis AX of projection optical system PL, which also coincides with the center of exposure area IA in the embodiment) and being parallel to the Y-axis, and has a detection center at a position that is spaced apart from the optical axis at a predetermined distance on the −Y side as shown in FIG. 3, although omitted in FIG. 1 from the viewpoint of avoiding intricacy of the drawing. Primary alignment system AL1 is fixed to the lower surface of a main frame (not shown) via a support member 54. On one side and the other side in the X-axis direction with primary alignment system AL1 in between, secondary alignment systems AL2$_1$ and AL2$_2$, and AL2$_3$ and AL2$_4$ whose detection centers are substantially symmetrically placed with respect to straight line LV are severally arranged. That is, five alignment systems AL1 and AL2$_1$ to AL2$_4$ are placed so that their detection centers are placed at different positions in the X-axis direction, that is, placed along the X-axis direction.

As is representatively shown by secondary alignment system AL2$_4$, each secondary alignment system AL2$_n$ (n=1 to 4) is fixed to a tip (turning end) of an arm 56$_n$ (n=1 to 4) that can turn around a rotation center O as the center in a predetermined angle range in clockwise and anticlockwise directions in FIG. 3. In the embodiment, a part of each secondary alignment system AL2$_n$ (e.g. including at least an optical system that irradiates an alignment light to a detection area and also leads the light that is generated from a subject mark within the detection area to a light-receiving element) is fixed to arm 56$_n$ and the remaining section is arranged at the main frame that holds projection unit PU. The X-positions of secondary alignment systems AL2$_1$, AL2$_2$, AL2$_3$ and AL2$_4$ are severally adjusted by rotating around rotation center O as the center. In other words, the detection areas (or the detection centers) of secondary alignment systems AL2$_1$, AL2$_2$, AL2$_3$ and AL2$_4$ are independently movable in the X-axis direction. Accordingly, the relative positions of the detection areas of primary alignment system AL1 and secondary alignment systems AL2$_4$, AL2$_2$, AL2$_3$ and AL2$_4$ are adjustable in the X-axis direction. Incidentally, in the embodiment, the X-positions of secondary alignment systems AL2$_4$, AL2$_2$, AL2$_3$ and AL2$_4$ are to be adjusted by the rotation of the arms. However, the present invention is not limited to this, and a drive mechanism that drives secondary alignment systems AL2$_1$, AL2$_2$, AL2$_3$ and AL2$_4$ back and forth in the X-axis direction may also be arranged. Further, at least one of secondary alignment systems AL2$_4$, AL2$_2$, AL2$_3$ and AL2$_4$ can be moved not only in the X-axis direction but also in the Y-axis direction. Incidentally, since part of each secondary alignment system AL2$_n$ is moved by arm 56$_n$, positional information of the part that is fixed to arm 56$_n$ is measurable by a sensor (not shown) such as, for example, an interferometer or an encoder. The sensor may only measure position information in the X-axis direction of secondary alignment system AL2$_n$, or may be capable of measuring position information in another direction, for example, the Y-axis direction and/or the rotation direction (including at least one of the θx and θy directions). On the upper surface of each arm 56$_n$, a vacuum pad 58$_n$ (n=1 to 4) that is composed of a differential evacuation type air bearing is arranged. Further, arm 56$_n$ is rotated by a rotation drive mechanism 60$_n$ (n=1 to 4, not shown in FIG. 3, refer to FIG. 6) that includes a motor or the like, in response to instructions of main controller 20. Main controller 20 activates each vacuum pad 58$_n$ to fix each arm 56$_n$ to a main frame (not shown) by suction after rotation adjustment of arm 56$_n$. Thus, the state of each arm 56$_n$ after rotation angle adjustment, that is, a desired positional relation of four secondary alignment systems AL2$_1$ to AL2$_4$ with respect to primary alignment system AL1 is maintained.

Incidentally, in the case a portion of the main frame facing arm 56$_n$ is a magnetic body, an electromagnet may also be employed instead of vacuum pad 58.

In the embodiment, as each of primary alignment system AL1 and four secondary alignment systems $AL2_1$ to $AL2_4$, for example, a sensor of an FIA (Field Image Alignment) system by an image processing method is used that irradiates a broadband detection beam that does not expose resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signal from each of primary alignment system AL1 and four secondary alignment systems $AL2_1$ to $AL2_4$ is supplied to main controller 20 in FIG. 6.

Incidentally, each of the alignment systems described above is not limited to the FIA system, and an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used alone or in combination as needed. Further, five alignment systems AL1 and $AL2_1$ to $AL2_4$ are to be arranged in the embodiment. However, the number of alignment systems is not limited to five, but may be the number equal to or more than two and equal to or less than four, or may be the number equal to or more than six, or may be the even number, not the odd number. Moreover, in the embodiment, five alignment systems AL1 and $AL2_1$ to $AL2_4$ are to be fixed to the lower surface of the main frame that holds projection unit PU, via support member 54. However, the present invention is not limited to this, and for example, the five alignment systems may also be arranged on the measurement frame described earlier. Further, because alignment systems AL1 and $AL2_1$ to $AL2_4$ detect alignment marks on wafer W and reference marks on and CD bar 46, in the embodiment, the systems will also be simply referred to as a mark detection system.

In exposure apparatus 100 of the embodiment, as shown in FIG. 3, four head units 62A to 62D of the encoder system are placed in a state of surrounding nozzle unit 32 on all four sides. In actual, head units 62A to 62D are fixed to the foregoing main frame that holds projection unit PU in a suspended state via a support member, although omitted in FIG. 3 from the viewpoint of avoiding intricacy of the drawings. Incidentally, for example, in the case projection unit PU is supported in a suspended state, head units 62A to 62D may be supported in a suspended state integrally with projection unit PU, or may be arranged at the measurement frame described above.

Head units 62A and 62C are respectively placed on the +X side and −X side of projection unit PU having the longitudinal direction in the X-axis direction, and are also placed apart at the substantially same distance from optical axis AX of projection optical system PL symmetrically with respect to optical axis AX of projection optical system PL. Further, head units 62B and 62D are respectively placed on the +Y side and −Y side of projection unit PU having the longitudinal direction in the Y-axis direction and are also placed apart at the substantially same distance from optical axis AX of projection optical system PL.

As shown in FIG. 3, head units 62A and 62C are each equipped with a plurality of (six in this case) Y heads 64 that are placed at a predetermined distance on a straight line LH that passes through optical axis AX of projection optical system PL and is parallel to the X-axis, along the X-axis direction. Head unit 62A constitutes a multiple-lens (six-lens in this case) Y linear encoder (hereinafter, shortly referred to as a "Y encoder" or an "encoder" as needed) 70A (refer to FIG. 6) that measures the position in the Y-axis direction (the Y-position) of wafer stage WST (wafer table WTB) using Y scale $39Y_1$ described above. Similarly, head unit 62C constitutes a multiple-lens (six-lens, in this case) Y linear encoder 70C (refer to FIG. 6) that measures the Y-position of wafer stage WST (wafer table WTB) using Y scale $39Y_2$ described above. In this case, a distance between adjacent Y heads 64 (i.e. measurement beams) equipped in head units 62A and 62C is set shorter than a width in the X-axis direction of Y scales $39Y_1$ and $39Y_2$ (to be more accurate, a length of grid line 38). Further, out of a plurality of Y heads 64 that are equipped in each of head units 62A and 62C, Y head 64 located innermost is fixed to the lower end portion of barrel 40 of projection optical system PL (to be more accurate, to the side of nozzle unit 32 enclosing tip lens 191) so as to be placed as close as possible to the optical axis of projection optical system PL.

As shown in FIG. 3, head unit 62B is equipped with a plurality of (seven in this case) X heads 66 that are placed on straight line LV at a predetermined distance along the Y-axis direction. Further, head unit 62D is equipped with a plurality of (eleven in this case, out of eleven X heads, however, three X heads that overlap primary alignment system AL1 are not shown in FIG. 3) X heads 66 that are placed on straight line LV at a predetermined distance. Head unit 62B constitutes a multiple-lens (seven-lens, in this case) X linear encoder (hereinafter, shortly referred to as an "X encoder" or an "encoder" as needed) 70B (refer to FIG. 6) that measures the position in the X-axis direction (the X-position) of wafer stage WST (wafer table WTB) using X scale $39X_1$ described above. Further, head unit 62D constitutes a multiple-lens (eleven-lens, in this case) X linear encoder 70D (refer to FIG. 6) that measures the X-position of wafer stage WST (wafer table WTB) using X scale $39X_2$ described above. Further, in the embodiment, for example, at the time of alignment (to be described later) or the like, two X heads 66 out of eleven X heads 66 that are equipped in head unit 62D simultaneously face X scale $39X_1$ and X scale $39X_2$ respectively in some cases. In these cases, X scale $39X_1$ and X head 66 facing X scale $39X_1$ constitute X linear encoder 70B, and X scale $39X_2$ and X head 66 facing X scale $39X_2$ constitute X linear encoder 70D.

Herein, some of eleven X heads 66, in this case, three X heads are attached to the lower surface side of support member 54 of primary alignment system AL1. Further, a distance between adjacent X heads 66 (measurement beams) that are equipped in each of head units 62B and 62D is set shorter than a width in the Y-axis direction of X scales $39X_1$ and $39X_2$ (to be more accurate, a length of grid line 37). Further, X head 66 located innermost out of a plurality of X heads 66 that are equipped in each of head units 62B and 62D is fixed to the lower end portion of the barrel of projection optical system PL (to be more accurate, to the side of nozzle unit 32 enclosing tip lens 191) so as to be placed as close as possible to the optical axis of projection optical system. PL.

Moreover, on the −X side of secondary alignment system $AL2_1$ and on the +X side of secondary alignment system $AL2_4$, Y heads $64y_2$ and $64y_2$ are respectively arranged, whose detection points are placed on a straight line parallel to the X-axis that passes through the detection center of primary alignment system AL1 and are substantially symmetrically placed with respect to the detection center. The distance between Y heads $64y_2$ and $64y_2$ is set substantially equal to distance L described previously. Y heads $64y_2$ and $64y_2$ face Y scales $39Y_2$ and $39Y_1$ respectively in a state where the center of wafer W on wafer stage WST is on straight line LV as shown in FIG. 3. On an alignment operation (to be described later) or the like, Y scales $39Y_2$ and $39Y_1$ are placed facing Y heads $64y_1$ and $64y_2$ respectively, and the Y-position (and the θz rotation) of wafer stage WST is measured by Y heads $64y_2$ and $64y_2$ (i.e. Y encoders 70C and 70A composed of Y heads $64y_2$ and $64y_2$).

Further, in the embodiment, at the time of baseline measurement of the secondary alignment systems (to be described later) or the like, a pair of reference gratings 52 of CD bar 46 face Y heads $64y_1$ and $64y_2$ respectively, and the Y-position of CD bar 46 is measured at the position of each of reference gratings 52 by Y heads $64y_2$ and $64y_2$ and facing reference gratings 52. In the following description, encoders that are composed of Y heads $64y_2$ and $64y_2$ facing reference gratings 52 respectively are referred to as Y-axis linear encoders 70E and 70F (refer to FIG. 6).

Six linear encoders 70A to 70F described above measure the positional information of wafer stage WST in each measurement direction at a resolution of, for example, around 0.1 nm, and the measurement values (measurement information) are supplied to main controller 20. Main controller 20 controls the position within the XY plane of wafer table WTB based on the measurement values of linear encoders 70A to 70D, and also controls the rotation in the θz direction of CD bar 46 based on the measurement values of linear encoders 70E and 70F. Incidentally, the configuration and the like of the linear encoder will be described further later in the description.

In exposure apparatus 100 of the embodiment, a position measuring unit that measures positional information of wafer W in the Z-axis direction is arranged. As shown in FIG. 3, in the embodiment, as the position measuring unit, a multipoint focal position detecting system (hereinafter, shortly referred to as a "multipoint AF system") by an oblique incident method is arranged, which is composed of an irradiation system 90a and a photodetection system 90b, and has the configuration similar to the one disclosed in, for example, Kokai (Japanese Unexamined Patent Application Publication) No. 06-283403 bulletin (the corresponding U.S. Pat. No. 5,448,332 description) and the like. In the embodiment, as an example, irradiation system 90a is placed on the −Y side of the −X end portion of head unit 62C and photodetection system 90b is placed on the −Y side of the +X end portion of head unit 62A in a state of opposing irradiation system 90a.

A plurality of detection points of the multipoint AF system (90a, 90b) are placed at a predetermined distance along the X-axis direction on the surface to be detected, although it is omitted in the drawings. In the embodiment, the plurality of detection points are placed, for example, in the arrangement of a matrix having one row and M columns (M is a total number of detection points) or having two rows and N columns (N is a half of a total number of detection points). In FIG. 3, the plurality of detection points to which a detection beam is severally irradiated are not individually shown, but are shown as an elongate detection area (beam area) AF that extends in the X-axis direction between irradiation system 90a and photodetection system 90b. Since the length of detection area AF in the X-axis direction is set to around the same as the diameter of wafer W, position information (surface position information) in the Z-axis direction across the entire surface of wafer W can be measured by only scanning wafer W in the Y-axis direction once. Further, since detection area AF is placed between liquid immersion area 14 (exposure area IA) and the detection areas of the alignment systems (AL1, $AL2_2$, $AL2_2$, $AL2_3$ and $AL2_4$) in the Y-axis direction, the detection operations of the multipoint AF system and the alignment systems can be performed in parallel. The multipoint AF system may also be arranged on the main frame that holds projection unit PU or the like, but is to be arranged on the measurement frame described earlier in the embodiment.

Incidentally, the plurality of detection points are to be placed in one row and M columns, or two rows and N columns, but the number (s) of rows and/or columns is/are not limited to these numbers. However, in the case the number of rows is two or more, the positions in the X-axis direction of detection points are preferably made to be different even between the different rows. Moreover, the plurality of detection points is to be placed along the X-axis direction. However, the present invention is not limited to this, and all of or some of the plurality of detection points may also be placed at different positions in the Y-axis direction. For example, the plurality of detection points may also be placed along a direction that intersects both of the X-axis and the Y-axis. That is, the positions of the plurality of detection points only have to be different at least in the X-axis direction. Further, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

In the embodiment, in the vicinity of detection points located at both ends out of a plurality of detection points of the multipoint AF system, that is, in the vicinity of both end portions of beam area AF, one each pair of surface position sensors for Z position measurement (hereinafter, shortly referred to as "Z sensors"), that is, a pair of Z sensors 72a and 72b and a pair of Z sensors 72c and 72d are arranged in the symmetrical placement with respect to straight line LV. Z sensors 72a to 72d are fixed to the lower surface of a main frame (not shown). As Z sensors 72a to 72d, a sensor that irradiates a light to wafer table WTB from above, receives the reflected light and measures position information of the wafer table WTB surface in the Z-axis direction orthogonal to the XY plane, as an example, an optical displacement sensor (sensor by an optical pickup method), which has the configuration like an optical pickup used in a CD drive unit, is used. Incidentally, Z sensors 72a to 72d may also be arranged on the measurement frame described above or the like.

Moreover, head unit 62C is equipped with a plurality of (in this case six each, which is a total of twelve) Z sensors $74_{i,j}$ (i=1, 2, j=1, 2, . . . , 6), which are placed corresponding to each other along two straight lines at a predetermined distance, the straight lines being parallel to straight line LH and are located on one side and the other side of straight line LH in the X-axis direction that connects a plurality of Y heads 64. In this case, Z sensors $74_{1,j}$ and $74_{2,j}$ that make a pair are disposed symmetrical to straight line LH. Furthermore, the plurality of pairs (in this case, six pairs) of Z sensors $74_{1,j}$ and $74_{2,j}$ and a plurality of Y heads 64 are placed alternately in the X-axis direction. As each Z sensor $74_{i,j}$, a sensor by an optical pickup method similar to Z sensors 72a to 72d is used.

In this case, the distance between each pair of Z sensors $74_{1,j}$ and $74_{2,j}$ that are located symmetrically with respect to straight line LH is set to be the same distance as the distance between Z sensors 74a and 74b previously described. Further, a pair of Z sensors $74_{1,4}$ and $74_{2,4}$ are located on the same straight line in the Y-axis direction as Z sensors $72a$ and $72b$.

Further, head unit 62A is equipped with a plurality of (twelve in this case) Z sensors $76_{p,q}$ (p=1, 2 and q=1, 2, . . . , 6) that are placed symmetrically to a plurality of Z sensors $74_{i,j}$ with respect to straight line LV. As each Z sensor $76_{p,q}$, a sensor by an optical pickup method similar to Z sensors $72a$ to $72d$ is used. Further, a pair of Z sensors $76_{1,3}$ and $76_{2,3}$ are located on the same straight line in the Y-axis direction as Z sensors $72c$ and $72d$. Incidentally, Z sensors $74_{i,j}$ and $76_{p,q}$ are installed, for example, at the mainframe or the measurement frame previously described. Further, in the embodiment, the measurement system that has Z sensors $72a$ to $72d$, and $74_{i,j}$ and $76_{p,q}$ measures positional information of wafer stage WST in the Z-axis direction using one or a plurality of Z sensors that face the scale previously described. Therefore, in the exposure operation, Z sensors $74_{i,j}$ and $76_{p,q}$ used for position measurement are switched, according to the movement of wafer stage WST. Furthermore, in the exposure operation, Y scale $39Y_1$ and at least one Z sensor $76_{p,q}$ face each other, and Y scale $39Y_2$ and at least one Z sensor $74_{i,j}$ also face each other. Accordingly, the measurement system can measure not only positional information of wafer stage WST in the Z-axis direction, but also positional information (rolling) in the θy direction. Further, in the embodiment, each Z sensor of the measurement system detects a grating surface (a formation surface of a diffraction grating) of the scale, however, the measurement system can also detect a surface that is different from the grating surface, such as, for example, a surface of the cover glass that covers the grating surface.

Incidentally, in FIG. 3, measurement stage MST is omitted and a liquid immersion area that is formed by water Lq held in the space between measurement stage MST and tip lens 191 is shown by a reference code 14. Further, in FIG. 3, a reference code 78 indicates a local air-conditioning system that blows dry air whose temperature is adjusted to a predetermined temperature to the vicinity of a beam path of the multipoint AF system (90a, 90b) by, for example, downflow as is indicated by outline arrows in FIG. 3. Further, a reference code UP indicates an unloading position where a wafer on wafer table WTB is unloaded, and a reference code LP indicates a loading position where a wafer is loaded on wafer table WTB. In the embodiment, unloading position UP and loading position LP are set symmetrically with respect to straight line LV. Incidentally, unloading position UP and loading position LP may be the same position.

FIG. 6 shows the main configuration of the control system of exposure apparatus 100. The control system is mainly configured of main controller 20 composed of a microcomputer (or workstation) that performs overall control of the entire apparatus. In a memory 34 which is an auxiliary memory connecting to main controller 20, correction information, which will be described below, is stored. Incidentally, in FIG. 6, various sensors such as irregular illuminance sensor 94, aerial image measuring instrument 96 and wavefront aberration measuring instrument 98 that are arranged at measurement stage MST are collectively shown as a sensor group 99.

Figure 7A:
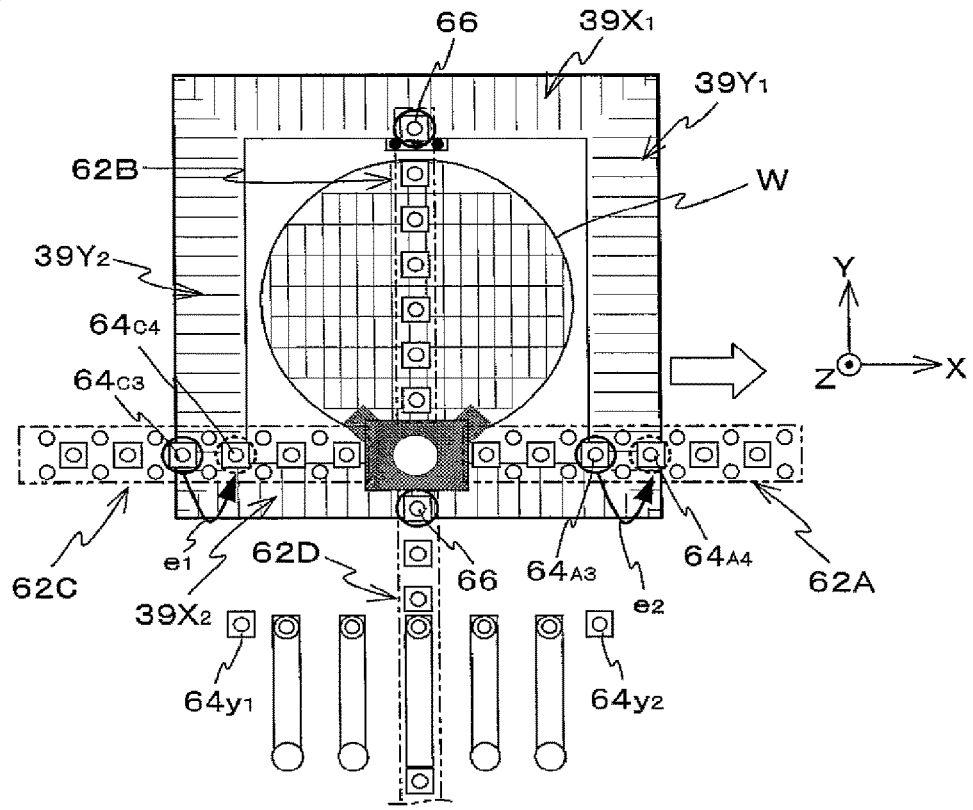
FIGS. 7A and 7B are views for describing a carryover of position measurement of the wafer table in the XY plane by a plurality of encoders which respectively include a plurality of heads placed in the shape of an array and the measurement value between the heads.
Figure 7B:
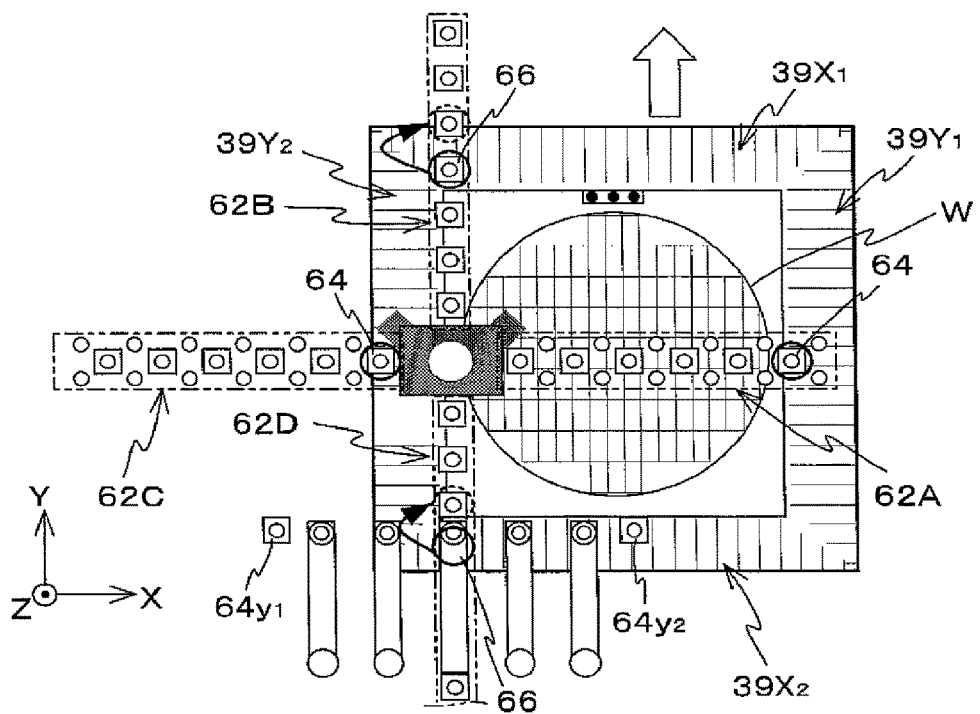

In exposure apparatus 100 of the embodiment which is configured in the manner described above, because the placement of the X scales and Y scales on wafer table WTB and the arrangement of the X heads and Y heads which were described above were employed, in the effective stroke range (more specifically, in the embodiment, the range in which the stage moves for alignment and exposure operation) of wafer stage WST, at least one X head 66 in the total of 18 X heads belonging to head units 62B and 62D must face at least one of X scale $39X_1$ and $39X_2$, and at least one Y head 64 each, or Y head $64y_1$ and $64y_2$ belonging to head units 62A and 62C, also respectively face Y scales $39Y_1$ and $39Y_2$, respectively, as illustrated in FIGS. 7A and 7B. That is, at least one each of the corresponding heads is made to face at least the three out of the four scales.

Incidentally, in FIGS. 7A and 7B, the head which faces the corresponding X scale or Y scale is shown surrounded in a circle.

Therefore, in the effective stroke range of wafer stage WST referred to earlier, by controlling each motor that configures stage drive system 124, based on at least a total of three measurement values of the encoders, which are encoders 70A and 70C, and at least one of encoders 70B and 70D, main controller 20 can control positional information (including rotation in the θz direction) of wafer stage WST in the XY plane with high accuracy. Because the effect of the air fluctuation that the measurement values of encoder 70A to 70D receive is small enough so that it can be ignored when compared with an interferometer, the short-term stability of the measurement affected by the air fluctuation is remarkably good when compared with the interferometer.

Further, when wafer stage WST is driven in the X-axis direction as is shown by an outlined arrow in FIG. 7A, Y heads 64 that measure the position of wafer stage WST in the Y-axis direction are sequentially switched, as is indicated by arrows $e_1$ and $e_2$ in the drawing, to the adjacent Y heads 64. For example, the heads are switched from Y heads $64_{C3}$ and $64_{A3}$ surrounded by a solid circle to Y heads $64_{C4}$ and $64_{A4}$ that are surrounded by a dotted circle. Therefore, before or after this switching, a linkage process of the measurement values which will be described later on is performed. More specifically, in the embodiment, in order to perform the switching of the Y heads 64 and the linkage process of the measurement value smoothly, the distance between adjacent Y heads 64 that head units 62A and 62 have is set smaller than the width of Y scales $39Y_1$ and $39Y_2$ in the X-axis direction.

Further, in the embodiment, since a distance between adjacent X heads 66 that are equipped in head units 62B and 62D is set narrower than a width of X scales $39X_1$ and $39X_2$ in the Y-axis direction as is described previously, when wafer stage WST is driven in the Y-axis direction as indicated by an outline arrow in FIG. 7B, X head 66 that measures the position in the X-axis direction of wafer stage WST is sequentially switched to adjacent X head 66 (e.g. X head 66 circled by a solid line is switched to X head 66 circled by a dotted line), and the linkage process of the measurement values is performed before and after the switching.

Figure 8A:
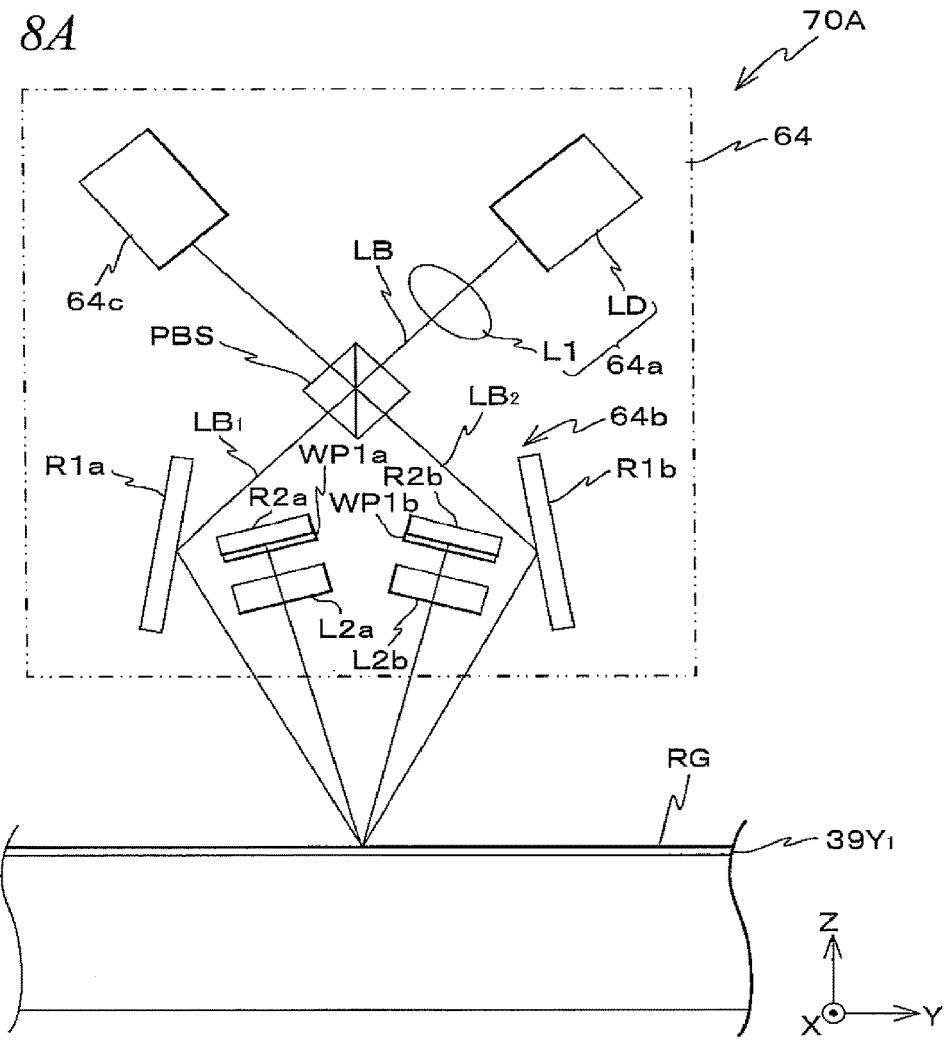
FIG. 8A is a view showing an example of a configuration of an encoder.

Next, the configuration of encoders 70A to 70F will be described, focusing on Y encoder 70A that is enlargedly shown in FIG. 8A, as a representative. FIG. 8A shows one Y head 64 of head unit 62A that irradiates a detection light (measurement beam) to Y scale $39Y_1$.

Y head 64 is mainly composed of three sections, which are an irradiation system 64a, an optical system 64b and a photodetection system 64c.

Irradiation system 64a includes a light source that emits a laser beam LB in a direction inclined at an angle of 45 degrees with respect to the Y-axis and Z-axis, for example, a semiconductor laser LD, and a converging lens L1 that is placed on the optical path of laser beam LB emitted from semiconductor laser LD.

Optical system 64b is equipped with a polarization beam splitter PBS whose separation plane is parallel to an XZ plane, a pair of reflection mirrors R1a and R1b, lenses L2a and L2b, quarter wavelength plates (hereinafter, referred to as a λ/4 plate) WP1a and WP1b, refection mirrors R2a and R2b, and the like.

Photodetection system 64c includes a polarizer (analyzer), a photodetector, and the like.

In Y encoder 70A, laser beam LB emitted from semiconductor laser LD is incident on polarization beam splitter PBS via lens L1, and is split by polarization into two beams $LB_1$ and $LB_2$. Beam $LB_1$ having been transmitted through polarization beam splitter PBS reaches reflective diffraction grating RG that is formed on Y scale $39Y_1$, via reflection mirror R1a, and beam $LB_2$ reflected off polarization beam splitter PBS reaches reflective diffraction grating RG via reflection mirror R1b. Incidentally, "split by polarization" in this case means the splitting of an incident beam into a P-polarization component and an S-polarization component.

Predetermined-order diffraction beams that are generated from diffraction grating RG due to irradiation of beams $LB_1$ and $LB_2$, for example, the first-order diffraction beams are severally converted into a circular polarized light by λ/4 plates WP1b and WP1a via lenses L2b and L2a, and reflected by reflection mirrors R2b and R2a and then the beams pass through λ/4 plates WP1b and WP1a again and reach polarization beam splitter PBS by tracing the same optical path in the reversed direction.

Each of the polarization directions of the two beams that have reached polarization beam splitter PBS is rotated at an angle of 90 degrees with respect to the original direction. Therefore, the first-order diffraction beam of beam $LB_1$ that was previously transmitted through polarization beam splitter PBS is reflected off polarization beam splitter PBS and is incident on photodetection system 64c, and also the first-order diffraction beam of beam $LB_2$ that was previously reflected off polarization beam splitter PBS is transmitted through polarization beam splitter PBS and is synthesized concentrically with the first-order diffraction beam of beam $LB_1$ and is incident on photodetection system 64c.

Then, the polarization directions of the two first-order diffraction beams described above are uniformly arranged by the analyzer inside photodetection system 64c and the beams interfere with each other to be an interference light, and the interference light is detected by the photodetector and is converted into an electric signal in accordance with the intensity of the interference light.

As is obvious from the description above, in Y encoder 70A, since the optical path lengths of the two beams to be interfered are extremely short and also are almost equal to each other, the influence by air fluctuations can mostly be ignored. Then, when Y scale $39Y_1$ (more specifically, wafer stage WST) moves in a measurement direction (in this case, the Y-axis direction), the phase of the two beams changes, respectively, which changes the intensity of the interference light. This change in the intensity of the interference light is detected by photodetection system 64c, and positional information corresponding to the intensity change is output as a measurement value of Y encoder 70A. Other encoders 70B, 70C, 70D, 70E, and 70F are also configured similarly with encoder 70A.

Meanwhile, when wafer stage WST moves in a direction different from the Y-axis direction and a relative motion (a relative motion in a direction besides the measurement direction) occurs between head 64 and Y scale $39Y_1$ in a direction besides the direction that should be measured, in most cases, a measurement error occurs in Y encoder 70A due to such motion. Hereinafter, the mechanism of this measurement error generation will be described.

First of all, a relation between the intensity of interference light that is synthesized from two return beams $LB_2$ and $LB_2$ and displacement (relative displacement with Y head 64) of Y scale $39Y_2$ (reflection grating RG) is derived.

Figure 8B:
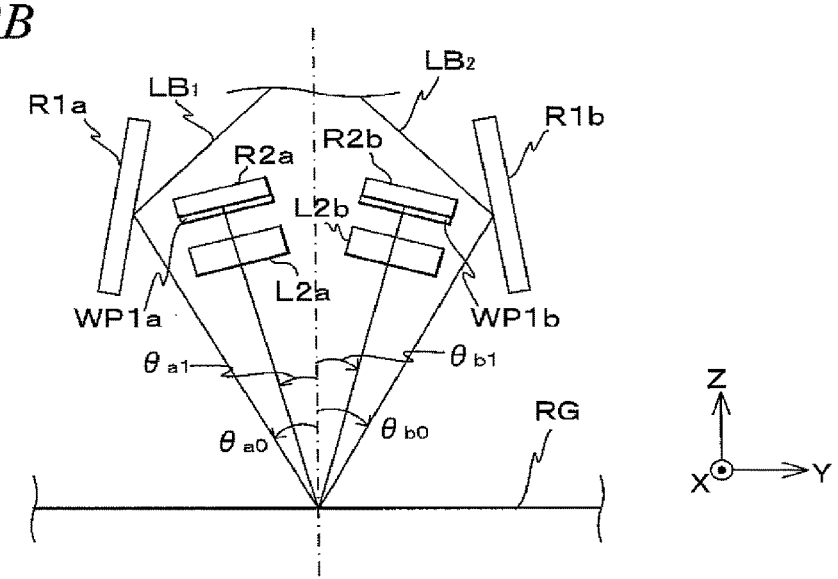
FIG. 8B is a view used to describe a mechanism of the generation of this measurement error and is a view for describing a relation between an incident light and a diffracted light of the beam in the encoder head with respect to the reflection grating.

In FIG. 8B, supposing that beam $LB_1$, which was reflected off reflection mirror R1a, is incident on reflection grating RG at an angle $\theta_{a0}$, and a $n_a^{th}$ order diffraction light is to be generated at an angle $\theta_{a1}$. And the return beam, which is reflected off reflection mirror R2a and follows the return path, is incident on reflection grating RG at an angle $\theta_{a1}$. Then, a diffraction light is generated again. In this case, the diffraction light that occurs at angle $\theta_{a0}$ and moves toward reflection mirror R1a following the original optical path is an $n_a^{th}$ order diffraction light, which is a diffraction light of the same order as the diffraction light generated on the outward path.

Meanwhile, beam $LB_2$ reflected off reflection mirror R1b is incident on reflection grating RG at an angle $\theta_{b0}$, and an $n_b^{th}$ order diffraction light is generated at an angle $\theta_{b1}$. Supposing that this diffraction light is reflected off reflection mirror R2b and returns to reflection mirror R1b following the same optical path.

In this case, intensity I of the interference light synthesized by the two return beams $LB_1$ and $LB_2$ is dependent on a phase difference φ between the two return beams $LB_1$ and $LB_2$ in the light receiving position of the photodetector, by I∝1+cos φ. However, the intensity of the two beams $LB_1$ and $LB_2$ was to be equal to each other.

Details on deriving phase difference φ are omitted here, however, phase difference φ is theoretically obtained by the following formula (7).

$$\phi = K\Delta L + 4\pi(n_b - n_a)\Delta Y/p + 2K\Delta Z(\cos\theta_{b1} + \cos\theta_{b0} - \cos\theta_{a1} - \cos\theta_{a0}) \quad (7)$$

In this case, KΔL is the phase difference due to an optical path difference ΔL of the two beams $LB_1$ and $LB_2$, ΔY is displacement of reflection grating RG in the +Y direction, ΔZ is displacement of reflection grating RG in the +Z direction, p is the pitch of the diffraction grating, and $n_b$ and $n_a$ are the diffraction order of each diffraction light described above.

Suppose that the encoder is configured so as to satisfy optical path difference ΔL=0 and a symmetry shown in the following formula (8).

$$\theta_{a0} = \theta_{b0}, \theta_{a1} = \theta_{b1} \quad (8)$$

In such a case, inside the parenthesis of the third term on the right-hand side of formula (7) becomes zero, and also at the same time $n_b = -n_a$ (=n), therefore, the following formula (9) can be obtained.

$$\phi_{sym}(\Delta Y) = 2\pi \Delta Y/(p/4n) \quad (9)$$

From formula (9) above, it can be seen that phase difference $\phi_{sym}$ is not dependent on the wavelength of the light.

Figure 9A:
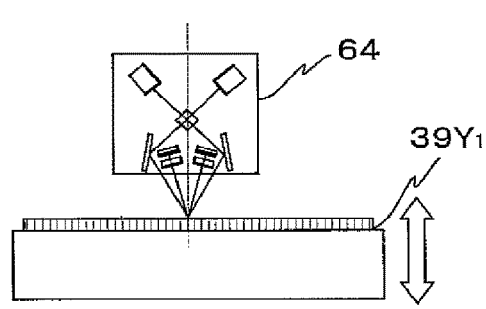
FIG. 9A is a view showing a case when a measurement value does not change even if a relative movement in a non-measurement direction occurs between a head of an encoder and a scale.
Figure 9A:
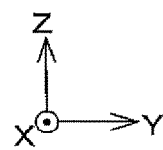
Figure 9B:
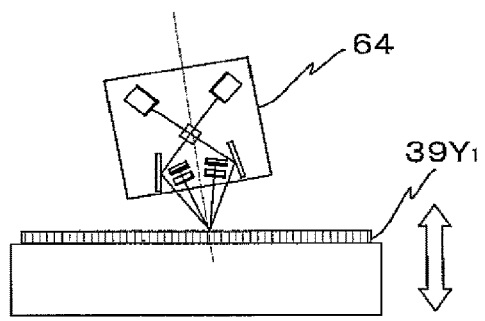
FIG. 9B is a view showing a case when a measurement value changes when a relative movement in a non-measurement direction occurs between a head of an encoder and a scale.
Figure 9B:
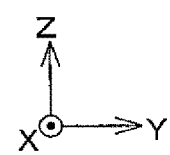

As a simple example, two cases shown in FIGS. 9A and 9B will now be considered. First of all, in the case of FIG. 9A, an optical axis of head 64 coincides with the Z-axis direction (head 64 is not inclined). Supposing that wafer stage WST was displaced in the Z-axis direction (ΔZ≠0, ΔY=0). In this case, because there are no changes in optical path difference ΔL, there are no changes in the first term on the right-hand side of formula (7). The second term becomes zero, according to a supposition ΔY=0. And, the third term becomes zero because it satisfies the symmetry of formula (8). Accordingly, no change occurs in phase difference φ, and further no intensity change of the interference light occurs. As a result, the measurement value (count value) of the encoder also does not change.

Meanwhile, in the case of FIG. 9B, the optical axis of head 64 is inclined (head 64 is inclined) with respect to the Z-axis. Supposing that wafer stage WST was displaced in the Z-axis direction from this state ($\Delta Z \neq 0$, $\Delta Y=0$). In this case as well, because there are no changes in optical path difference $\Delta L$, there are no changes in the first term on the right-hand side of formula (7). And, the second term becomes zero, according to supposition $\Delta Y=0$. However, because the head is inclined the symmetry of formula (8) will be lost, and the third term will not become zero and will change in proportion to Z displacement $\Delta Z$. Accordingly, a change occurs in phase difference $\varphi$, and as a consequence, the measurement value changes. Incidentally, even if head 64 is not gradient, for example, depending on the optical properties (such as telecentricity) of the head the symmetry of formula (8) is lost, and the measurement value changes likewise. More specifically, characteristic information of the head unit, which is a generation factor of the measurement error of the encoder system, includes not only the gradient of the head but also the optical properties as well.

Further, although it is omitted in the drawings, in the case displacement occurs in a direction perpendicular to the measurement direction (the Y-axis direction) and the optical axis direction (the Z-axis direction), ($\Delta X \neq 0$, $\Delta Y=0$, $\Delta Z=0$), the measurement values do not change as long as the direction (longitudinal direction) in which the grid line of diffraction grating RG faces is orthogonal to the measurement direction, however, in the case the direction is not orthogonal, sensitivity occurs with a gain proportional to the angle.

Next, four cases as shown in, for example, FIGS. 10A to 10D, will be considered. First of all, in the case of FIG. 10A, the optical axis of head 64 coincides with the Z-axis direction (head 64 is not inclined). Even if wafer stage WST moves in the +Z direction and shifts to a condition shown in FIG. 10B from this state, the measurement value of the encoder does not change since the case is the same as in FIG. 9A previously described.

Figure 10A:
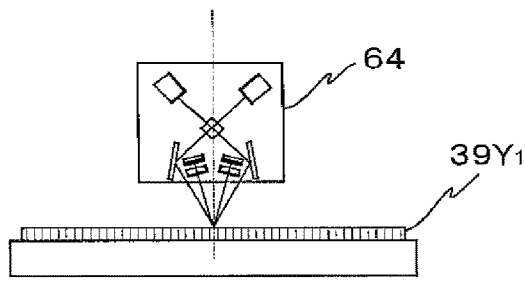
FIGS. 10A to 10D are views used for describing the case when the measurement value of the encoder changes and the case when the measurement values do not change, when a relative movement in the non-measurement direction occurs between the head and the scale.
Figure 10B:
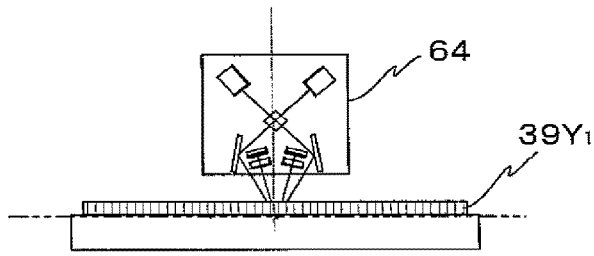
Figure 10C:
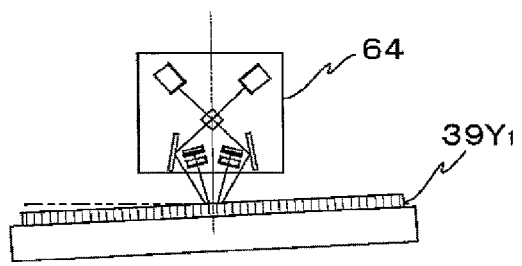

Next, suppose that wafer stage WST rotates around the X-axis from the state shown in FIG. 10B and moves into a state shown in FIG. 10C. In this case, although the head and the scale do not perform relative motion, or more specifically, even though $\Delta Y = \Delta Z=0$, a change occurs in optical path difference $\Delta L$ due to the rotation of wafer stage WST, which changes the measurement value of the encoder. That is, a measurement error occurs in the encoder system due to an inclination (tilt) of wafer stage WST.

Figure 10D:
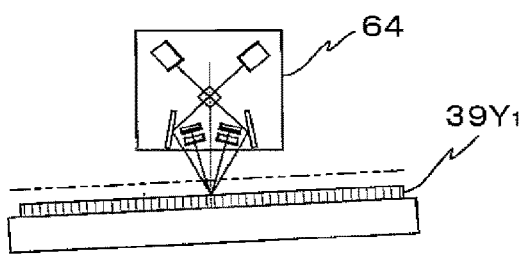

Next, suppose that wafer stage WST moves downward from a state shown in FIG. 10C and moves into a state shown in FIG. 10D. In this case, a change in optical path difference $\Delta L$ does not occur because wafer stage WST does not rotate. However, because the symmetry of formula (8) has been lost, phase difference $\varphi$ changes by Z displacement $\Delta Z$ through the third term on the right-hand side of formula (7). Accordingly, the measurement value of the encoder changes. Incidentally, the measurement value of the encoder in the case of FIG. 10D becomes the same measurement value as the case in FIG. 10A.

According to a result of a simulation that the inventors and the like performed, it became clear that the measurement value of the encoder has sensitivity not only to a positional change of the scale in the Y-axis direction, which is the measurement direction, but also has sensitivity to an attitude change in the $\theta x$ direction (the pitching direction) and the $\theta z$ direction (the yawing direction), and moreover, depends on the positional change in the Z-axis direction in the case such as when the symmetry has been lost as is previously described. That is, the theoretical description previously described agreed with the result of the simulation.

Figure 11A:
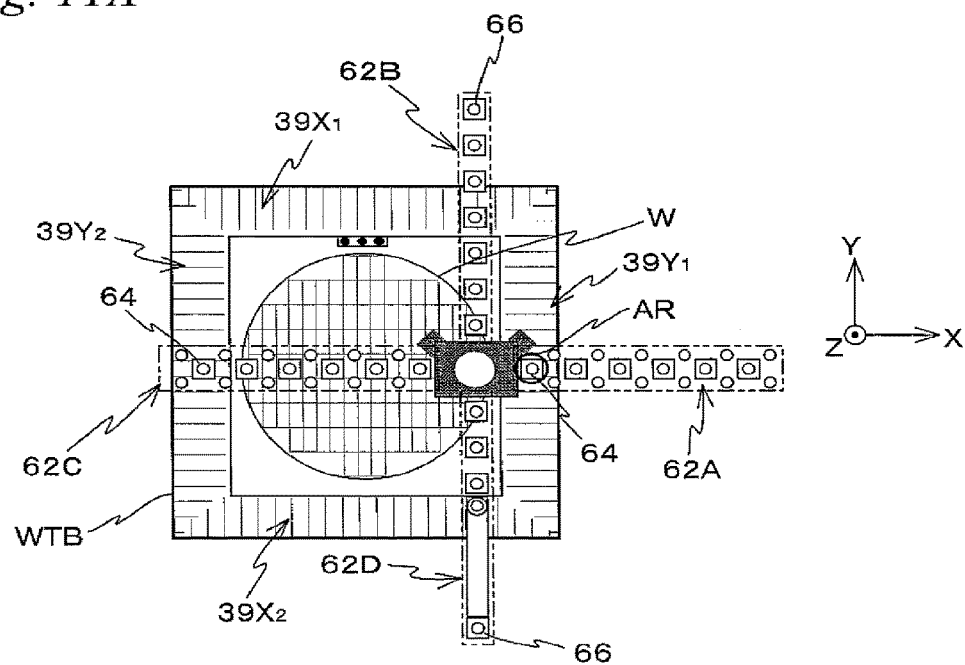
FIGS. 11A and 11B are views for explaining an operation to acquire correction information to correct a measurement error of an encoder (a first encoder) due to the relative movement of the head and the scale in the non-measurement direction.
Figure 11B:
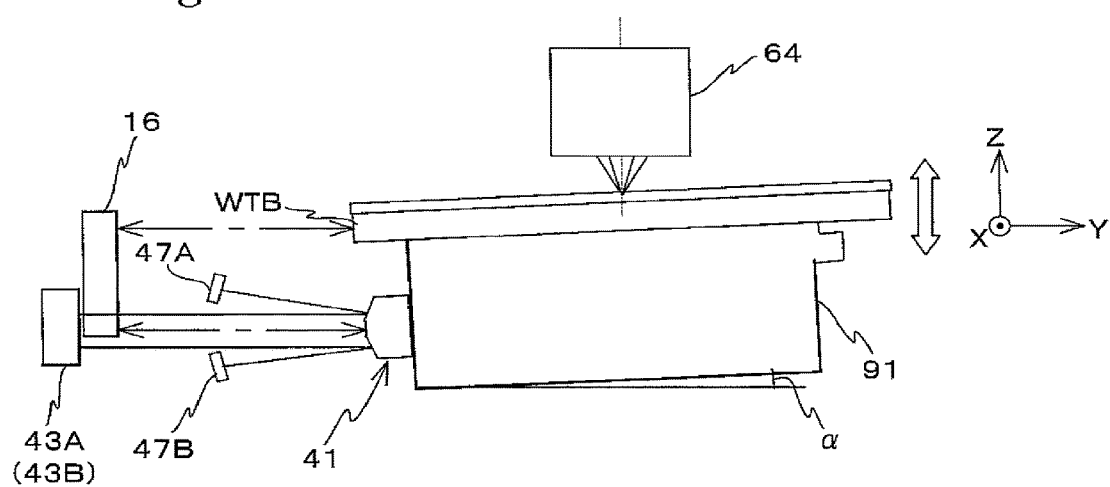

Therefore, in the embodiment, correction information to correct the measurement error of each encoder caused by the relative motion of the head and the scale in the direction besides the measurement direction is acquired as follows.

a. First of all, main controller 20 drives wafer stage WST via stage drive system 124, while monitoring the measurement values of Y interferometer 16 of interferometer system 118, X interferometer 126, and Z interferometers 43A and 43B, and as shown in FIGS. 11A and 11B, makes Y head 64 located farthest to the −X side of head unit 62A face an arbitrary area (an area circled in FIG. 11A) AR of Y scale $39Y_1$ on the upper surface of wafer table WTB.

b. Then, based on the measurement values of Y interferometer 16 and Z interferometers 43A and 43B, main controller 20 drives wafer table WTB (wafer stage WST) so that a rolling amount $\theta y$ and yawing amount $\theta z$ of wafer table WTB (wafer stage WST) both become zero while a pitching amount $\theta x$ also becomes a desired value $\alpha_0$ (in this case, $\alpha_0=200$ μrad), irradiates a detection light on area AR of Y scale $39Y_1$ from head 64 above after the drive, and stores the measurement value which corresponds to a photoelectric conversion signal from head 64 which has received the reflected light in an internal memory.

c. Next, while maintaining the attitude (pitching amount $\theta x=\alpha_0$, yawing amount $\theta z=0$, rolling amount $\theta y=0$) of wafer table WTB (wafer stage WST) based on the measurement values of Y interferometer 16 and Z interferometers 43A and 43B, main controller 20 drives wafer table WTB (wafer stage WST) within a predetermined range, such as, for example, the range of −100 μm to +100 μm in the Z-axis direction as is indicated by an arrow in FIG. 11B, sequentially takes in the measurement values corresponding to the photoelectric conversion signals from head 64 which has received the reflected light at a predetermined sampling interval while irradiating a detection light on area AR of Y scale $39Y_1$ from head 64 during the drive, and stores the values in the internal memory.

d. Next, main controller 20 changes the pitching amount of wafer table WTB (wafer stage WST) to ($\theta x=\alpha_0-\Delta\alpha$), based on the measurement values of Y interferometer 16.

e. Then, as for the attitude after the change, main controller 20 repeats an operation similar to c. described above.

f. Then, main controller 20 alternately repeats the operations of d. and e described above, and for a range where pitching amount $\theta x$ is, for example, −200 μrad<$\theta x$<+200 μrad, takes in the measurement values of head 64 within the Z drive range described above at $\Delta\alpha$(rad), at an interval of, for example, 40 μrad.

g. Next, by plotting each data within the internal memory obtained by the processes b. to e. described above on a two-dimensional coordinate system whose horizontal axis indicates a Z position and vertical axis indicates an encoder count value, sequentially linking plot points where the pitching amounts are the same, and shifting the horizontal axis in the vertical axis direction so that a line (a horizontal line in the center) which indicates a zero pitching amount passes through the origin, main controller 20 can obtain a graph (a graph that shows a change characteristic of the measurement values of the encoder (head) according to the Z leveling of the wafer stage) like the one shown in FIG. 12.

Figure 12:
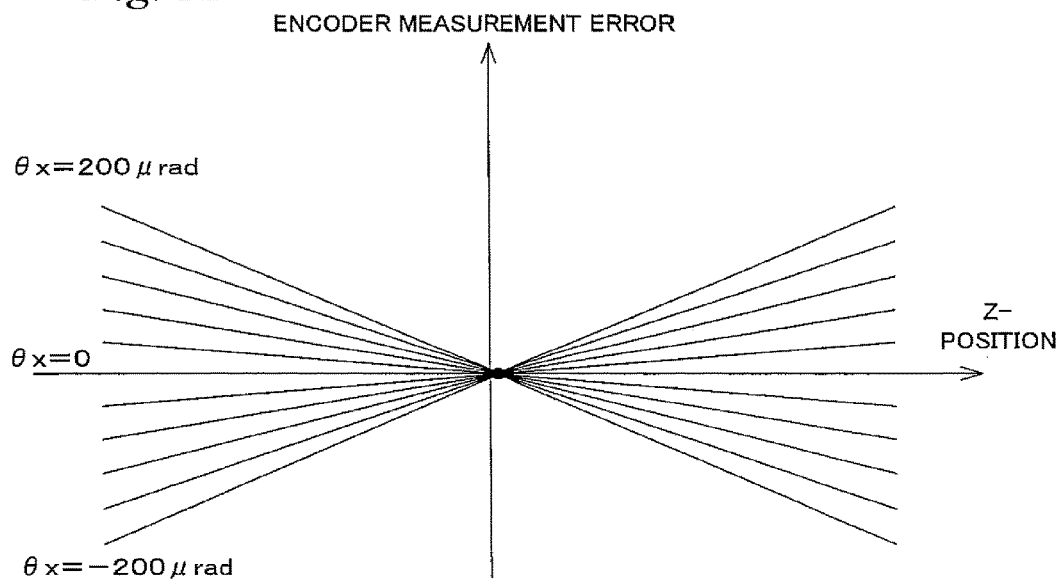
FIG. 12 is a graph showing a measurement error of the encoder with respect to the change in the Z position in pitching amount $θx=α$.
Figure 13:
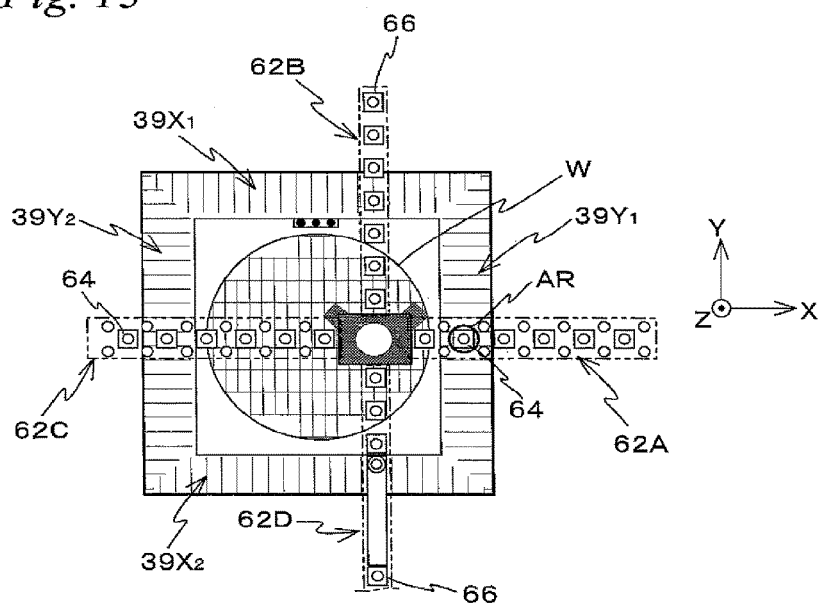
FIG. 13 is a view for explaining an operation to acquire correction information to correct a measurement error of another encoder (a second encoder) due to the relative movement of the head and the scale in the non-measurement direction.

The values of the vertical axis at each point on the graph in FIG. 12 is none other than the measurement error of the encoder in each Z position, in pitching amount θx=α. Therefore, main controller 20 sees pitching amount θx, the Z position, and the encoder measurement error at each point on the graph in FIG. 12 as a table data, and stores the table data in memory 34 (refer to FIG. 6) as stage position induced error correction information. Or main controller 20 sees the measurement error as a function of Z position z and pitching amount θx, and obtains the function computing an undetermined coefficient, for example, by the least-squares method, and stores the function in memory 34 as stage position induced error correction information.

h. Next, main controller 20 drives wafer stage WST in the −X-direction by a predetermined amount via stage drive system 124 while monitoring the measurement values of X interferometer 126 of interferometer system 118, and as shown in FIG. 13, makes Y head 64 located second from the edge on the −X side of head unit 62A (the Y head next to Y head 64 whose data has already been acquired in the process described above) face area AR previously described (the area circled in FIG. 13) of Y scale $39Y_1$ on the upper surface of wafer table WTB.

i. Then, main controller 20 performs a process similar to the ones described above on Y head 64, and stores correction information of Y encoder 70A configured by head 64 and Y scale $39Y_1$ in memory 34.

j. Hereinafter, in a similar manner, main controller 20 respectively obtains correction information of Y encoder 70A configured by each remaining Y head 64 of head unit 62A and Y scale $39Y_1$, correction information of X encoder 70B configured by each X head 66 of head unit 62B and X scale $39X_1$, correction information of Y encoder 70C configured by each X head 64 of head unit 62C and Y scale $39Y_2$, and correction information of X encoder 70D configured by each X head 66 of head unit 62D and X scale $39X_2$, and stores them in memory 34.

In this case, it is important that the same area on X scale $39X_1$ is used on the measurement using each X head 66 of head unit 62B described above, the same area on Y scale $39Y_2$ is used on the measurement using each Y head 64 of head unit 62C, and the same area in X scale $39X_2$ is used on the measurement using each Y head 66 of head unit 62D. The reason for this is because if the correction (including the curve correction of reflection surfaces 17a and 17b, and reflection surfaces 41a, 41b, and 41c) of each interferometer of interferometer system 118 has been completed, the attitude of wafer stage WST can be set to a desired attitude anytime based on the measurement values of the interferometers, and by using the same location of each scale, even if the scale surface is inclined, the measurement error caused by the effect of the inclination does not occur between the heads.

Further, main controller 20 performs the measurement described above for Y heads $64y_1$ and $64y_2$ using the same area on Y scale $39Y_2$ and $39Y_1$, respectively, which is the same as each Y head 64 of head units 62C and 64A described above, obtains correction information of encoder 70C configured by Y head $64y_1$ which faces Y scale $39Y_2$ and correction information of encoder 70A configured by Y head $64y_2$ which faces Y scale $39Y_1$, and stores the information in memory 34.

Next, in a similar procedure as in the case described above where the pitching amount was changed, main controller 20 sequentially changes yawing amount θz of wafer stage WST for a range of −200 μrad<θz<+200 μrad and drives wafer table WTB (wafer stage WST) in the Z-axis direction at each position within a predetermined range, such as, for example, within −100 μm∼+100 μm, while maintaining both the pitching amount and the rolling amount of wafer stage WST at zero, and during the drive, sequentially takes in the measurement values of the head at a predetermined sampling interval and stores them in the internal memory. Such a measurement is performed for all heads 64 or 66, and in a procedure similar to the one described earlier, by plotting each data within the internal memory on the two-dimensional coordinate system whose horizontal axis indicates the Z position and vertical axis indicates the encoder count value, sequentially linking plot points where the yawing amounts are the same, and shifting the horizontal axis so that a line (a horizontal line in the center) which indicates a zero pitching amount passes through the origin, main controller 20 can obtain a graph similar to the one shown in FIG. 12. Then, main controller 20 regards yawing amount θz, Z position, and the measurement error at each point on the obtained graph as a table data, and then stores the data in memory 34 as correction information. Or, main controller 20 sees the measurement error as a function of Z position z and yawing amount θz, and obtains the function computing an undetermined coefficient, for example, by the least-squares method, and stores the function in memory 34 as correction information.

In this case, the measurement error of each encoder in the case both the pitching amount and the yawing amount of wafer stage WST are not zero when wafer stage WST is at Z position z can safely be considered to be a simple sum of the measurement error that corresponds to the pitching amount described above and the measurement error that corresponds to the yawing amount (a linear sum) when wafer stage WST is at Z position z. The reason for this is, as a result of simulation, it has been confirmed that the measurement error (count value) linearly changes according to the change of the Z position, even when the yawing is changed.

Hereinafter, to simplify the description, a function of pitching amount θx, yawing amount θz, and Z position z of wafer stage WST that expresses a measurement error Δy as shown in the next formula (10) is to be obtained for the Y heads of each Y encoder, and to be stored in memory 34. Further, a function of rolling amount θy, yawing amount θz, and Z position z of wafer stage WST that expresses a measurement error Δx as shown in the next formula (11) is to be obtained for the X heads of each X encoder, and to be stored in memory 34.

$$\Delta y = f(z, \theta x, \theta z) = \theta x(z-a) + \theta z(z-b) \quad (10)$$

$$\Delta x = g(z, \theta y, \theta z) = \theta y(z-c) + \theta z(z-d) \quad (11)$$

In formula (10) above, a is a Z-coordinate of a point where each straight line intersects on the graph in FIG. 12, and b is a Z-coordinate of a point where each straight line intersects on a graph similar to FIG. 12 in the case when the yawing amount is changed so as to acquire the correction information of the Y encoder. Further, in formula (11) above, c is a Z-coordinate of a point where each straight line intersects on a graph similar to FIG. 12 in the case when the rolling amount is changed so as to acquire the correction information of the X encoder, and d is a Z-coordinate of a point where each straight line intersects on a graph similar to FIG. 12 in the case when the yawing amount is changed so as to acquire the correction information of the X encoder.

Incidentally, because Δy and Δx described above show the degree of influence of the position of wafer stage WST in the direction besides the measurement direction (e. g. the θx direction or the θy direction, the θz direction and the Z-axis direction) on the measurement values of the Y encoder or the X encoder, in the present specification, it will be referred to as a stage position induced error, and because the stage position induced error can be used as it is as correction information, the correction information is referred to as stage position induced error correction information.

Next, a calibration process of a head position (measurement beam position) for acquiring a position coordinate of each head (or to be more precise, the measurement beam emitted from each head) in the XY plane, especially the position coordinate in the direction besides the measurement direction, which becomes a premise in processes such as a process to convert the measurement value of an encoder to be described later into positional information of wafer stage WST in the XY plane and a linkage process among a plurality of encoders, will be described. In this case, as an example, a calibration process of the position coordinate in the direction besides the measurement direction (the X-axis direction) orthogonal to the measurement direction of the measurement beam emitted from Y head 64 configuring each head unit 62A and 62C will be described.

First of all, on starting this calibration processing, main controller 20 drives wafer stage WST and moves Y scales 39$Y_1$ and 39$Y_2$ so that Y scales 39$Y_1$ and 39$Y_2$ are located under head units 62A and 62C, respectively. For example, as shown in FIG. 14, Y head 64$_{A3}$, which is the third head from the left of head unit 62A, and Y head 64$_{C5}$, which is the second head from the right of head unit 62C, are made to face Y scales 39$Y_1$ and 39$Y_2$, respectively.

Figure 14:
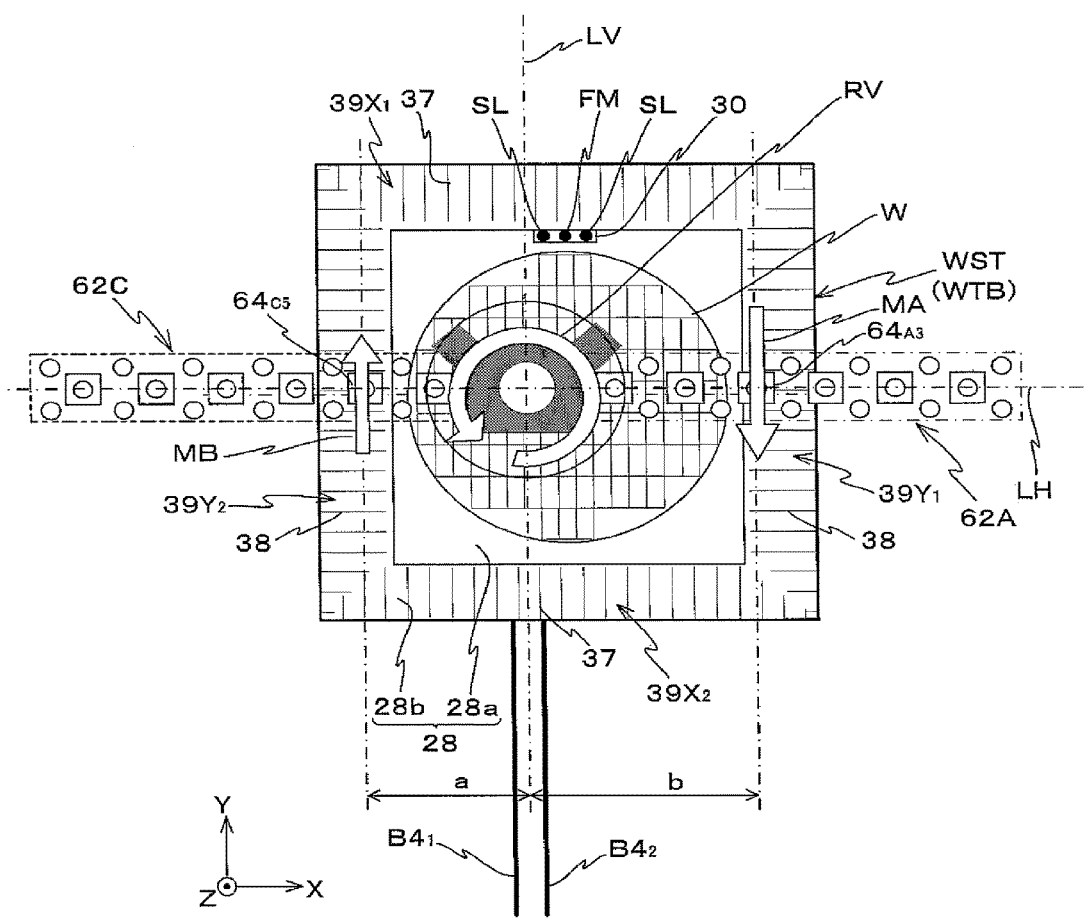
FIG. 14 is a view for describing a calibration process of a head position.

Next, based on the measurement values of measurement beams B4$_1$ and B4$_2$ of Y interferometer 16, or the measurement values of Z interferometers 43A and 43B, main controller 20 rotates wafer stage WST only by a predetermined angle (the angle being θ) within the XY plane with optical axis AX of projection optical system PL serving as a center as shown by an arrow RV in FIG. 14, and acquires the measurement values of Y heads 64$_{A3}$ and 64$_{C5}$ (encoders 70A and 70C), which can be obtained during the rotation. In FIG. 14, vectors MA and MB, which correspond to the measurement values measured during the rotation of wafer stage WST by Y heads 64$_{A3}$ and 64$_{C5}$, are respectively shown.

In this case, because θ is a very small angle, MA=b/θ and MB=α/θ are valid, and a ratio MA/MB of the magnitude of vectors MA and MB are equal to a ratio a/b, which is a ratio of the distance from the rotation center to the irradiation point (also referred to as a detection point of the encoder of the head) of each measurement beam emitted from Y heads 64$_{A3}$ and 64$_{C5}$, respectively.

Therefore, main controller 20 computes distances b and a, or more specifically, the X-coordinate values of the irradiation points of the measurement beams emitted from Y heads 64$_{A3}$ and 64$_{C5}$, based on predetermined angle θ obtained from the measurement values of encoders 70A and 70C and the measurement values of interferometer beams B4$_1$ and B4$_2$, respectively, or, furthermore performs a calculation based on the X-coordinate values that have been computed, and computes the positional shift amount (more specifically, correction information of the positional shift amount) of the irradiation points of the measurement beams emitted from Y heads 64$_{A3}$ and 64$_{C5}$, respectively, in the X-axis direction with respect to the design position.

Further, in the case wafer stage WST is located at the position shown in FIG. 14, in actual practice, head units 62B and 62D face X scales 39$X_1$ and 39$X_2$, respectively. Accordingly, on the rotation of wafer stage WST described above, main controller 20 simultaneously acquires the measurement values of each X head 66 (encoders 70B and 70D) of head units 62B and 62D that respectively face X scales 39$X_1$ and 39$X_2$. Then, in a manner similar to the description above, main controller 20 computes the Y-coordinate values of the irradiation point of the measurement beams emitted from X head 66, respectively, which each face X scale 39$X_1$ and 39$X_2$, or, furthermore performs a calculation based on the computation results, and computes the positional shift amount (more specifically, correction information of the positional shift amount) of the irradiation point of the measurement beams emitted from the respective X heads in the Y-axis direction with respect to the design position.

Next, main controller 20 moves wafer stage WST in the X-axis direction at a predetermined pitch, and by performing a processing similar to the procedure described above at each positioning position, main controller 20 can obtain the X-coordinate values of the irradiation point of the measurement beams emitted from the heads, or the positional shift amount (more specifically, correction information of the positional shift amount) in the X-axis direction with respect to the design position also for the remaining Y heads of head units 62A and 62C.

Further by moving in the Y-axis direction at a predetermined pitch from the position shown in FIG. 14 and performing a processing similar to the procedure described above at each positioning position, main controller 20 can obtain the Y-coordinate values of the irradiation point of the measurement beams emitted from the heads or the positional shift amount (more specifically, correction information of the positional shift amount) in the Y-axis direction with respect to the design position, also for the remaining X heads of head units 62B and 62D.

Further, in a method similar to Y head 64 described above, main controller 20 acquires the X-coordinate values of the irradiation point of the measurement beam emitted from the heads or the positional shift amount (more specifically, correction information of the positional shift amount) in the X-axis direction with respect to the design position, also for Y heads 64$y_1$ and $y_2$.

In the manner described above, main controller 20 can acquire the X-coordinate values of the irradiation point of the measurement beam emitted from the heads or the positional shift amount (more specifically, correction information of the positional shift amount) in the X-axis direction with respect to the design position for all Y heads 64, 64$y_1$, and 64$y_2$, and the Y-coordinate values of the irradiation point of the measurement beam emitted from the heads or the positional shift amount (more specifically, correction information of the positional shift amount) in the Y-axis direction with respect to the design position also for all X heads 66, therefore, the information that has been acquired is stored in a storage unit, such as, for example, memory 34. The X-coordinate values or the Y coordinate values of the irradiation point of the measurement beam of each head or the positional shift amount in the X-axis direction or the Y-axis direction with respect to the design position of each head stored in memory 34, will be used such as when converting the measurement values of an encoder into positional information within the XY plane of wafer stage WST, as it will be described later on. Incidentally, on converting the measurement values of an encoder into positional information within the XY plane of wafer stage WST or the like described later on, design values are used for the Y coordinate values of the irradiation point of the measurement beam of each Y head, and the X-coordinate values of the irradiation point of the measurement beam of each X head. This is because since the influence that the position coordinates of each head in the measurement direction has on the control accuracy of the position of wafer stage WST is extremely weak, (the effectiveness to the control accuracy is extremely slow), it is sufficient enough to use the design values.

Now, in the case the optical axis of the heads of the encoder substantially coincides with the Z-axis, and the pitching amount, rolling amount, and yawing amount of wafer stage WST are all zero, as it is obvious from formulas (10) and (11) above, measurement errors of the encoder described above due to the attitude of wafer table WTB are not supposed to occur, however, even in such a case, the measurement errors of the encoder are not actually zero. This is because the surface of Y scales $39Y_1$ and $39Y_2$, and X scales $39X_1$ and $39X_2$ (the surface of the second water repellent plate $28b$) is not an ideal plane, and is somewhat uneven. When the surface of the scale (to be more precise, the diffraction grating surface, and including the surface of a cover glass in the case the diffraction grating is covered with the cover glass) is uneven, the scale surface will be displaced in the Z-axis direction (move vertically), or be inclined with respect to the heads of the encoder even in the case when wafer stage WST moves along a surface parallel to the XY plane. This consequently means none other that a relative motion occurs in a direction besides the measurement direction between the head and the scale, and as it has already been described, such a relative motion becomes a cause of the measurement error.

Figure 15:
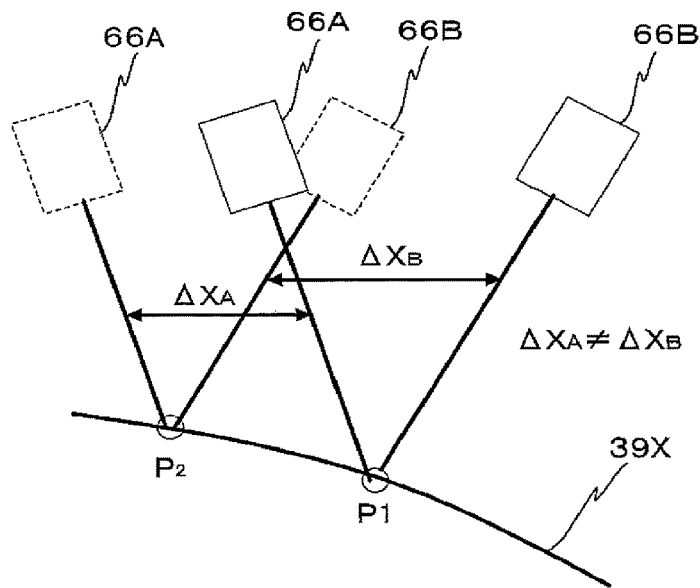
FIG. 15 is a view for explaining an inconvenience that occurs in the case a plurality of measurement points on the same scale is measured by a plurality of heads.

Further, as shown in FIG. 15, for example, in the case of measuring a plurality of measurement points $P_1$ and $P_2$ on the same scale 39X using a plurality of heads 66A and 66B, when the tilt of the optical axis of the plurality of heads 66A and 66B is different and there is also an unevenness (including inclination) to the surface of scale $39_X$, as is obvious from $\Delta X_A \neq \Delta X_B$ shown in FIG. 15, the influence that the unevenness has on the measurement values will differ for each head depending on the tilt difference. Accordingly, in order to remove such difference in the influence, it will be necessary to obtain the unevenness of the surface of scale 39X. The unevenness of the surface of scale 39X may be measured, for example, using a measurement unit besides the encoder such as the Z sensor previously described, however, in such a case, because the measurement accuracy of the unevenness is set according to the measurement resolution of the measurement unit, in order to measure the unevenness with high precision, a possibility may occur of having to use a sensor that has a higher precision and is more costly than the sensor necessary to fulfill the original purpose as a Z sensor.

Therefore, in the embodiment, a method of measuring the unevenness of the surface of a scale using the encoder system itself is employed. Following is a description of the method.

As shown in a graph (an error characteristics curve) of FIG. 12, which shows a change characteristic of the measurement values of the encoder (a head) corresponding to the Z leveling of wafer stage WST previously described, only one point can be found in the Z-axis direction for each encoder head where the head has no sensibility to the tilt operation of wafer stage WST, or more specifically, a singular point where the measurement error of the encoder becomes zero regardless of the angle of inclination of wafer stage WST to the XY plane. If this point can be found by moving wafer stage WST similarly as when acquiring the stage position induced error correction information previously described, the point (a Z position) can be positioned the singular point with respect to the encoder head. If such operation to find the singular point is performed on a plurality of measurement points on the scale, the shape (unevenness) of the surface of the scale can be obtained.

Figure 16:
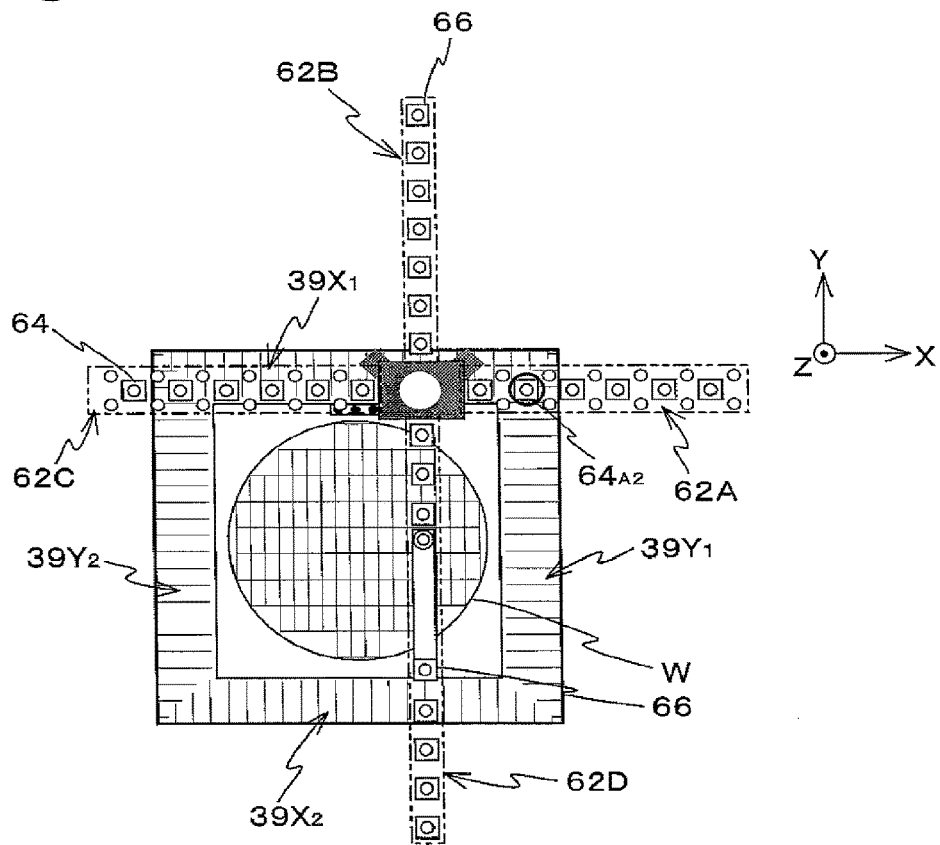
FIG. 16 is a view for explaining a method to measure the unevenness of the scale (No. 1)

(a) Therefore main controller 20 first of all drives wafer stage WST via stage drive system 124, while monitoring the measurement values of Y interferometer 16 of interferometer system 118, X interferometer 126, and Z interferometers 43A and 43B, and as shown in FIG. 16, makes an arbitrary Y head of head unit 62A, such as for example, Y head $64_{A2}$ in FIG. 16, face the vicinity of the end section of Y scale $39Y_1$ on the +Y side. Then, main controller 20 changes the pitching amount (θx rotation quantity) of wafer stage WST at the position in at least two stages as is previously described, and in a state where the attitude of wafer stage WST at the time of change is maintained for every change, main controller 20 scans (moves) wafer stage WST in the Z-axis direction in a predetermined stroke range while irradiating a detection light on a point of Y scale $39Y_1$ subject to measurement from Y head $64_{A2}$, and samples the measurement results of Y head $64_{A2}$ (encoder 70A) that faces Y scale $39Y_1$ during the scan (movement). Incidentally, the sampling above is performed while maintaining the yawing amount (and rolling amount) of wafer stage WST at zero.

Then, by performing a predetermined operation based on the sampling results, main controller 20 obtains an error characteristics curve (refer to FIG. 12) at the point described above subject to the measurement of encoder 70A corresponding to the Z position of wafer stage WST for a plurality of attitudes, and sets the intersecting point of the plurality of error characteristics curves, or more specifically, sets the point where the measurement error of encoder 70A above becomes zero regardless of the angle of inclination of wafer stage WST with respect to the XY plane as the singular point at the measurement point, and obtains Z positional information $z_1$ (refer to FIG. 17A) of the singular point.

(b) Next, main controller 20 steps wafer stage WST in the +Y direction by a predetermined amount via stage drive system 124 while maintaining the pitching amount and rolling amount of wafer stage WST at zero, while monitoring the measurement values of Y interferometer 16 of interferometer system 118, X interferometer 126, and Z interferometers 43A and 43B. This step movement is performed at a speed slow enough so that measurement errors caused by air fluctuation of the interferometers can be ignored.

(c) Then, at a position after the step movement, as in (a) above, main controller 20 obtains a Z positional information $z_p$ (in this case, p=2) of the singular point of encoder 70A above at the position.

After this operation, by repeating the operations similar to the ones described in (b) and (c) above, main controller 20 obtains a Z positional information $z_p$ (p=2,3, . . . , i, . . . k, . . . n) in a plurality of (e. g. n–1) measurement points set at a predetermined interval in the Y-axis direction on scale $39Y_1$.

Figure 17A:
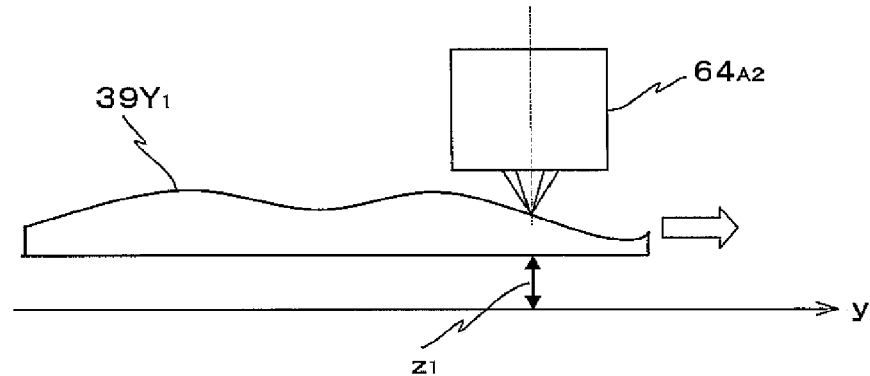
FIGS. 17A to 17D are views for explaining a method to measure the unevenness of the scale (No. 2)
Figure 17B:
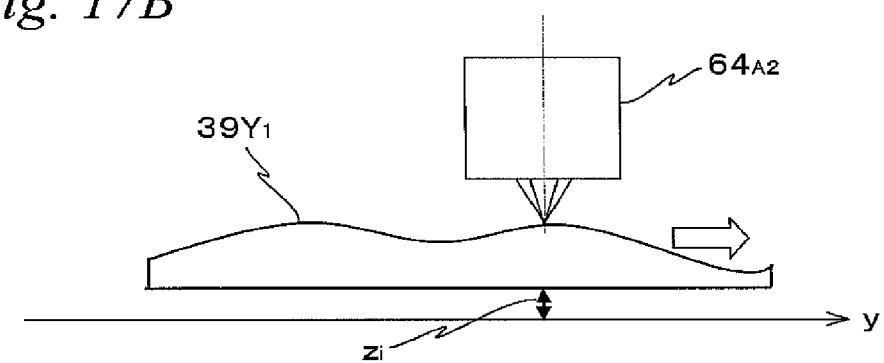
Figure 17C:
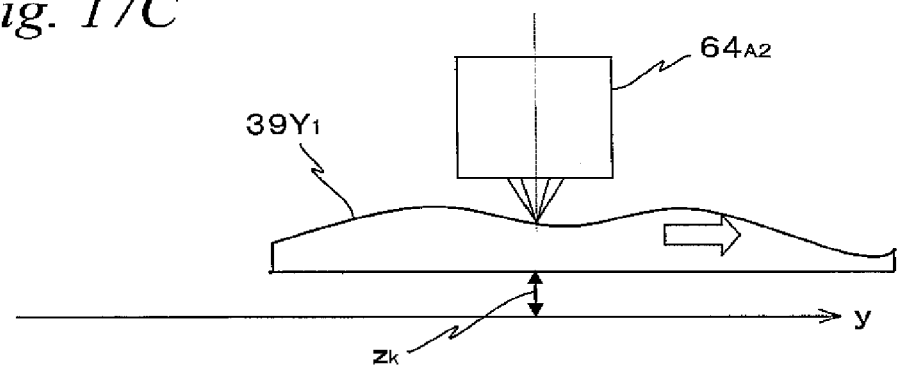

FIG. 17B shows a z positional information $z_i$ of the singular point at the $i^{th}$ measurement point that was obtained in the manner described above, and FIG. 17C shows a z positional information $z_k$ of the singular point at the $k^{th}$ measurement point.

Figure 17D:
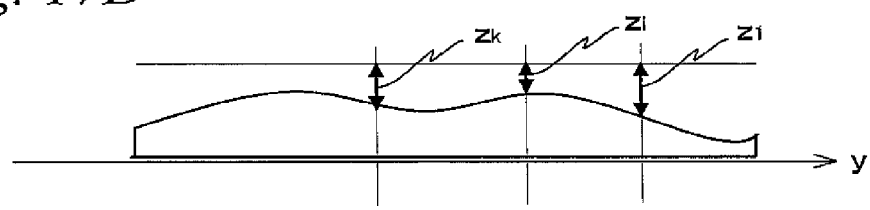

(d) Then, based on Z positional information $z_1, z_2, \ldots z_n$ of the singular point obtained for each of the plurality of measurement points above, main controller 20 obtains the unevenness of the surface of scale $39Y_1$. As shown in FIG. 17D, if one end of a double-sided arrow showing Z position $z_p$ of the singular point in each measurement point on scale $39Y_1$ is made to coincide with a predetermined reference line, the curve which links the other end of each double-sided arrow indicates the shape of the surface (unevenness) of scale $39Y_1$. Accordingly, main controller 20 obtains function $z=f_1(y)$ that expresses this unevenness by performing curve fitting (a least square approximation) on the point at the other end of each double-sided arrow, and is stored in memory 34. Incidentally, y is a Y-coordinate of wafer stage WST measured with Y interferometer 16.

(e) In a similar manner described above, main controller 20 obtains function $z=f_2(y)$ that expresses the unevenness of Y scale $39Y_2$, function $z=g_1(x)$ that expresses the unevenness of X scale $39X_1$, and, function $z=g_2(x)$ that expresses the unevenness of X scale $39X_2$, respectively, and stores them in memory 34. Incidentally, x is an X-coordinate of wafer stage WST measured with X interferometer 126.

In this case, at each measurement point on each scale, when an error characteristics curve whose measurement error always becomes zero is obtained regardless of the change of Z in the case of obtaining the error characteristics curve (refer to FIG. 12) described above, the pitching amount (or rolling amount) of wafer stage WST at the point when the error characteristics curve was obtained corresponds to an inclined quantity of the scale surface at the measurement point. Accordingly, in the method above, information on inclination at each measurement point can also be obtained, in addition to the height information of the scale surface. This arrangement allows fitting with higher precision when the curve fitting described above is performed.

Now, the scale of the encoder lacks in mechanical long-term stability, such as in the diffraction grating deforming due to thermal expansion or other factors by the passage of use time, or the pitch of the diffraction grating changing partially or entirely. Therefore, because the errors included in the measurement values grow larger with the passage of use time, it becomes necessary to correct the errors. Hereinafter, an acquisition operation of correction information of the grating pitch and of correction information of the grating deformation performed in exposure apparatus 100 of the embodiment will be described, based on FIG. 18

Figure 18:
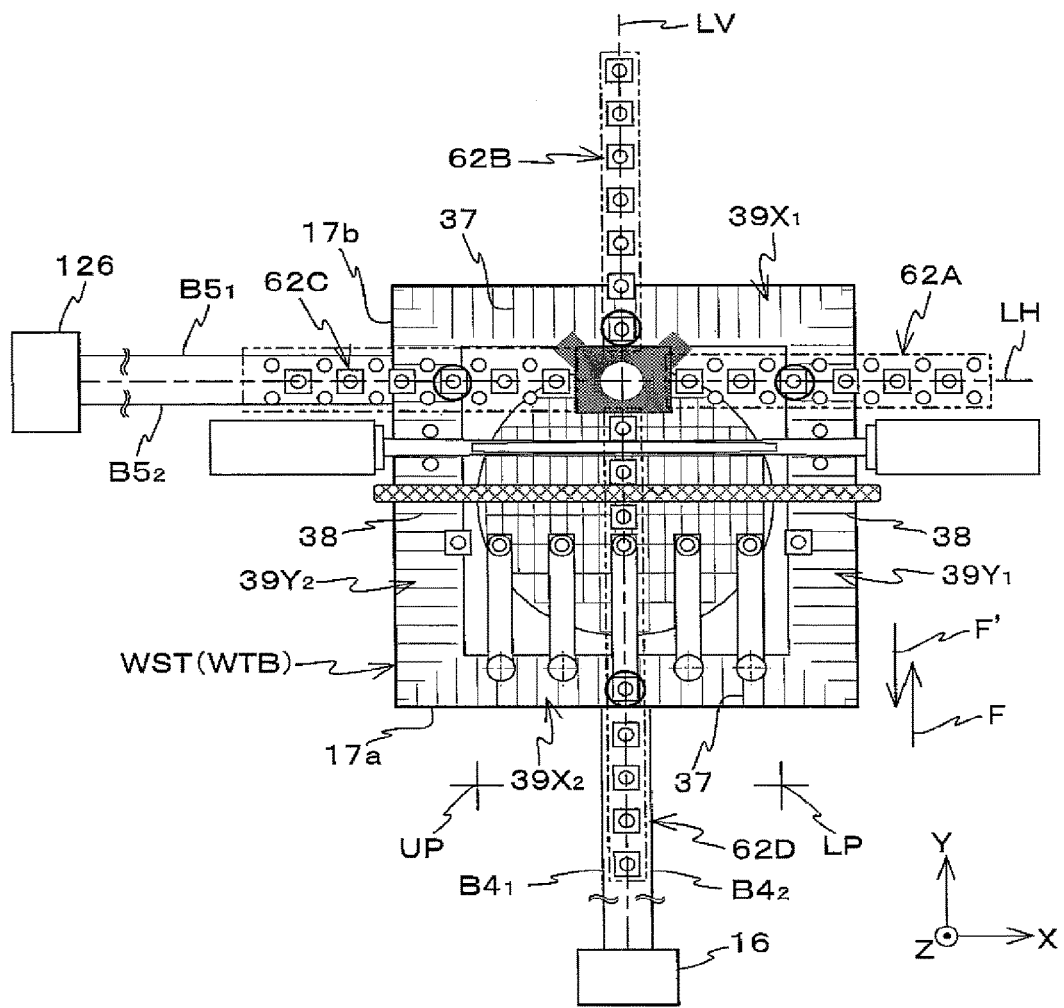
FIG. 18 is a view for describing an acquisition operation of correction information of the grating pitch of the scale and the correction information of the grating deformation.

In FIG. 18, measurement beams $B4_1$ and $B4_2$ are arranged symmetric to straight line LV previously described, and the substantial measurement axis of Y interferometer 16 coincides with straight line LV, which passes through the optical axis of projection optical system. PL and is parallel to the Y-axis direction. Therefore, according to Y interferometer 16, the Y position of wafer table WTB can be measured without Abbe error. Similarly, measurement beams $B5_1$ and $B5_2$ are arranged symmetric to straight line LH previously described, and the substantial measurement axis of X interferometer 126 coincides with straight line LH, which passes through the optical axis of projection optical system PL and is parallel to the X-axis direction. Therefore, according to X interferometer 126, the X position of wafer table WTB can be measured without Abbe error.

First of all, an acquisition operation of correction information of the deformation (warp of the grid line) of the grid line of the X scale, and correction information of the grating pitch of the Y scale will be described. In this case, to simplify the description, reflection surface 17b is to be an ideal plane. Further, prior to this acquisition operation, a measurement of the unevenness information of the surface of each scale described above is performed, and function $z=f_1(y)$ that expresses the unevenness of Y scale $39Y_1$, function $z=f_2(y)$ that expresses the unevenness of Y scale $39Y_2$, function $z=g_1(x)$ that expresses the unevenness of X scale $39X_1$, and function $z=g_2(x)$ that expresses the unevenness of X scale $39X_2$, are to be stored in memory 34.

First of all, main controller 20 reads function $z=f_1(y)$, function $z=f_2(y)$, function $z=g_1(x)$ and function $z=g_2(x)$ stored in memory 34 into the internal memory.

Next, at a speed low enough so that the short-term variation of the measurement values of Y interferometer 16 can be ignored and also in a state where the measurement value of X interferometer 126 is fixed to a predetermined value, main controller 20 moves wafer stage WST based on the measurement values of Y interferometer 16, and Z interferometers 43A and 43B, for example, in at least one direction of the +Y direction and the −Y-direction with in the effective stroke range mentioned earlier as is indicated by arrow F and F' in FIG. 18, in a state where the pitching amount, the rolling amount, and the yawing amount are all maintained at zero. During this movement, while correcting the measurement values (the output) of Y linear encoders 70A and 70C using the function $z=f_1(y)$ and function $z=f_2(y)$ described above, respectively, main controller 20 takes in the measurement values after the correction and the measurement values (or to be more precise, measurement values of measurement beams $B4_1$ and $B4_2$) of Y interferometer 16 at a predetermined sampling interval, and based on each measurement value that has been taken in, obtains a relation between the measurement values of Y linear encoders 70A and 70C (output of encoder 70A—the measurement values corresponding to function $f_1(y)$, output of encoder 70C—the measurement values corresponding to function $f_2(y)$) and the measurement values of Y interferometer 16. More specifically, in the manner described above, main controller 20 obtains a grating pitch (the distance between adjacent grid lines) of Y scales $39Y_1$ and $39Y_2$ which are sequentially placed opposing head units 62A and 62C with the movement of wafer stage WST and correction information of the grating pitch. As the correction information of the grating pitch, for example, in the case a horizontal axis shows the measurement values of the interferometer and a vertical axis shows the measurement values (the measurement values whose errors due to the unevenness of the scale surface has been corrected) of the encoder, a correction map which shows the relation between the two using a curve can be obtained. Because the measurement values of Y interferometer 16 in this case are obtained when wafer stage WST was scanned at an extremely low speed as was previously described, the measurement values hardly include any short-term variation errors due to air fluctuation, as well as long-term variation errors, and it can be said that the measurement values are accurate values in which the errors can be ignored.

Further, during the movement of wafer stage WST described above, by statistically processing the measurement values (the measurement values of X linear encoders 70B and 70D) obtained from a plurality of X heads 66 of head units 62B and 62D placed sequentially opposing X scales $39X_1$ and $39X_2$ with the movement, such as, for example, averaging (or performing weighted averaging), main controller 20 also obtains correction information of the deformation (warp) of grid lines 37 which sequentially face the plurality of X heads 66. This is because in the case reflection surface 17b is an ideal plane, the same blurring pattern should appear repeatedly in the process when wafer stage WST is sent in the +Y direction or the −Y-direction, therefore, if averaging or the like is performed on the measurement data acquired with the plurality of X heads 66, it becomes possible to precisely obtain correction information of the deformation (warp) of grid lines 37 which sequentially face the plurality of X head 66.

Incidentally, in a normal case where reflection surface 17b is not an ideal plane, by measuring the unevenness (warp) of the reflection surface and obtaining the correction data of the warp in advance and performing movement of wafer stage WST in the +Y direction or the −Y-direction while controlling the X position of wafer stage WST, based on the correction data instead of fixing the measurement value of X interferometer 126 to the predetermined value on the movement of wafer stage WST in the +Y direction or the −Y-direction described above, wafer stage WST can be made to move precisely in the Y-axis direction. In this manner, the same correction information of the grating pitch of the Y scale and the correction information of the deformation (warp) of grid lines 37 can be obtained as in the description above. Incidentally, the measurement data acquired with the plurality of X heads 66 described above is a plurality of data at different location references of reflection surface 17b, and because X heads 66 measure deformation (warp) of the same grid line 37, there is a collateral effect of the warp correction residual of the reflection surface being averaged and approaching its true value (in other words, by averaging the measurement data (warp information of grid line 37) acquired by the plurality of X heads, the effect of the warp residual can be weakened) by the averaging or the like described above.

Next, acquisition operations of correction information of deformation (warp of the grid lines) of the grid lines of the Y scale and correction information of the grating pitch of the X scale will be described. In this case, to simplify the description, reflection surface 17a is to be an ideal plane. In this case, a processing as in the case of the correction described above, but with the X-axis direction and the Y-axis direction interchanged, should be performed.

More specifically, at a speed low enough so that the short-term variation of the measurement values of X interferometer 126 can be ignored and also in a state where the measurement value of Y interferometer 16 is fixed to a predetermined value, main controller 20 moves wafer stage WST based on the measurement values of Y interferometer 16, and Z interferometers 43A and 43B, for example, in at least one direction of the +X direction and the −X-direction with in the effective stroke range mentioned earlier, in a state where the pitching amount, the rolling amount, and the yawing amount are all maintained at zero. During this movement, while correcting the measurement values of X linear encoders 70B and of 70D using the function $z=g_1(x)$ and function $z=g_2(x)$ described above, respectively, main controller 20 takes in the measurement values after the correction and the measurement values of X interferometer 126 at a predetermined sampling interval, and based on each measurement value that has been taken in, obtains a relation between the measurement values of X linear encoders 70B and 70D (output of encoder 70B—the measurement values corresponding to function $g_1(x)$, output of encoder 70D—the measurement values corresponding to function $g_2(x)$) and the measurement values of X interferometer 126. More specifically, in the manner described above, main controller 20 obtains a grating pitch (the distance between adjacent grid lines) of X scales $39X_1$ and $39X_2$ which are sequentially placed opposing head units 62B and 62D with the movement of wafer stage WST and the correction information of the grating pitch. As the correction information of the grating pitch, for example, in the case a horizontal axis shows the measurement values of the interferometer and a vertical axis shows the measurement values (the measurement values whose errors due to the unevenness of the scale surface has been corrected) of the encoder, a map which shows the relation between the two using a curve can be obtained. Because the measurement values of X interferometer 126 in this case are obtained when wafer stage WST was scanned at an extremely low speed as was previously described, the measurement values hardly include any short-term variation errors due to air fluctuation, as well as long-term variation errors, and it can be said that the measurement values are accurate values in which the errors can be ignored.

Further, during the movement of wafer stage WST described above, by statistically processing the measurement values (the measurement values of Y linear encoders 70A and 70C) obtained from a plurality of Y heads 64 of head units 62A and 62C placed sequentially opposing Y scales $39Y_1$ and $39Y_2$ with the movement, such as, for example, averaging (or performing weighted averaging), main controller 20 also obtains correction information of the deformation (warp) of grid lines 38 which sequentially face the plurality of Y heads 64. This is because in the case reflection surface 17a is an ideal plane, the same blurring pattern should appear repeatedly in the process when wafer stage WST is sent in the +X direction or the −X-direction, therefore, if averaging or the like is performed on the measurement data acquired with the plurality of Y heads 64, it becomes possible to precisely obtain correction information of the deformation (warp) of grid lines 38 which sequentially face the plurality of Y head 64.

Incidentally, in a normal case where reflection surface 17a is not an ideal plane, by measuring the unevenness (warp) of the reflection surface and obtaining the correction data of the warp in advance and performing movement of wafer stage WST in the +X direction or the −X direction while controlling the Y position of wafer stage WST, based on the correction data instead of fixing the measurement value of Y interferometer 16 to the predetermined value on the movement of wafer stage WST in the +X direction or the −X direction described above, wafer stage WST can be made to move precisely in the Y-axis direction. In this manner, the same correction information of the grating pitch of the X scale and the correction information of the deformation (warp) of grid lines 38 can be obtained as in the description above.

As is described above, main controller 20 obtains correction information on grating pitch of the Y scales and correction information on deformation (warp) of grating lines 37, and correction information on grating pitch of the X scales and correction information on deformation (warp) of grating lines 38 at each predetermined timing, for example, with respect to each lot, or the like.

And, during processing of the lot, main controller 20 performs movement control of wafer stage WST in the Y-axis direction, using Y scales $39Y_1$ and $39Y_2$ and head units 62A and 62C, or more specifically, using Y linear encoders 70A and 70C, while correcting the measurement values obtained from head units 62A and 62C (more specifically, the measurement values of encoders 70A and 70C), based on correction information of the grating pitch and correction information of the deformation (warp) of grid line 38 referred to above and stage position induced error correction information corresponding to Z position z of wafer stage WST measured by interferometer system 118, pitching amount θx, and yawing amount θz. By this operation, it becomes possible for main controller 20 to perform movement control of wafer stage WST in the Y-axis direction with good precision using Y linear encoders 70A and 70C, without being affected by temporal change of the grating pitch of the Y scale and the warp of each grating (line) that make up the Y scale, and also without being affected by the change of position of wafer stage WST in a direction besides the measurement direction (relative motion between the head and the scale in a direction besides the measurement direction).

And, during processing of the lot, main controller 20 performs movement control of wafer stage WST in the X-axis direction, using X scales 39X$_1$ and 39X$_2$ and head units 62B and 62D, or more specifically, using X linear encoders 70B and 70D, while correcting the measurement values obtained from head units 62B and 62D (more specifically, the measurement values of encoders 70B and 70D), based on correction information of the grating pitch and correction information of the deformation (warp) of grid line 37 referred to above and stage position induced error correction information corresponding to Z position z of wafer stage WST measured by interferometer system 118, rolling amount θy, and yawing amount θz. By this operation, it becomes possible for main controller 20 to perform movement control of wafer stage WST in the X-axis direction with good precision using X linear encoders 70B and 70D, without being affected by temporal change of the grating pitch of the X scale and the warp of each grating (line) that make up the X scale, and also without being affected by the change of position of wafer stage WST in a direction besides the measurement direction (relative motion between the head and the scale in a direction besides the measurement direction).

Incidentally, in the description above, the case has been described where the correction information of the grating pitch and the grid line warp was acquired for both the Y scale and the X scale, however, the present invention is not limited to this, and the correction information of the grating pitch and the grid line warp can be acquired only for either the Y scale or the X scale, or the correction information of only either the grating pitch or the grid line warp can be acquired for both the Y scale and the X scale. For example, in the case where only the acquisition of the correction information of the warp of grid line 37 of the X scale is performed, wafer stage WST can be moved in the Y-axis direction based on the measurement values of Y linear encoders 70A and 70C, without necessarily using Y interferometer 16. Similarly, in the case where only the acquisition of the correction information of the warp of grid line 38 of the Y scale is performed, wafer stage WST can be moved in the X-axis direction based on the measurement values of X linear encoders 70B and 70D, without necessarily using X interferometer 126. Further, either one of the stage position induced error previously described or the measurement error (hereinafter also referred to as a scale induced error) of the encoder which occurs due to the scale (for example, degree of flatness of the grating surface (surface smoothness) and/or grating formation error (including pitch error, grid line warp and the like) can be compensated.

Next, a switching process of the encoder used for position control of wafer stage WST in the XY plane that is executed during the actual processing or the like, or more specifically, a linkage process between a plurality of encoders will be described, after processing such as the acquisition of the stage position induced error correction information, unevenness measurement of the surface of the scale, and the acquisition of correction information of the grating pitch of the scale and the correction information of the grating deformation and the like are performed in advance.

In this case, first of all, prior to describing the linkage process of the plurality of encoders, a concrete method of converting the corrected measurement values of the encoder into the position of wafer stage WST, which is the premise, will be described, using FIGS. 19A and 19B. In this case, in order to simplify the description, the degrees of freedom of wafer stage WST is to be three degrees of freedom (X, Y, and θz).

Figure 19A:
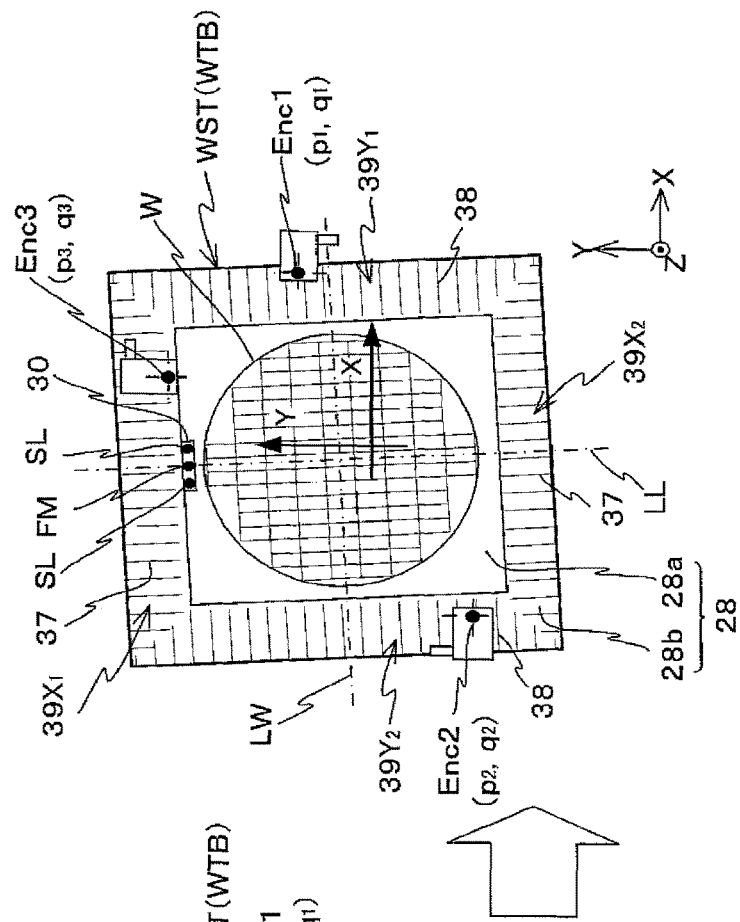
FIGS. 19A and 19B are views for explaining a concrete method to convert a measurement value of the encoder that has been corrected into a position of wafer stage WST.

FIG. 19A shows a reference state where wafer stage WST is at the origin of coordinates (X, Y, θz)=(0,0,0). From this reference state, wafer stage WST is driven in a range where encoders (Y heads) Enc1 and Enc2 and encoder (X head) Enc3 do not move away from the scanning areas of their opposing scales 39Y$_1$, 39Y$_2$ and 39X$_1$. The state where wafer stage WST is moved to position (X, Y, θz) in the manner described above is shown in FIG. 19B.

Here, let position coordinates (X, Y) of the measurement points of encoders Enc1, Enc2, and Enc3 on the XY coordinate system be $(p_1, q_1)$, $(p_2, q_2)$, and $(p_3, q_3)$, respectively. The positional information which was acquired in the case of the calibration of the head position described earlier is read from memory 34 and used for X-coordinate values $p_1$ and $q_2$ of encoders Enc1 and Enc2 and Y coordinate value $p_3$ of encoder Enc3, and the design positional information of the irradiation point of the measurement beam is read from memory 34 and used for Y coordinate values $q_1$ and $q_2$ of encoders Enc1 and Enc2 and X-coordinate value $p_3$ of encoder Enc3.

The X head and the Y head respectively measure the relative distance from central axes LL and LW of wafer stage WST. Accordingly, measurement values $C_X$ and $C_Y$ of the X head and the Y head can be expressed, respectively, as in the following formulas (12a) and (12b).

$$C_X = r'^* ex' \quad (12a)$$

$$C_Y = r'^* ey' \quad (12b)$$

In this case, ex' and ey' are X' and Y' unit vectors in a relative coordinate system (X', Y', θz') set on wafer stage WST, and have a relation as in the following formula (13) with X and Y unit vectors ex and ey in the reference coordinate system (X, Y, θz).

$$\begin{pmatrix} ex' \\ ey' \end{pmatrix} = \begin{pmatrix} \cos\theta z & \sin\theta z \\ -\sin\theta z & \cos\theta z \end{pmatrix} \begin{pmatrix} ex \\ ey \end{pmatrix} \quad (13)$$

Further, r' is a position vector of the encoder in the relative coordinate system, and r' is given r'=r−(O'−O), using position vector r=(p, q) in the reference coordinate system. Accordingly, formulas (12a) and (12b) can be rewritten as in the following formulas (14a) and (14b).

$$C_X = (p-X)\cos\theta z + (q-Y)\sin\theta z \quad (14a)$$

$$C_Y = -(p-X)\sin\theta z + (q-Y)\cos\theta z \quad (14b)$$

Figure 19B:
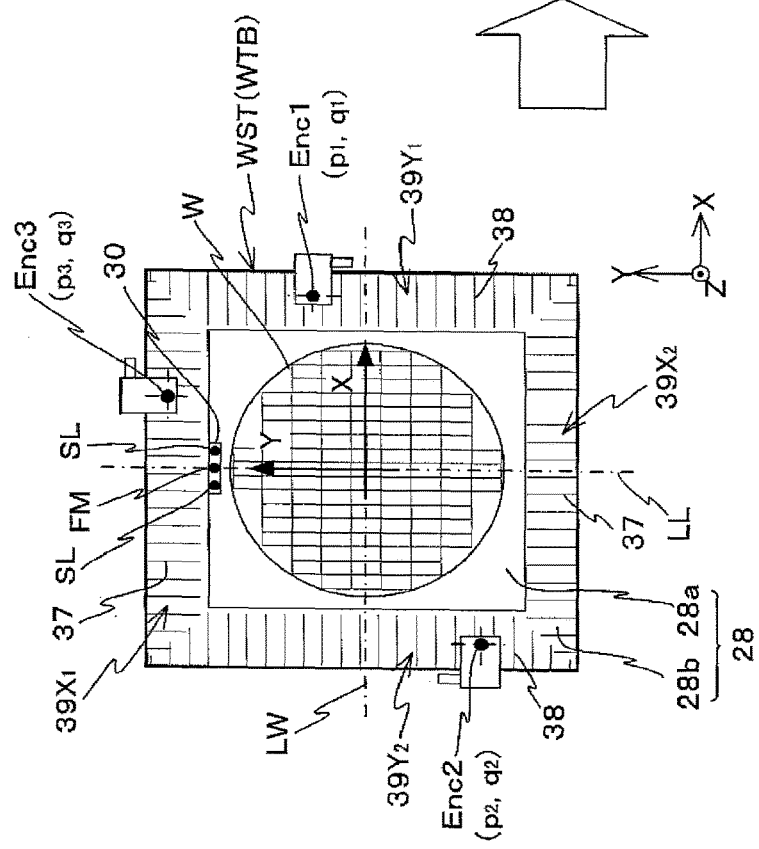

Accordingly, when wafer stage WST is located at the coordinate (X, Y, θz) as shown in FIG. 19B, the measurement values of three encoders can be expressed theoretically as in the next formulas (15a) to (15c) (also referred to as a relationship of the affine transformation).

$$C_1 = -(p_1-X)\sin\theta z + (q_1-Y)\cos\theta z \quad (15a)$$

$$C_2 = -(p_2-X)\sin\theta z + (q_2-Y)\cos\theta z \quad (15b)$$

$$C_3 = (p_3-X)\cos\theta z + (q_3-Y)\sin\theta z \quad (15c)$$

Incidentally, in the reference state shown in FIG. 19A, according to simultaneous equations (15a) to (15c), then $C_1=q_1$, $C_2=q_2$, and $C_3=p_3$. Accordingly, in the reference state, if the measurement values of the three encoders Enc1, Enc2, and Enc3 are initialized to $q_1$, $q_2$, and $p_3$ respectively, then the three encoders will show theoretical values given by formulas (15a) to (15c) with respect to displacement (X, Y, θz) of wafer stage WST from then onward.

In simultaneous equations (15a) to (15c), three formulas are given to the three variables (X, Y, θz). Accordingly, if dependent variables $C_1$, $C_2$, and $C_3$ are given in the simultaneous equations (15a) to (15c), variables X, Y, and θz can be obtained. In this case, when approximation sin θz≈θz is applied, or even if an approximation of a higher order is applied, the equations can be solved easily. Accordingly, the position of wafer stage WST (X, Y, θz) can be computed from measurement values $C_1$, $C_2$, and $C_3$ of the encoder.

Next, a linkage process performed during the switching of the encoder head used for position control of wafer stage WST in the XY plane in the embodiment, or more specifically, an initial setting of a measurement value will be described, focusing on an operation of main controller 20.

Figure 20:
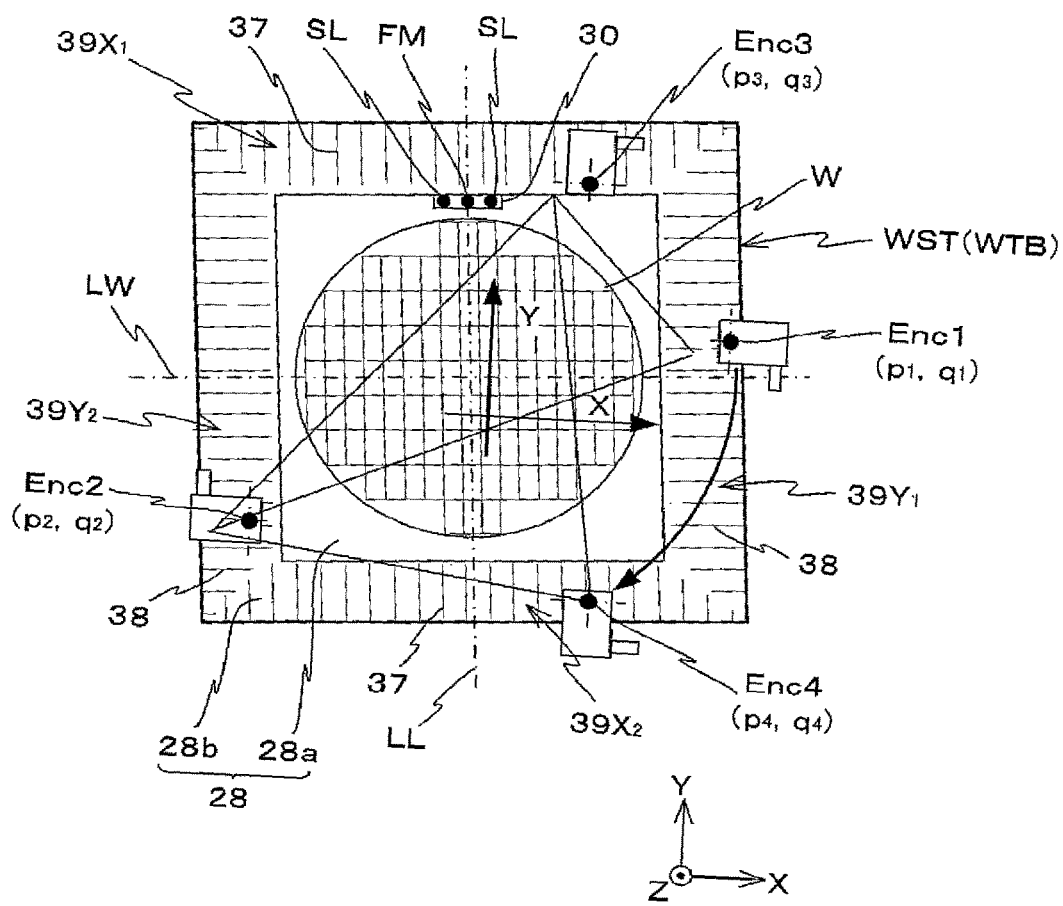
FIG. 20 is view to explain the switching process of the encoder used for the position control in the XY plane of the wafer stage.

In the embodiment, as is previously described, three encoders (the X heads and the Y heads) constantly observe wafer stage WST within the effective stroke range of wafer stage WST, and when the switching process of the encoder is performed, four encoders will be made to observe wafer stage WST, as shown in FIG. 20.

At the moment when the switching process (linkage) of the encoder used for the position control of wafer stage WST within the XY plane is to be performed, encoders Enc1, Enc2, Enc3 and Enc4 are positioned above scales $39Y_1$, $39Y_2$, $39X_1$, and $39X_2$, respectively, as shown in FIG. 20. When having a look at FIG. 20, it looks as though the encoder is going to be switched from encoder Enc1 to encoder Enc4, however, as is obvious from the fact that the measurement direction is different in encoder Enc1 and encoder Enc4, it does not have any meaning even if the measurement values (count values) of encoder Enc1 are given without any changes as the initial value of the measurement values of encoder Enc4.

Therefore, in the embodiment, main controller 20 switches from measurement/servo by the three encoders Enc1, Enc2 and Enc3 to measurement/servo by the three encoders Enc2, Enc3 and Enc4. More specifically, as it can be seen from FIG. 20, this method is different from the concept of a normal encoder linkage, and in this method the linkage is made not from one head to another head, but from a combination of three heads (an encoder) to a combination of another three heads (an encoder). Incidentally, in the three heads and another three heads, the different head is not limited to one. Further, in FIG. 20, encoder Enc3 was switched to encoder Enc4, however, instead of encoder Enc4, for example, the encoder can be switched, for example, to the encoder adjacent to encoder Enc3.

First of all, main controller 20 solves the simultaneous equations (15a) to (15c) based on the measurement values $C_1$, $C_2$, and $C_3$ of encoders Enc1, Enc2, and Enc3, and computes positional information (X, Y, θz) of wafer stage WST within the XY plane.

Next, main controller 20 substitutes X and θz computed above into the affine transformation of the next formula (16), and determines the initial value of the measurement values of encoder (X head) Enc4.

$$C_4=(p_4-X)\cos\theta z+(q_4-Y)\sin\theta z \quad (16)$$

In formula (16) above, $p_4$ and $q_4$ are the X-coordinate value and the Y-coordinate value at the measurement point of encoder Enc4. As Y coordinate value $q_4$ of encoder Enc4, the positional information of the irradiation point of the measurement beam which was acquired on calibration of the head position previously described is read from memory 34 and is used, while as X-coordinate value $p_4$ of encoder Enc4, the design position information of the irradiation point of the measurement beam is read from memory 34 and is used.

By giving initial value $C_4$ as an initial value of encoder Enc4, linkage will be completed without any contradiction, having maintained the position (X, Y, θz) of wafer stage WST in directions of three degree of freedom. From then onward, the following simultaneous equations (15b) to (15d) are solved, using the measurement values $C_2$, $C_3$, and $C_4$ of encoders Enc2, Enc3, and Enc4 which are used after the switching, and a position coordinate (X, Y, θz) of wafer stage WST is computed.

$$C_2=-(p_2-X)\sin\theta z+(q_2-Y)\cos\theta z \quad (15b)$$

$$C_3=(p_3-X)\cos\theta z+(q_3-Y)\sin\theta z \quad (15c)$$

$$C_4=(p_4-X)\cos\theta z+(q_4-Y)\sin\theta z \quad (15d)$$

Incidentally, in the case the fourth encoder is a Y head, then instead of using theoretical formula (15d), the following theoretical formula (15e) can be used in simultaneous equations (15b) (15c) (15e).

$$C_4=-(p_4-X)\sin\theta z+(q_4-Y)\cos\theta z \quad (15e)$$

However, because measurement value $C_4$ computed above is a measurement value of a corrected encoder whose measurement errors of the various encoders previously described have been corrected, main controller 20 performs inverse correction on measurement value $C_4$ and computes a raw value $C_4'$ which is the value before correction, and determines raw value $C_4'$ as the initial value of the measurement value of encoder Enc4, using the stage position induced error correction information, the scale induced error correction information (e.g., the degree of flatness of the grating surface (flatness), and/or the correction information of the grating pitch of the scale (and the correction information of the grating deformation) and the like) and the like previously described.

In this case, the inverse correction refers to the processing of computing measurement value $C_4'$ based on measurement value $C_4$, under the hypothesis that $C_4$ is a measurement value of the encoder after correction when count value $C_4'$ of the encoder on which no correction has been performed is corrected using the stage position induced error correction information previously described, the scale origin error correction information described above and the like.

Now, the position control interval (control sampling interval) of wafer stage WST, as an example, is 96 [μ sec], however, the measurement interval (measurement sampling interval) of an interferometer or an encoder has to be at a much higher speed. The reason why the sampling of the interferometer and the encoder has to be performed at a higher-speed than the control sampling is because both the interferometer and the encoder count the intensity change (fringe) of the interference light, and when the sampling becomes rough, measurement becomes difficult.

However, with the position servo control system of wafer stage WST, the system updates the current position of wafer stage WST at every control sampling interval of 96 [μsec], performs calculation to set the position to a target position, and outputs thrust command values and the like. Accordingly, the positional information of the wafer stage is necessary at every control sampling interval of 96 [μsec], and the positional information in between the sampling intervals will not be necessary in the position control of wafer stage WST. The interferometer and the encoder merely perform sampling at a high speed so as not to lose track of the fringe.

Figure 21:
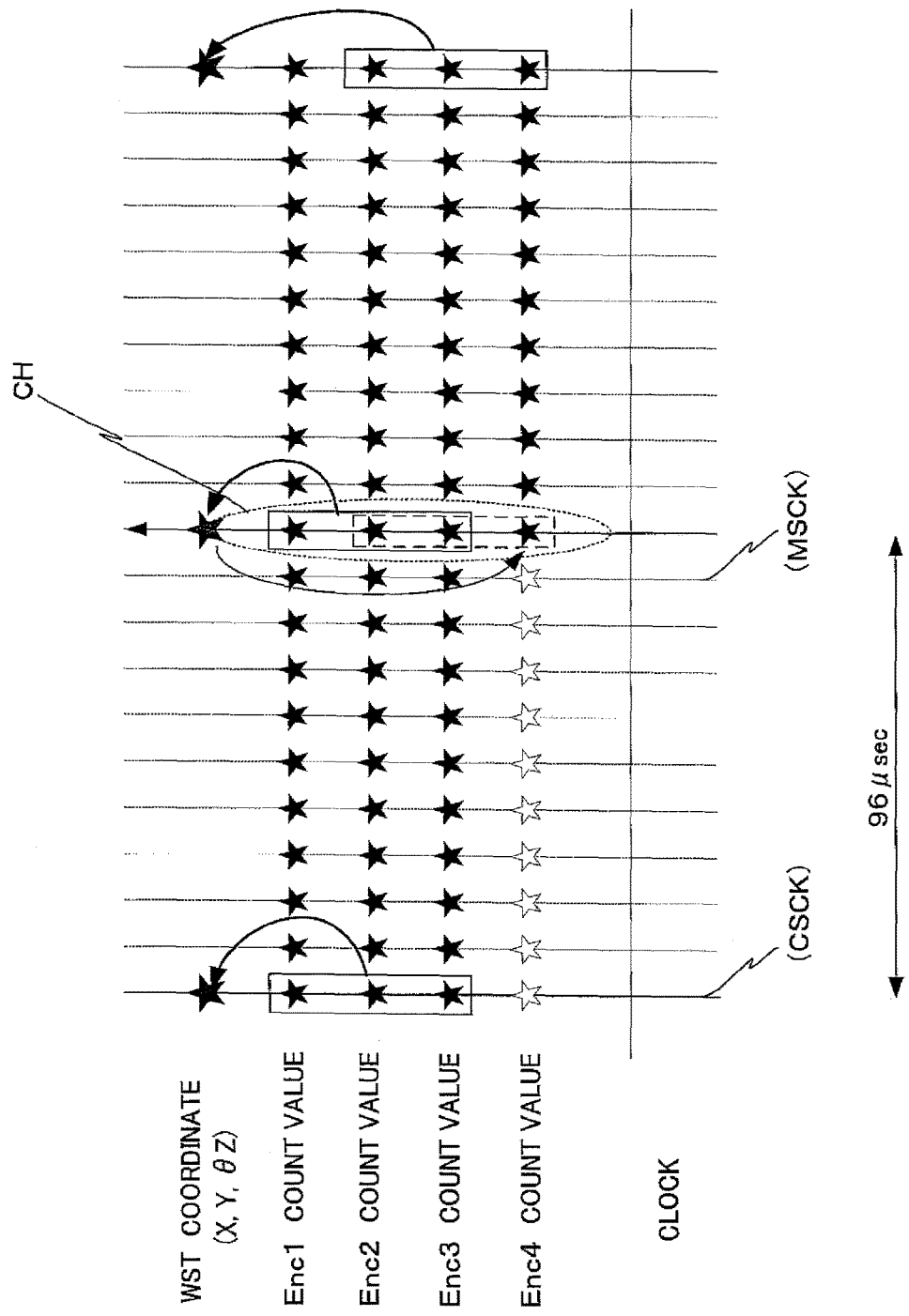
FIG. 21 is a view conceptually showing position control of the wafer stage, intake of the measurement value of the encoder, and an encoder switching timing.

Therefore, in the embodiment, at all times while wafer stage WST is located in the effective stroke range previously described, main controller 20 continues to receive the measurement values (count values) from each encoder (a head) of the encoder system, regardless of whether or not the encoder watches the scale. And, main controller 20 performs the switching operation (linkage operation between the plurality of encoders) previously described, in synchronization with the timing of the position control of the wafer stage performed every 96 [μsec]. In such an arrangement, the switching operation of an electrically high-speed encoder will not be required, which means that costly hardware to realize such a high-speed switching operation does not necessarily have to be arranged. FIG. 21 conceptually shows the timing of position control of wafer stage WST, the uptake of the count values of the encoder, and the switching of the encoder, which are performed in the embodiment. In FIG. 21, reference code CSCK shows a generation timing of a sampling clock of the position control of wafer stage WST, and reference code MSCK shows a generation timing of a measurement sampling clock of the encoder (and the interferometer). Further, reference code CH typically shows the switching (linkage) of the encoder.

Now, in the description above, the switching that could be performed from one combination of heads (encoders) to another combination of heads (encoders), and the timing when the switching can be performed are to be known, however, they also must be known in the actual sequence as well. It is also preferable to prepare the scheduling of the timing to carry out the linkage in advance.

Therefore, in the embodiment, main controller 20 prepares the schedule for the switching (the switching from one combination of three heads (e. g., Enc1, Enc2, and Enc3) to another combination of three heads (e. g., Enc4, Enc2, and Enc3), and the timing of the switch) of the three encoders (heads) which are used for measuring the positional information of wafer stage WST in directions of three degrees of freedom (X, Y, θz) within the XY plane, based on the movement course (target track) of wafer stage WST, and stores the scheduling result in the storage unit such as memory 34.

In this case, if a retry (redoing) is not considered, the contents of the schedule in every shot map (an exposure map) becomes constant, however, in actual practice, because a retry must be considered, it is preferable for main controller 20 to constantly update the schedule slightly ahead while performing the exposure operation.

Incidentally, in the embodiment above, because the description was made related to the principle of the switching method of the encoder used for position control of wafer stage WST, expressions such as encoder (head) Enc1, Enc2, Enc3, and Enc4 were used, however, it goes without saying that head Enc1 and Enc2 indicate either Y head 64 of head units 62A and 62C or a pair of Y heads $64y_1$ and $64y_2$, representatively, and heads Enc3 and Enc4 indicates X head 66 of head unit 62B and 62D, representatively. Further, for similar reasons, in FIGS. 19A, 19B and 20, the placement of encoders (heads) Enc1, Enc2, Enc3 and the like is shown differently from the actual placement (FIG. 3 and the like).

《Generalization of Switching and Linkage Principle》

In the embodiment, in order to measure the position coordinates of wafer stage WST in directions of three degree of freedom (X, Y, θz), among the X encoders (heads) and Y encoders (heads) that constitute encoder systems 70A to 70D, at least three heads which at least include one X head and at least two Y heads are constantly used. Therefore, when the head which is to be used is switched along with the movement of wafer stage WST, a method of switching from a combination of three heads to another combination of three heads is employed, so as to continuously link the measurement results of the stage position before and after the switching. This method will be referred to as a first method.

However, when considering the basic principle of the switching and linkage process from a different point of view, it can also be viewed as a method of switching one head of the three heads that are used to another head. This method will be referred to as a second method. Now, the second method will be described, referring to a switching and linkage process from Y head $64_{C3}$ to $64_{C4}$ as an example, indicated by an arrow $e_1$ in FIG. 7A.

The basic procedure of the switching process is, while both a first head $64_{C3}$ which will be suspended later and a second head $64_{C4}$ which will be newly used face the corresponding scale 39Y$_2$, main controller 20 executes the restoration of the second head $64_{C4}$ and the setting of the measurement values (linkage process), and the switching (and suspension of the first head $64_{C3}$) of the head monitoring the measurement value.

When the measurement value is set (linkage process), main controller 20 predicts a measurement value $C_{Y4}$ of the second head $64_{C4}$ using a measurement value $C_{Y3}$ of the first head $64_{C3}$. In this case, according to theoretical formula (14b), measurement values $C_{Y3}$ and $C_{Y4}$ of Y heads $64_{C3}$ and $64_{C4}$ follow formulas (17a) and (17b) below.

$$C_{Y3} = -(p_3 - X)\sin\theta z + (q_3 - Y)\cos\theta z \tag{17a}$$

$$C_{Y4} = -(p_4 - X)\sin\theta z + (q_4 - Y)\cos\theta z \tag{17b}$$

In this case, $(p_3, q_3)$ and $(p_4, q_4)$ are the X and Y setting positions (or to be more precise, the X and Y positions of the measurement points) of Y heads $64_{C3}$ and $64_{C4}$. To make it more simple, suppose that the Y setting positions of Y heads $64_{C3}$ and $64_{C4}$ are equal ($q_3 = q_4$). Under this supposition, according to formulas (17a) and (17b) above, the following formula (18) can be obtained.

$$C_{Y4} = C_{Y3} + (p_3 - p_4)\sin\theta z \tag{18}$$

Accordingly, by substituting the measurement value of first head $64_{C3}$ which will be suspended later into $C_{Y3}$ on the right-hand side of formula (18) above and obtaining $C_{Y4}$ on the left-hand side, the measurement value of the second head $64_{C4}$ which will be newly used can be predicted.

Predicted value $C_{Y4}$ that has been obtained is to be set as the initial value of the measurement value of the second head $64_{C4}$ at a proper timing. After the setting, the first head $64_{C3}$ is suspended when it moves off scale 39Y$_2$, which completes the switching and linkage process.

Incidentally, when the measurement value of the second head $64_{C4}$ is predicted using formula (18) above, a value of rotation angle θz, which is obtained from the measurement results of another head that is active, should be substituted into variable θz. In this case, another head that is active is not limited to the first head $64_{C3}$ which is subject to switching, but includes all the heads that provide the measurement results necessary to obtain rotation angle θz. In this case, because the first head $64_{C3}$ is a head of head unit 62C, rotation angle θz can be obtained using the first head $64_{C3}$, and for example, one of the heads of head unit 62A that faces Y scale 39Y$_1$ during the switching. Or, a value of rotation angle θz, which can be obtained from the measurement results of X interferometer 126 of interferometer system.

118, Y interferometer 16, or Z interferometer 43A and 43B and the like can be substituted into variable θz.

Incidentally, the switching and linkage process between Y heads was explained as an example here, however, the switching and linkage process between X heads, and further, also the switching and linkage process between two heads belonging to different head units such as between the X head and the Y head can also be explained similarly as the second method.

Therefore when the principle of the linkage process is generalized, the measurement value of another head newly used is predicted so that the results of the position measurement of wafer stage WST is linked continuously before and after the switching, and the predicted value is set as the initial value of the measurement values of the second head. In this case, in order to predict the measurement values of another head, theoretical formulas (14a) and (14b) and the measurement values of the active heads including the head which will be suspended later subject to the switching will be used as required. However, for the rotation angle in the θz direction of wafer stage WST which is necessary on the linkage, a value which is obtained from the measurement results of interferometer system 118 can be used.

As is described above, even if it is premised that at least three heads are constantly used to measure the position of wafer age WST in directions of three degree of freedom (X, Y, θz) as in the preceding first method, if focusing on only the two heads which are direct objects of the switching and linkage process without referring to the concrete procedure of predicting the measurement value of another head newly used, the observation on the second method where one head out of the three heads used is switched to another head can be realized.

Incidentally, the description so far was made on the premise that the position of wafer stage WST in directions of three degrees of freedom (X, Y, θz) was measured using at least three heads. However, even in the case of measuring the position of two or more in directions of m degrees of freedom (the choice of the degrees of freedom is arbitrary) using at least m heads, it is obvious that the observation of the second method where one head out of m heads used is switched to another head can be realized, as in the description above.

Next, a description will be made in which under a specific condition, an observation of a method (to be referred to as a third method) where a combination of two heads is switched to a combination of another two heads can be consistently realized.

In the example above, switching and linkage process between both heads $64_{C3}$ and $64_{C4}$ is executed, while Y heads $64_{C3}$ and $64_{C4}$ each face the corresponding Y scale $39Y_2$. During this operation, according to the placement of the scale and the head employed in exposure apparatus 100 of the embodiment, one Y head (expressed as $64_A$) of the Y heads of head unit 62A faces Y scale $39Y_1$ and measures relative displacement of Y scale $39Y_1$ in the Y-axis direction. Therefore, a switching and linkage process will be considered from a first combination of Y heads $64_{C3}$ and $64_A$ to a second combination of Y heads $64_{C4}$ and $64_A$.

According to theoretical formula (14b), a measurement value $C_{YA}$ of Y head $64_A$ follows formula (17c) below.

$$C_{YA} = -(p_A - X)\sin\theta z + (q_A - Y)\cos\theta z \quad (17c)$$

In this case, $(p_A, q_A)$ is the X and Y setting position (or to be more precise, the X and Y positions of the measurement point) of Y head $64_A$. To make it more simple, suppose that Y setting position $q_A$ of Y head $64_A$ is equal to Y setting positions $q_3$ and $q_4$ of Y heads $64_{C3}$ and $64_{C4}$ ($q_A = q_3 = q_4$).

When theoretical formulas (17a) and (17c), which measurement values $C_{Y3}$ and $C_{YA}$ of Y heads $64_{C3}$ and $64_A$ of the first combination follow, are substituted into theoretical formula (17b), which measurement value $C_{Y3}$ of Y head $64_{C4}$ that is newly used follows, formula (19) below is derived.

$$C_{Y4} = (1-c)C_{Y3} - c^* C_{YA} \quad (19)$$

However, constant $c = (p_3 - p_4)/(q_4 - q_3)$. Accordingly, by substituting the measurement values of Y heads $64_{C3}$ and $64_A$ into $C_{Y3}$ and $C_{YA}$ on the right-hand side of formula (19) above and obtaining $C_{Y4}$ on the left-hand side, the measurement value of Y head $64_{C4}$ newly used can be predicted.

Predicted value $C_{Y4}$ that has been obtained is to be set as the initial value of the measurement value of Y head $64_{C4}$ at a proper timing. After the setting, Y head $64_{C3}$ is suspended when it moves off scale $39Y_2$, which completes the switching and linkage process.

Incidentally, according to the placement of the scale and the head employed in exposure apparatus 100 of the embodiment, at least one X head 66 faces X scale $39X_1$ or $39X_2$ and measures the relative displacement in the X-axis direction. Then, according to the measurement results of the three heads, which are one X head 66 two Y heads $64_{C3}$ and $64_A$, the position of wafer stage WST in directions of three degrees of freedom (X, Y, θz) is computed. However, in the example of the switching and linkage process described above, X head 66 merely plays the role of a spectator, and the observation of the third method where a combination of two heads, Y heads $64_{C3}$ and $64_A$ is switched to a combination of another two heads, Y head $64_{C4}$ and $64_A$, is consistently realized.

Accordingly, under the premise that the use of three heads is indispensable to measure the position of wafer stage WST in directions of three degrees of freedom (X, Y, θz), the first method was proposed as a general method of the switching and linkage process that could be applied to every case, regardless of the placement of the scale and the head employed in exposure apparatus 100 of the embodiment. And, based on the concrete placement of the scale and the head employed in exposure apparatus 100 of the embodiment and the concrete procedure of the linkage process, the observation of the third method could be realized under a particular condition.

Incidentally, in addition to the first method, in the switching and linkage process of the encoder head by the second and third methods described above, the measurement value of another head to be newly used was predicted so that the position coordinate of wafer stage WST which is monitored is continuously linked before and after the switching, and this predicted value was set as an initial value for the measurement value of another head. Instead of the processing above, the measurement error of another head including the measurement error generated by the switching and linkage process can be computed and the correction data can be made. And, while the another head is being used, the correction data that has been made can be used for servo drive control of wafer stage WST. In this case, based on the correction data, positional information of wafer stage WST measured by the another head can be corrected, or a target position of wafer stage WST for servo control can be corrected. Furthermore, in the exposure operation, servo drive control of the reticle stage is performed, following the movement of wafer stage WST. Therefore, based on the correction data, instead of correcting the servo control of wafer stage WST, the follow-up servo control of the reticle stage can be corrected. Further, according to these control system, the measurement value of the head before the switching may be set as an initial value of another head without any changes. Incidentally, when making the correction data, not only the encoder system but also other measurement systems that the exposure apparatus in the embodiment has, such as the interferometer systems, should be appropriately used.

Next, a parallel processing operation that uses wafer stage WST and measurement stage MST in exposure apparatus 100 of the embodiment will be described based on FIGS. 22 to 35. Incidentally, during the operation below, main controller 20 performs the open/close control of each valve of liquid supply unit 5 of local liquid immersion unit 8 and liquid recovery unit 6 in the manner previously described, and water is constantly filled in the space right under tip lens 191 of projection optical system PL. However, in the description below, for the sake of simplicity, the explanation related to the control of liquid supply unit 5 and liquid recovery unit 6 will be omitted. Further, many drawings are used in the operation description hereinafter, however, reference codes may or may not be given to the same member for each drawing. More specifically, the reference codes written are different for each drawing, however, such members have the same configuration, regardless of the indication of the reference codes. The same can be said for each drawing used in the description so far.

FIG. 22 shows a state where exposure by the step-and-scan method is being performed on wafer W (in this case, as an example, the wafer is a wafer midway of a certain lot (one lot contains 25 or 50 wafers)) on wafer stage WST. In this state, measurement stage MST can wait at a withdrawal position where it avoids bumping into wafer stage WST, however, in the embodiment, measurement stage MST is moving, following wafer stage WST while keeping a predetermined distance. Therefore, when measurement stage MST moves into a contact state (or a proximity state) with wafer stage WST after the exposure has been completed, the same distance as the predetermined distance referred to above will be enough to cover the movement distance.

During this exposure, main controller 20 controls the position (including the θz rotation) of wafer table WTB (wafer stage WST) within the XY plane, based on the measurement values of at least three encoders out of two X heads 66 (X encoders 70B and 70D) shown surrounded by a circle in FIG. 22 facing X scales $39X_1$ and $39X_2$, respectively, and two Y heads 64 (Y encoders 70A and 70C) shown surrounded by a circle in FIG. 22 facing Y scales $39Y_1$ and $39Y_2$, respectively, the pitching amount or rolling amount, and yawing amount of wafer stage WST measured by interferometer system 118, the stage position induced error correction information (correction information obtained by formula (10) or formula (11) previously described) of each encoder corresponding to the Z position, the correction information of the grating pitch of each scale and correction information of the warp of the grid line. Further, main controller 20 controls the position of wafer table WTB in the Z-axis direction, the θy rotation (rolling), and the θx rotation (pitching), based on measurement values of one pair each of Z sensors $74_{1,j}$ and $74_{2,j}$, and $76_{1,q}$ and $76_{2,q}$ that face one end and the other end (in the embodiment, Y scales $39Y_1$ and $39Y_2$) of the wafer table WTB surface in the X-axis direction. Incidentally, the position of wafer table WTB in the Z-axis direction and the θy rotation (rolling) can be controlled based on the measurement value of Z sensors $74_{1,j}$, $74_{2,j}$, $76_{1,q}$, and $76_{2,q}$, and the θx rotation (pitching) can be controlled based on the measurement values of Y interferometer 16. In any case, the control (focus leveling control of wafer W) of the position of wafer table WTB in the Z-axis direction, the θy rotation, and the θx rotation during this exposure is performed, based on results of a focus mapping performed in advance by the multipoint AF system previously described.

Main controller 20 performs the exposure operation described above, based on results of wafer alignment (e.g. Enhanced Global Alignment (EGA)) that has been performed beforehand and on the latest baseline and the like of alignment systems AL1, and $AL2_1$ to $AL2_4$, by repeating a movement operation between shots in which wafer stage WST is moved to a scanning starting position (an acceleration starting position) for exposure of each shot area on wafer W, and a scanning exposure operation in which a pattern formed on reticle R is transferred onto each shot area by a scanning exposure method. Incidentally, the exposure operation described above is performed in a state where water is retained in the space between tip lens 191 and wafer W. Further, exposure is performed in the order from the shot area located on the −Y side to the shot area located on the +Y side in FIG. 22. Incidentally, details on the EGA method are disclosed, for example, in U.S. Pat. No. 4,780,617 description and the like.

Figure 23:
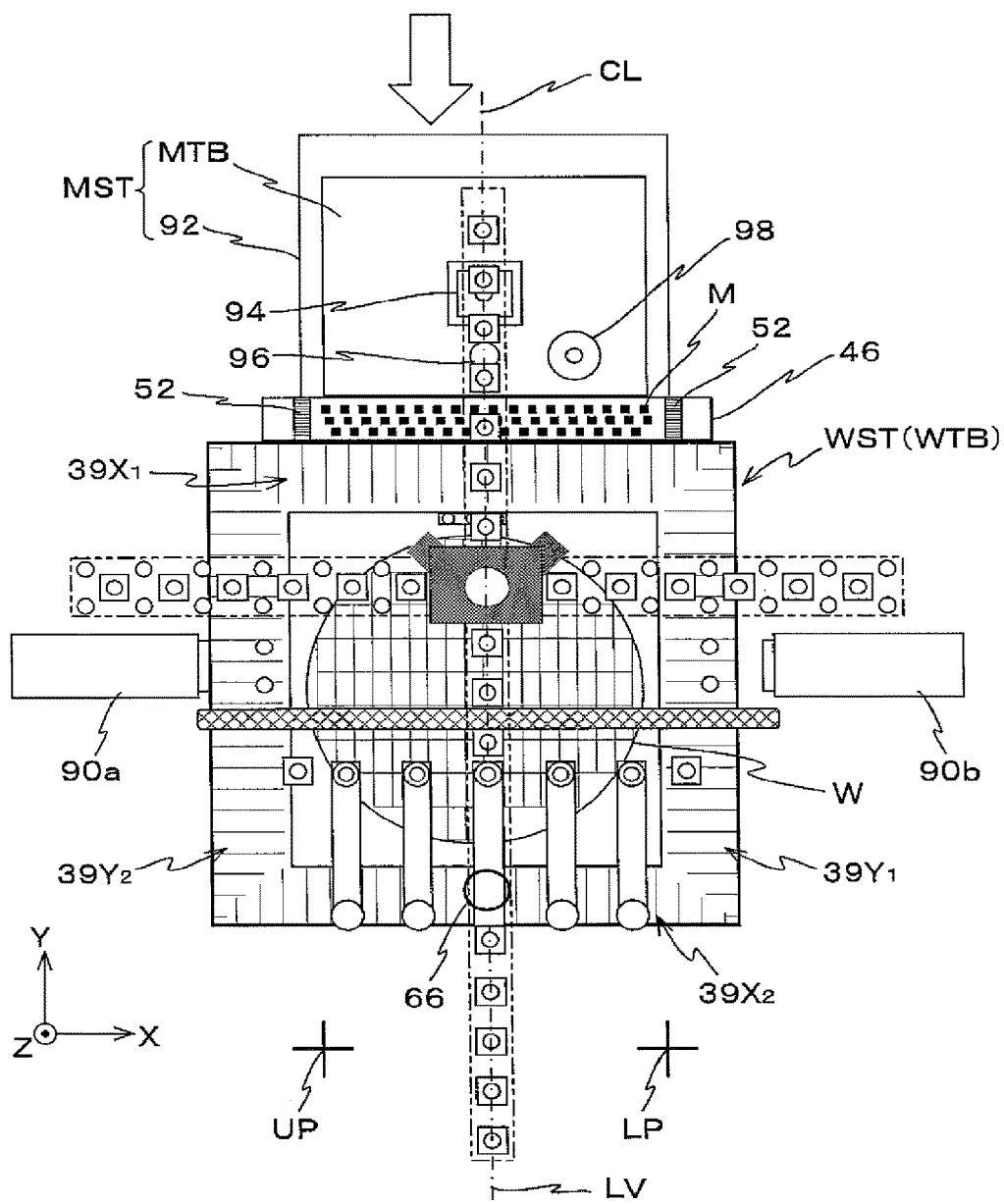
FIG. 23 is a view showing the state of both stages just after the stages shifted from a state where the wafer stage and the measurements stage are distanced to a state where both stages are in contact after exposure has been completed.

And before the last shot area on wafer W is exposed, main controller 20 controls stage drive system 124 based on the measurement value of Y interferometer 18 while maintaining the measurement value of X interferometer 130 to a constant value, and moves measurement stage MST (measurement table MTB) to the position shown in FIG. 23. When the measurement stage is moved, the edge surface of CD bar 46 (measurement table MTB) on the −Y side touches the edge surface of wafer table WTB on the +Y side. Incidentally, measurement table MTB and wafer table WTB can be separated, for example, at around 300 μm in the Y-axis direction while monitoring, for example, the interferometer that measures the position of each table in the Y-axis direction or the measurement values of the encoder so as to maintain a non-contact state (proximity state). After wafer stage WST and measurement stage MST are set to the positional relation shown in FIG. 23 during the exposure of wafer W, both stages are moved while maintaining this positional relation.

Figure 24:
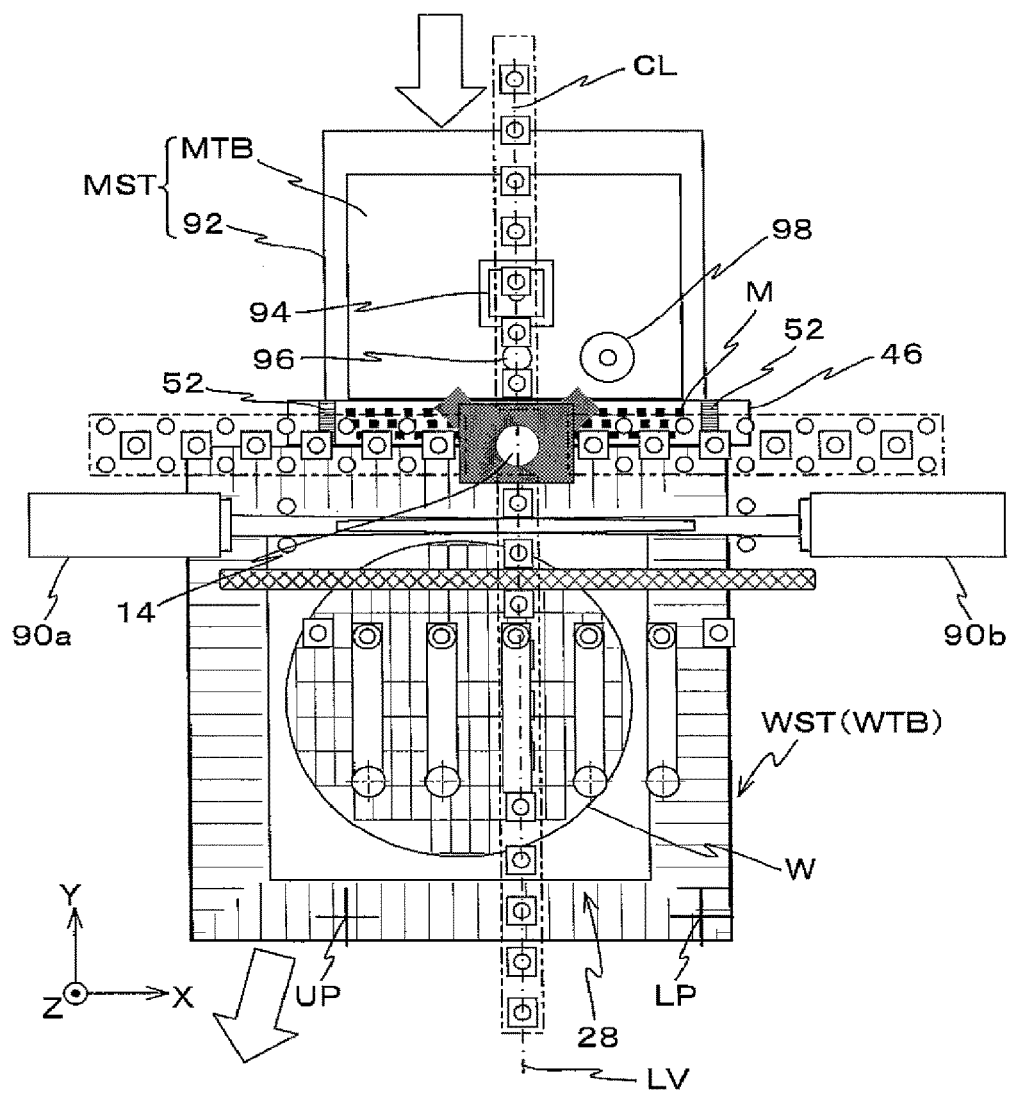
FIG. 24 is a view showing a state where the measurement stage moves in the −Y direction and the wafer stage moves toward an unloading position, while maintaining the positional relation between the wafer table and the measurement table in the Y-axis direction.

Subsequently, as shown in FIG. 24, main controller 20 begins the operation of driving measurement stage MST in the −Y direction, and also begins the operation of driving wafer stage WST toward unloading position UP, while maintaining the positional relation of wafer table WTB and measurement table MTB in the Y-axis direction. When the operations begin, in the embodiment, measurement stage MST is moved only in the −Y direction, and wafer stage WST is moved in the −Y direction and the −X direction.

When main controller 20 simultaneously drives wafer stage WST and measurement stage MST in the manner described above, the water (water of liquid immersion area 14 shown in FIG. 24) which was retained in the space between tip lens 191 of projection unit PU and wafer W sequentially moves over wafer W→plate 28→CD bar 46→measurement table MTB, along with the movement of wafer stage WST and measurement stage MST to the −Y side. Incidentally, during the movement above, wafer table WTB and measurement table MTB maintain the contact state (or proximity state) previously described. Incidentally, FIG. 24 shows a state just before the water of liquid immersion area 14 is moved over to CD bar 46 from plate 28. Further, in the state shown in FIG. 24, main controller 20 controls the position (including the θz rotation) of wafer table WTB (wafer stage WST) within the XY plane, based on the measurement values (and the stage position induced error correction information, the correction information of the grating pitch of the scale and the correction information of the grid line of encoders 70A, 70B or 70D stored in memory 34, corresponding to the pitching amount, rolling amount, yawing amount, and the Z position of wafer stage WST measured by interferometer system 118) of the three encoders 70A, 70B, and 70D.

Figure 25:
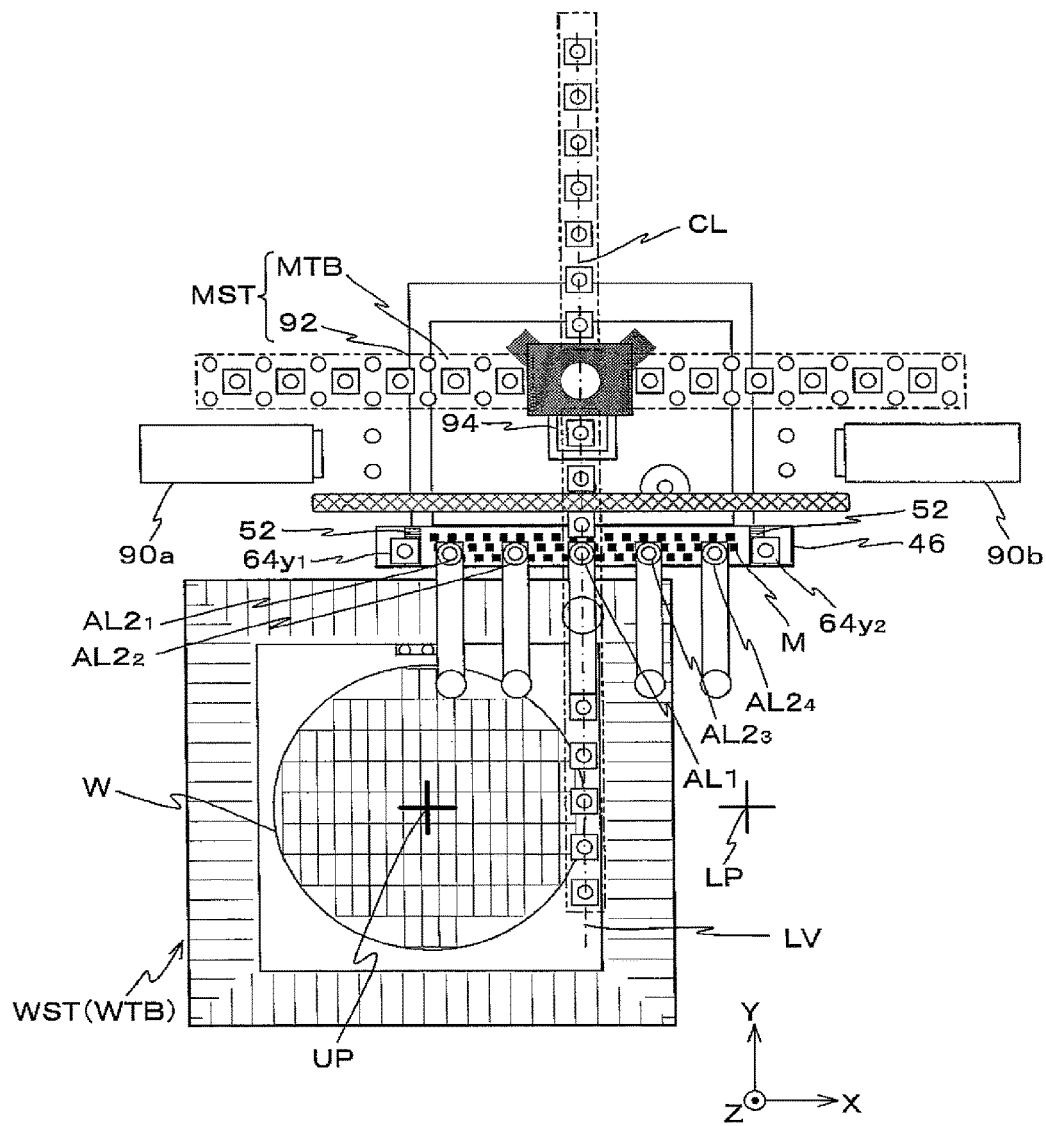
FIG. 25 is a view showing a state of the wafer stage and the measurement stage when the measurement stage has reached a position where a Sec-BCHK (interval) is performed.

When wafer stage WST and measurement stage MST are driven simultaneously, slightly in the directions above furthermore from the state shown in FIG. 24, respectively, because the position measurement of wafer stage WST (wafer table WTB) by Y encoder 70A (and, 70C) will no longer be possible, main controller 20 switches the control of the Y position and the θz rotation of wafer stage WST (wafer table WTB) just before this, from a control based on the measurement values of Y encoders 70A and 70C to a control based on the measurement values of Y interferometer 16 and Z interferometers 43A and 43B. Then, after a predetermined time later, measurement stage MST reaches a position where baseline measurement (hereinafter appropriately referred to as Sec-BCHK (interval)) of the secondary alignment system is performed at a predetermined interval (in this case, at each wafer exchange) as shown in FIG. 25. Then, main controller 20 stops measurement stage MST at the position, and drives wafer stage WST furthermore toward unloading position UP and then stops wafer stage WST at unloading position UP, while measuring the X position of wafer stage WST using X head 66 (X linear encoder 70B) shown in FIG. 25 surrounded by a circle that faces X scale $39X_1$ and also measuring the position in the Y-axis direction and the θz rotation measure using Y interferometer 16 and Z interferometers 43A and 43B. Incidentally, in the state shown in FIG. 25, the wafer is retained in the space between measurement table MTB and tip lens 191.

Figure 26:
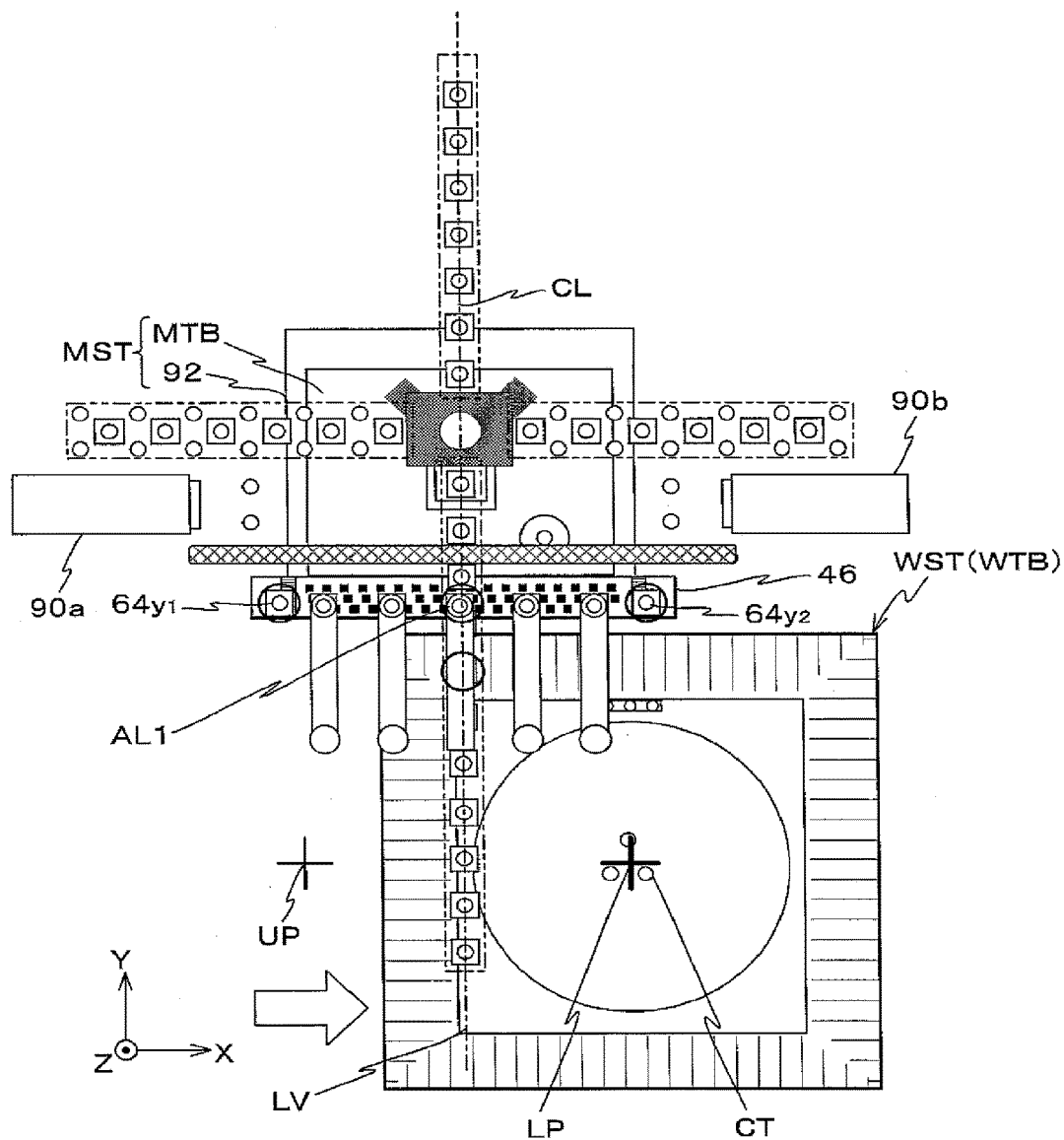
FIG. 26 is a view showing a state of the wafer stage and the measurement stage when the wafer stage has moved from the unloading position to a loading position in parallel with the Sec-BCHK (interval) being performed.

Subsequently, as shown in FIGS. 25 and 26, main controller 20 adjusts the θz rotation of CD bar 46, based on the measurement values of Y-axis linear encoders 70E and 70F configured by Y heads $64y_1$ and $64y_2$ shown in FIG. 26 surrounded by a circle that face a pair of reference grids 52 on CD bar 46 supported by measurement stage MST, respectively, and also adjusts the XY position of CD bar 46, based on the measurement value of primary alignment system AL1 which detects reference mark M located on or in the vicinity of center line CL of measurement table MTB. Then, in this state, main controller 20 performs the Sec-BCHK (interval) in which the baseline (the relative position of the four secondary alignment systems with respect to primary alignment system AL1) of the four secondary alignment systems AL2$_1$ to AL2$_4$ is obtained by simultaneously measuring reference mark M on CD bar 46 located within the field each secondary alignment system, respectively, using the four secondary alignment systems AL2$_1$ to AL2$_4$. In parallel with this Sec-BCHK (an interval), main controller 20 gives a command to a drive system of an unload arm (not shown) so that wafer W on wafer stage WST suspended at unload position UP is unloaded, and also drives wafer stage WST in the +X direction so that the stage is moved to loading position LP, while keeping a vertical movement pin CT (not shown in FIG. 25, refer to FIG. 26) elevated by a predetermined amount, which was driven upward on the unloading.

Figure 27:
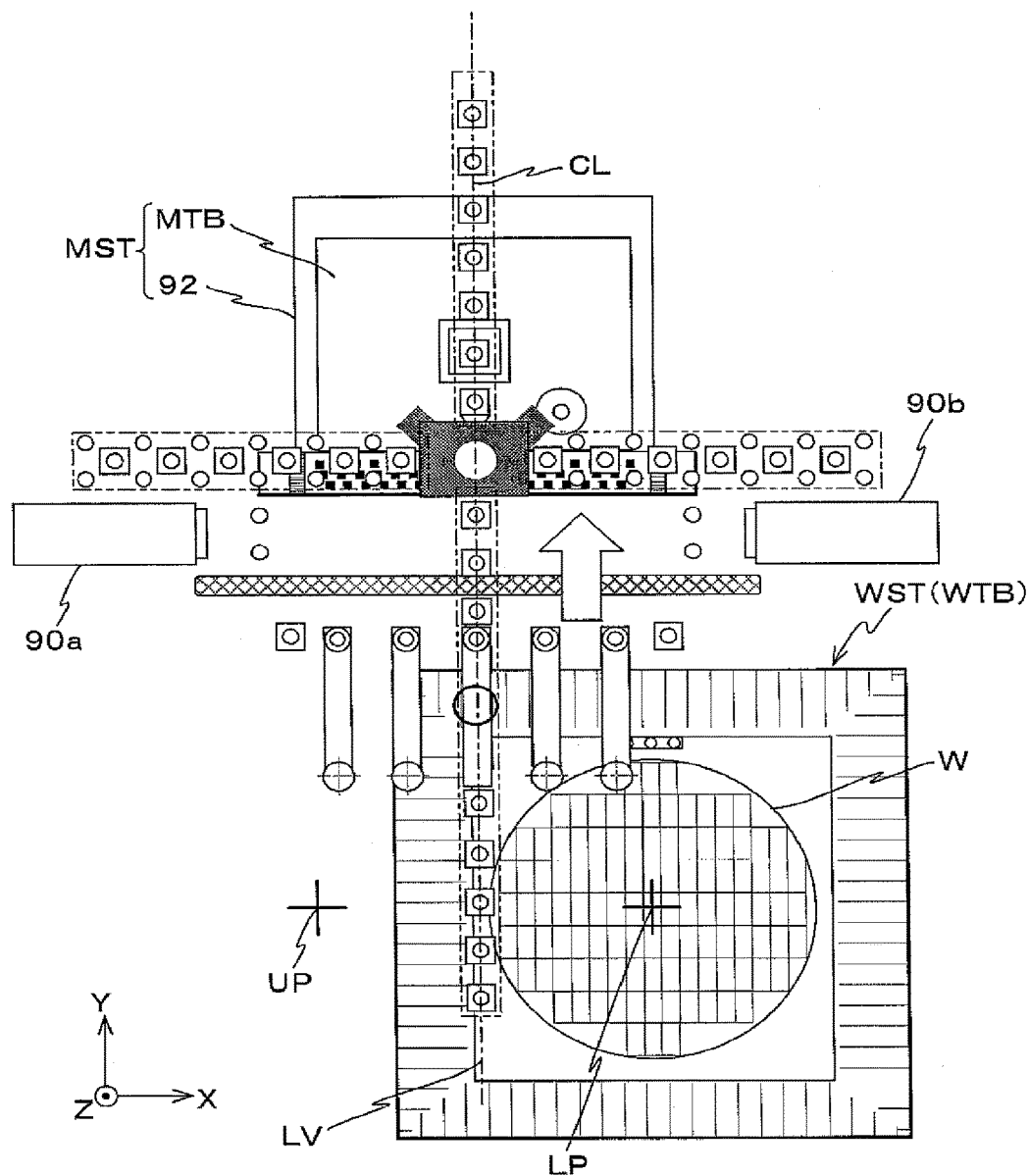
FIG. 27 is a view showing a state of the wafer stage and the measurement stage when the measurement stage moves to an optimal scrum waiting position and a wafer is loaded on a wafer table.

Next, as shown in FIG. 27, main controller 20 moves measurement stage MST to an optimal waiting position (hereinafter referred to as "optimal scrum waiting position"), which is the optimal waiting position for moving measurement stage MST from the state distanced from wafer stage WST into the contact state (or proximity state) previously described with wafer stage WST. In parallel with this, main controller 20 gives a command to a drive system of a load arm (not shown) so that a new wafer W is loaded on wafer table WTB. In this case, because vertical movement pin CT is maintaining the state of being elevated by a predetermined amount, wafer loading can be performed in a short period of time when compared with the case when vertical movement pin CT is driven downward and is housed inside the wafer holder. Incidentally, FIG. 27 shows a state where wafer W is loaded on wafer table WTB.

In the embodiment, the optimal scrum waiting position of measurement stage MST referred to above is appropriately set according to the Y-coordinate of alignment marks arranged on the alignment shot area on the wafer. Further, in the embodiment, the optimal scrum waiting position is decided so that wafer stage WST can move into the contact state (or proximity state) at the position where wafer stage WST stops for wafer alignment.

Figure 28:
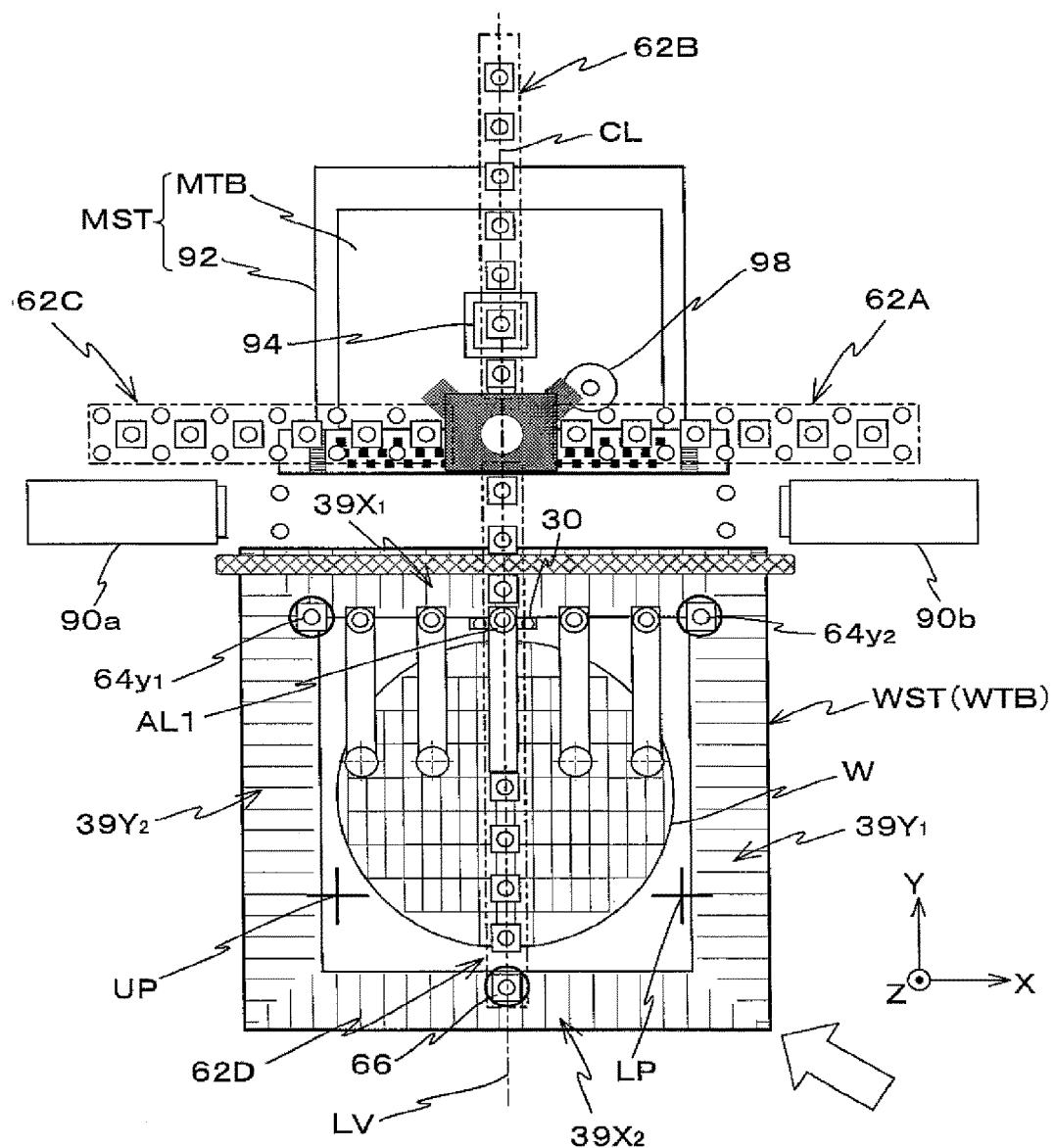
FIG. 28 is a view showing a state of both stages when the wafer stage has moved to a position where the Pri-BCHK former process is performed while the measurement stage is waiting at the optimal scrum waiting position.

Next, as shown in FIG. 28, main controller 20 moves wafer stage WST from loading position LP, to a position (more specifically, a position where the former process of base line measurement (Pri-BCHK) of the primary alignment system is performed) in the field (detection area) of primary alignment system AL1 where fiducial mark FM on measurement plate 30 is positioned. During this exposure, main controller 20 switches the control of position of wafer table WTB within the XY plane, from the control previously described based on measurement values of encoder 70B for the X-axis direction, Y interferometer 16 and Z interferometers 43A and 43B for the Y-axis direction and the θz rotation, to a control based on the measurement values of at least three encoders out of two X heads 66 (X encoders 70B and 70D) shown surrounded by a circle in FIG. 28 facing X scales $39X_1$ and $39X_2$, respectively, and two Y heads $64y_2$ and $64y_1$ (Y encoders 70A and 70C) shown surrounded by a circle in FIG. 28 facing Y scales $39Y_1$ and $39Y_2$, respectively, the pitching amount or rolling amount, and yawing amount of wafer stage WST measured by interferometer system 118, the stage position induced error correction information (correction information obtained by formula (10) or formula (11) previously described) of each encoder corresponding to the Z position, the correction information of the grating pitch of each scale and correction information of the warp of the grid line.

Then, main controller 20 performs the former process of Pri-BCHK in which fiducial mark FM is detected using primary alignment system AL1. At this point in time, measurement stage MST is waiting at the optimal scrum waiting position described above.

Next, while controlling the position of wafer stage WST based on the measurement values of at least the three encoders and each correction information described above, main controller 20 begins the movement of wafer stage WST in the +Y direction toward a position where the alignment marks arranged in three first alignment shot areas are detected.

Then, when wafer stage WST reaches the position shown in FIG. 29, main controller 20 stops wafer stage WST. Prior to this, main controller 20 activates (turns on) Z sensors 72a to 72d at the point when Z sensors 72a to 72d begins to move over wafer table WTB or at the point before, and measures the Z position and the inclination (θy rotation and θx rotation) of wafer table WTB.

After wafer stage WST is stopped as in the description above, main controller 20 detects the alignment marks arranged in the three first alignment shot areas substantially at the same time and also individually (refer to the star-shaped marks in FIG. 29), using primary alignment system AL1, and secondary alignment systems $AL2_2$ and $AL2_3$, and makes a link between the detection results of the three alignment systems AL1, $AL2_2$, and $AL2_3$ and the measurement values (measurement values after the correction according to each correction information) of at least the three encoders above at the time of the detection, and stores them in the internal memory.

As in the description above, in the embodiment, the shift to the contact state (or proximity state) between measurement stage MST and wafer stage WST is completed at the position where detection of the alignment marks of the first alignment shot areas is performed, and from this position, main controller 20 begins to move both stages WST and MST in the +Y direction (step movement toward the position for detecting alignment marks arranged in five second alignment shot areas) in the contact state (or proximity state). Prior to starting the movement of both stages WST and MST in the +Y direction, as shown in FIG. 29, main controller 20 begins irradiation of a detection beam from irradiation system 90 of the multipoint AF system (90a, 90b) toward wafer table WTB. Accordingly, a detection area of the multipoint AF system is formed on wafer table WTB.

Figure 30:
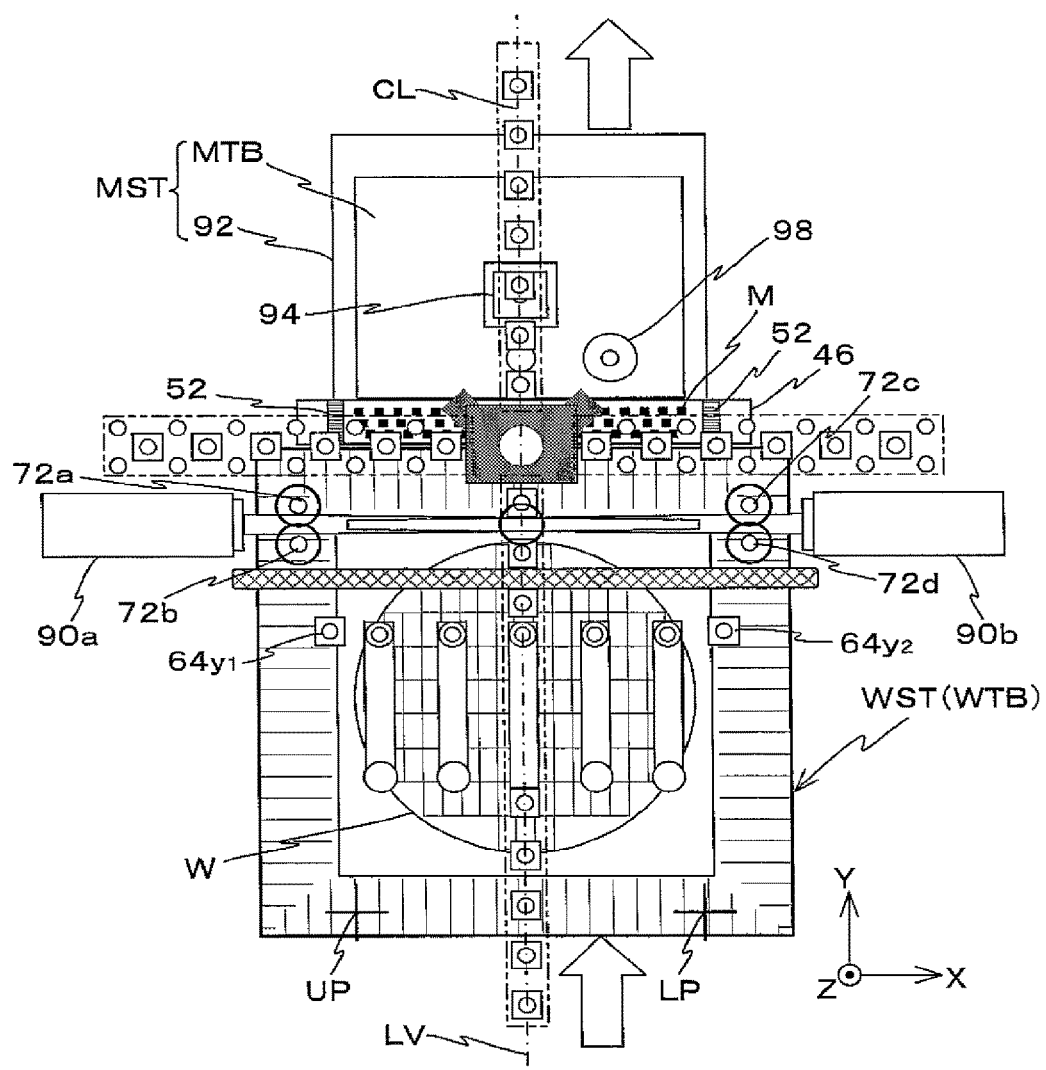
FIG. 30 is a view showing a state of the wafer stage and the measurement stage when the focus calibration former process is being performed.

Then, when both stages WST and MST reach the position shown in FIG. 30 during the movement of both stages WST and MST in the +Y direction, main controller 20 performs the former process of the focus calibration, and obtains the relation between the measurement values (surface position information on one side and the other side of wafer table WTB in the X-axis direction) of Z sensors 72a, 72b, 72c, and 72d, in a state where a straight line (center line) in the Y-axis direction passing through the center (substantially coinciding with the center of wafer W) of wafer table WTB coincides with straight line LV previously described, and the detection results (surface position information) of a detection point (the detection point located in or around the center, among a plurality of detection points) on the surface of measurement plate 30 of the multipoint AF system (90a, 90b). At this point, liquid immersion area 14 is located in the vicinity of the border of CD bar 46 and wafer table WTB. More specifically, liquid immersion area 14 is in a state just before it is passed over to wafer table WTB from CD bar 46.

Figure 31:
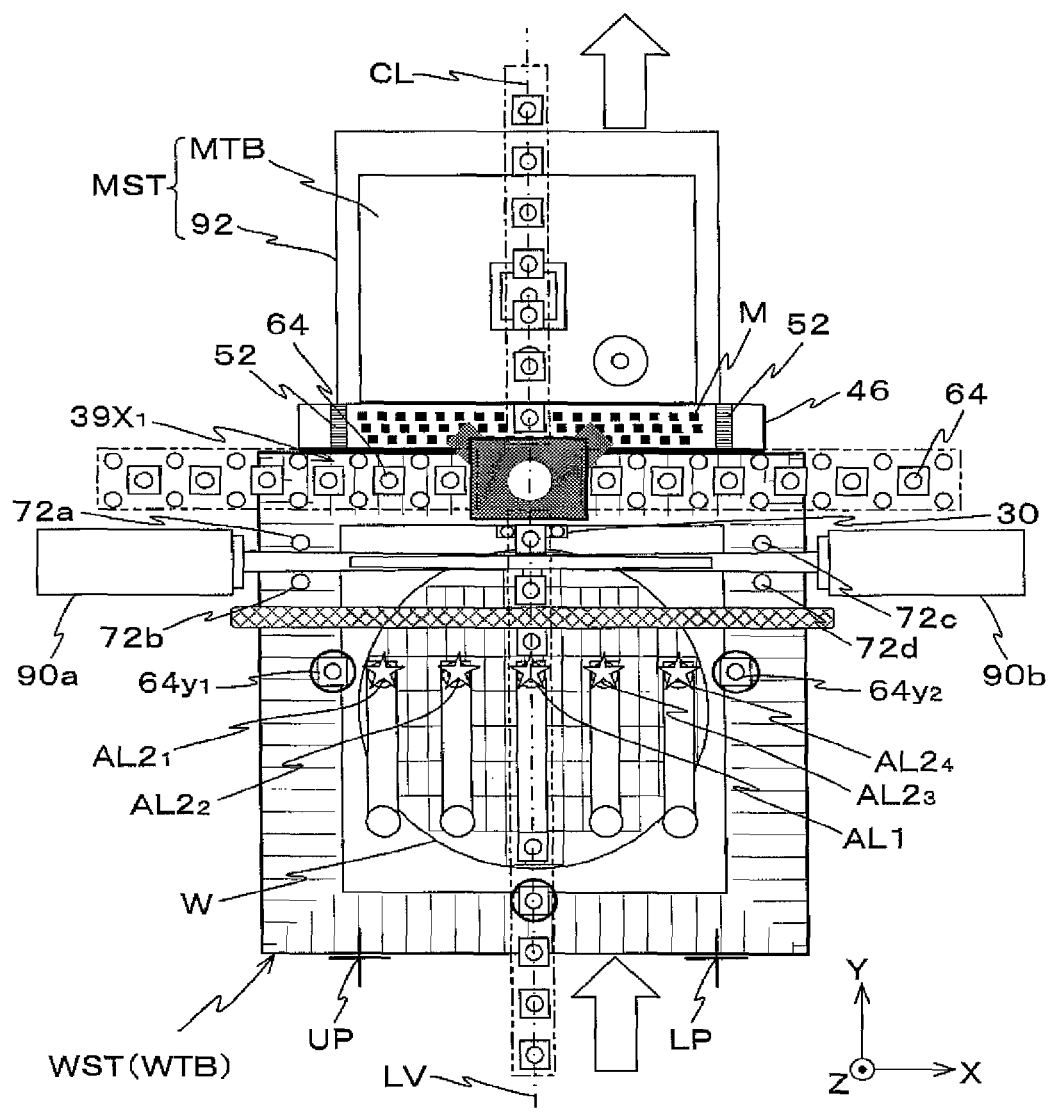
FIG. 31 is a view showing a state of the wafer stage and the measurement stage when alignment marks arranged in five second alignment shot areas are being simultaneously detected using alignment systems AL1 and $AL2_1$ to $AL2_4$.

Then, when both stages WST and MST move further in the +Y direction while maintaining the contact state (or proximity state), and reach the position shown in FIG. 31, the alignment marks arranged in the five second alignment shot areas are detected substantially at the same time as well as individually (refer to the star-shaped marks in FIG. 31), using the five alignment systems AL1, and $AL2_1$ to $AL2_4$ and a link is made between the detection results of the five alignment systems AL1, and $AL2_1$ to $AL2_4$ and the measurement values (measurement values after the correction according to each correction information) of the three encoders 70A, 70C, and 70D at the time of the detection, and stored in the internal memory. At this point in time, since the X head that faces X scale $39X_1$ and is located on straight line LV does not exist, main controller 20 controls the position within the XY plane of wafer table WTB based on the measurement values of X head 66 facing X scale $39X_2$ (X linear encoder 70D) and Y linear encoders 70A and 70C.

As is described above, in the embodiment, the positional information (two-dimensional positional information) of a total of eight alignment marks can be detected at the point when the detection of the alignment marks in the second alignment shot areas is completed. Therefore, at this stage, main controller 20 can perform a statistical computation such as the one disclosed in, for example, Kokai (Japanese Unexamined Patent Application Publication) No. 61-44429 bulletin (the corresponding U.S. Pat. No. 4,780,617 description) and the like, to obtain the scaling (shot magnification) of wafer W, and can adjust the optical properties of projection optical system PL, such as for example, the projection magnification, by controlling an adjustment 68 (refer to FIG. 6) based on the shot magnification which has been computed. Adjustment unit 68 adjusts the optical properties of projection optical system PL, for example, by driving a particular movable lens that configures projection optical system PL, or changing gas pressure in an airtight chamber formed between particular lenses that configure projection optical system PL or the like.

Further, after the simultaneous detection of the alignment marks arranged in the five second alignment shot areas is completed, main controller 20 starts again movement in the +Y direction of both stages WST and MST in the contact state (or proximity state), and at the same time, starts the focus mapping using Z sensors 72a to 72d and the multipoint AF system (90a, 90b), as is shown in FIG. 31.

Figure 32:
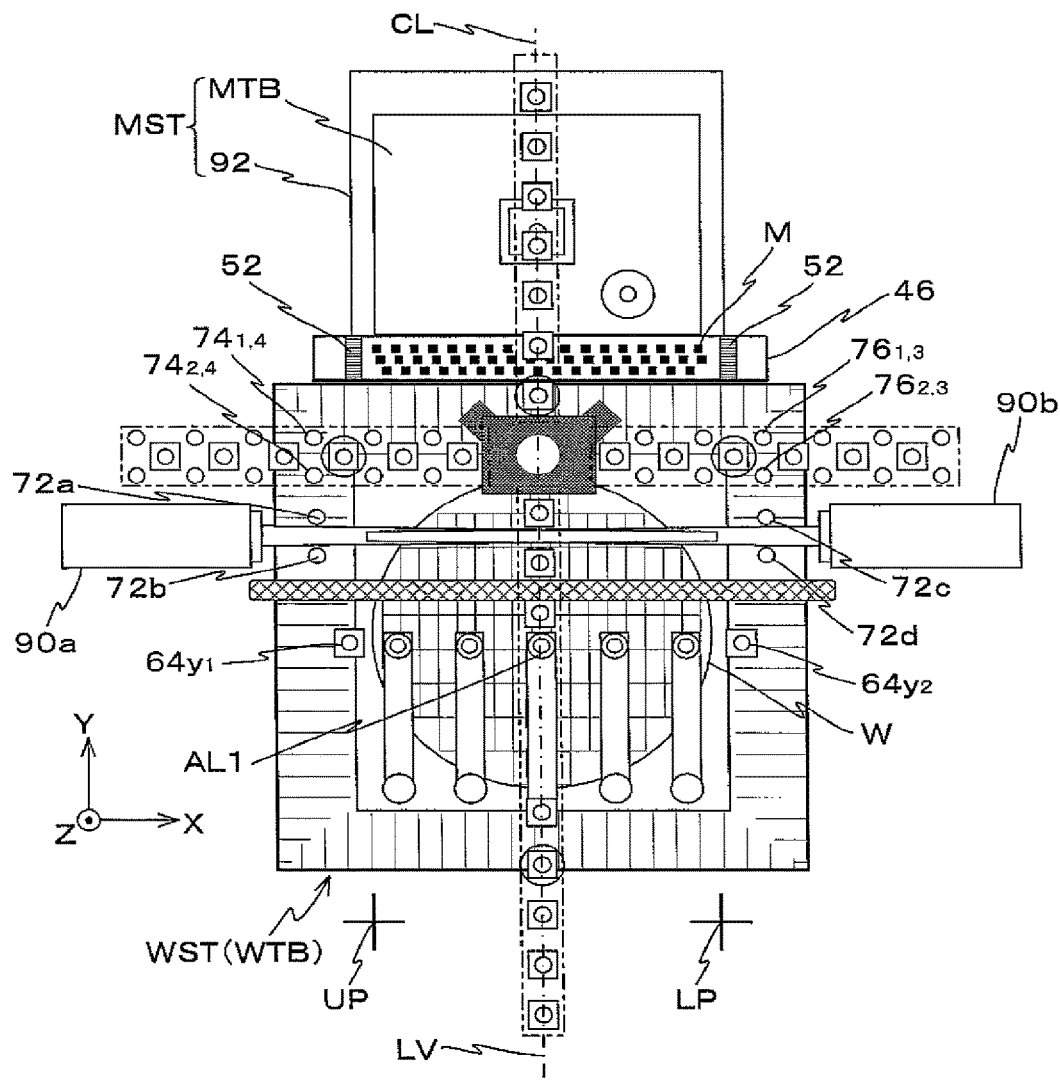
FIG. 32 is a view showing a state of the wafer stage and the measurement stage when at least one of the Pri-BCHK latter process and the focus calibration latter process is being performed.

Then, when both stages WST and MST reach the position with which measurement plate 30 is located directly below projection optical system PL shown in FIG. 32, main controller 20 performs the Pri-BCHK latter process and the focus calibration latter process. In this case, the Pri-BCHK latter process refers to a processing in which a projected image (aerial image) of a pair of measurement marks on reticle R projected by projection optical system PL is measured, using aerial image measurement unit 45 previously described which has aerial image measurement slit pattern SL formed on measurement plate 30, and the measurement results (aerial image intensity depending on the XY position of wafer table WTB) are stored in the internal memory. In this processing, the projected image of the pair of measurement marks is measured in an aerial image measurement operation by the slit scan method, using a pair of aerial image measurement slit patterns SL, similar to the method disclosed in, U.S. Patent Application Publication No. 2002/0041377 description and the like. Further, the focus calibration latter process refers to a processing in which main controller 20 measures the aerial image of a measurement mark formed on a mark plate (not shown) on reticle R or on reticle stage RST using aerial image measurement unit 45, while controlling the position (Z position) of measurement plate 30 (wafer table WTB) related to the optical axis direction of projection optical system PL, based on the surface position information of wafer table WTB (wafer stage WST) measured by Z sensors 72a, 72b, 72c, and 72d, and then measures the best focus position of projection optical system PL based on the measurement results, as shown in FIG. 32. For example, the measurement operation of the projected image of the measurement mark is disclosed in, for example, the pamphlet of International Publication No. WO 2005/20834 and the like. While moving measurement plate 30 in the Z-axis direction, main controller 20 takes in the measurement values of Z sensors $74_{1,4}$, $74_{2,4}$, $76_{1,3}$, and $76_{2,3}$ in synchronization with taking in the output signal from aerial image measurement unit 45. Then, main controller 20 stores the values of Z sensors $74_{1,4}$, $74_{2,4}$, $76_{1,3}$, and $76_{2,3}$ corresponding to the best focus position of projection optical system PL in a memory (not shown). Incidentally, the reason why the position (Z position) related to the optical axis direction of projection optical system PL of measurement plate 30 (wafer stage WST) is controlled using the surface position information measured in the focus calibration latter process by Z sensors 72a, 72b, 72c, and 72d is because the focus calibration latter process is performed during the focus mapping previously described.

In this case, because liquid immersion area 14 is formed between projection optical system PL and measurement plate 30 (wafer table WTB), the measurement of the aerial image is performed via projection optical system PL and water Lq. Further, because measurement plate 30 and the like is installed in wafer stage WST (wafer table WTB), and the light receiving element and the like is installed in measurement stage MST, the measurement of the aerial image is performed while maintaining the contact state (or proximity state) of wafer stage WST and measurement stage MST, as shown in FIG. 32. By the measurement described above, measurement values (more specifically, surface position information of wafer table WTB) of Z sensors $74_{1,4}$, $74_{2,4}$, $76_{1,3}$, and $76_{2,3}$ corresponding to the best focus position of projection optical system PL are obtained, in a state where the straight line (the center line) in the Y-axis direction passing through the center of wafer table WTB coincides with straight line LV previously described.

Then, main controller 20 computes the baseline of primary alignment system AL1, based on the results of the Pri-BCHK former process and the results of the Pri-BCHK latter process described above. With this, based on the relation between the measurement values (surface position information of wafer table WTB) of Z sensors 72a, 72b, 72c, and 72d obtained in the focus calibration former process described above and the detection results (surface position information) of the detection point on the surface of measurement plate 30 of the multipoint AF system (90a, 90b), and the measurement values (more specifically, surface position information of wafer table WTB) of Z sensors $74_{1,4}$, $74_{2,4}$, $76_{1,3}$, and $76_{2,3}$ corresponding to the best focus position of projection optical system PL which are obtained in the focus calibration latter process described above, main controller 20 obtains the offset at a representative detection point (the detection point located in or around the center, among a plurality of detection points) of the multipoint AF system (90a, 90b) with respect to the best focus position of projection optical system PL and adjusts the detection origin of the multipoint AF system, for example, by an optical method so that the offset becomes zero.

In this case, from the viewpoint of improving throughput, only one processing of the Pri-BCHK latter process described above and the focus calibration latter process can be performed, or the procedure can move on to the next processing without performing both processing. As a matter of course, in the case the Pri-BCHK latter process is not performed, the Pri-BCHK former process described earlier also does not have to be performed, and in this case, main controller 20 only has to move wafer stage WST from loading position LP to a position where the alignment marks arranged in the first alignment shot areas are detected. Incidentally, in the case Pri-BCHK process is not performed, the baseline which is measured by a similar operation just before the exposure of a wafer exposed earlier than wafer W subject to exposure is used. Further, when the focus calibration latter process is not performed, similar to the baseline, the best focus position of projection optical system PL which is measured just before the exposure of a preceding wafer is used.

Incidentally, in the state shown in FIG. 32, the focus mapping previously described is being continued.

Figure 33:
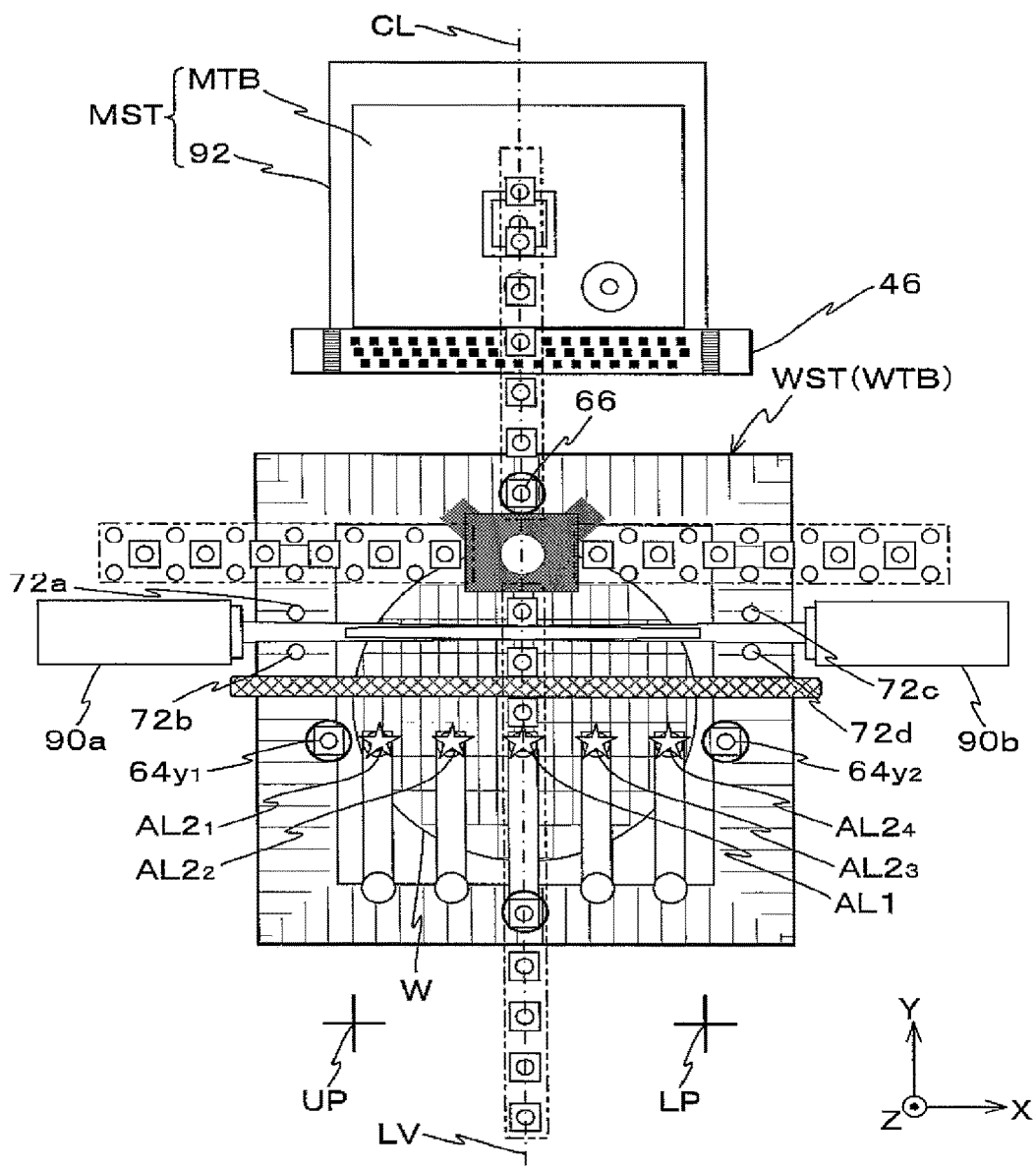
FIG. 33 is a view showing a state of the wafer stage and the measurement stage when alignment marks arranged in five third alignment shot areas are being simultaneously detected using alignment systems AL1 and $AL2_1$ to $AL2_4$.

When wafer stage WST reaches the position shown in FIG. 33 after a predetermined time by movement in the +Y direction of both stages WST and MST in the contact state (or proximity state) described above, main controller 20 stops wafer stage WST at that position, while also making measurement stage MST continue the movement in the +Y direction. Then, main controller 20 almost simultaneously and individually detects the alignment marks arranged in the five third alignment shot areas (refer to star-shaped marks in FIG. 33) using five alignment systems AL1 and $AL2_1$ to $AL2_4$, links the detection results of five alignment systems AL1 and $AL2_1$ to $AL2_4$ and the measurement values of at least three encoders (measurement values after correction by the correction information) out of the four encoders at the time of the detection and stores them in the internal memory. At this point in time, the focus mapping is being continued.

Meanwhile, after a predetermined period of time from the suspension of wafer stage WST described above, measurement stage MST and wafer stage WST moves from the contact state (or proximity state) into a separation state. After moving into the separation state, main controller 20 stops the movement of measurement stage MST when measurement stage MST reaches an exposure start waiting position where measurement stage MST waits until exposure is started.

Next, main controller 20 starts to move wafer stage WST in the +Y direction toward a position where alignment marks arranged in three fourth alignment shot areas are detected. At this point in time, the focus mapping is being continued. Meanwhile, measurement stage WST is waiting at the exposure start waiting position described above.

Figure 34:
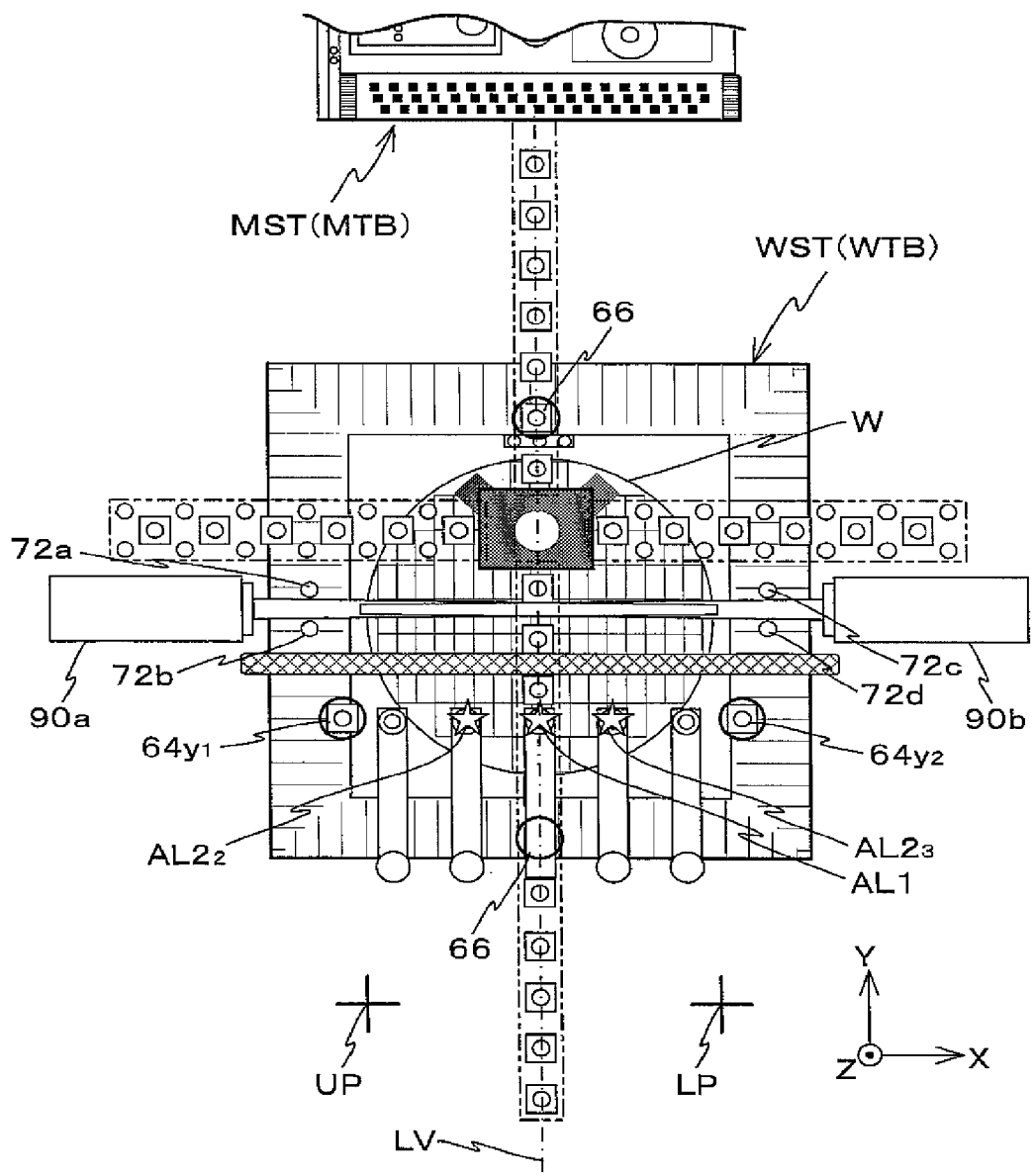
FIG. 34 is a view showing a state of the wafer stage and the measurement stage when alignment marks arranged in three fourth alignment shot areas are being simultaneously detected using alignment systems AL1, $AL2_2$ and $AL2_3$.

Then, when wafer stage WST reaches the position shown in FIG. 34, main controller 20 immediately stops wafer stage WST, and almost simultaneously and individually detects the alignment marks arranged in the three fourth alignment shot areas on wafer W (refer to star-shaped marks in FIG. 34) using primary alignment system AL1 and secondary alignment systems $AL2_2$ and $AL2_3$, links the detection results of three alignment systems AL1, $AL2_2$ and $AL2_3$ and the measurement values of at least three encoders (measurement values after correction by the correction information) out of the four encoders at the time of the detection, and stores them in the internal memory. Also at this point in time, the focus mapping is being continued, and measurement stage MST is still waiting at the exposure start waiting position. Then, using the detection results of a total of 16 alignment marks and the measurement values (measurement values after the correction by each correction information) of the corresponding encoders obtained in the manner described above, main controller 20 computes array information (coordinate values) of all the shot areas on wafer W on a coordinate system (for example, an XY coordinate system whose origin is placed at the center of wafer table WTB) that is set by the measurement axes of the four encoders, using the EGA method disclosed in, for example, U.S. Pat. No. 4,780,617 description and the like.

Figure 35:
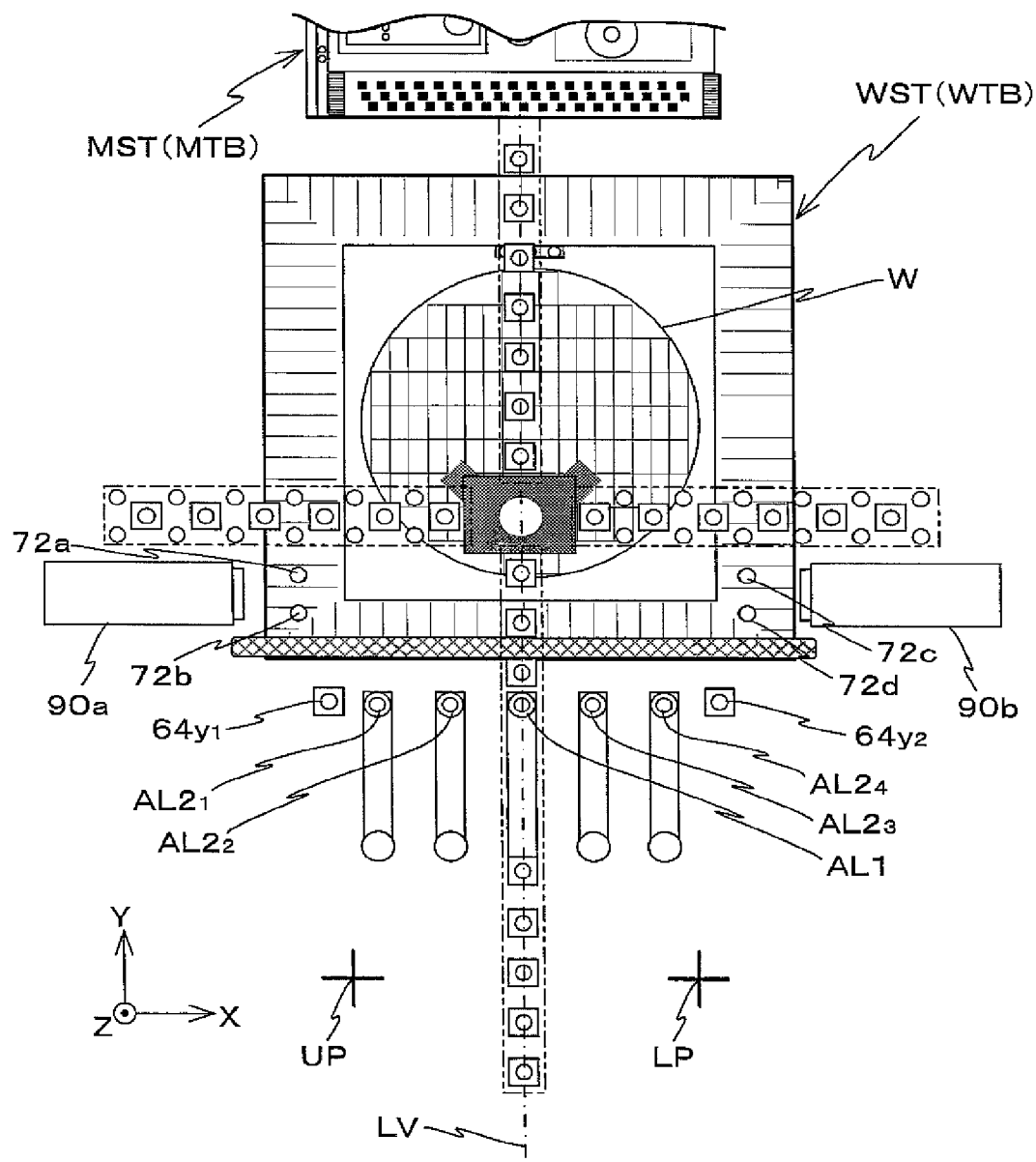
FIG. 35 is a view showing a state of the wafer stage and the measurement stage when the focus mapping has ended.

Next, main controller 20 continues the focus mapping while moving wafer stage WST in the +Y direction again. Then, when the detection beam from the multipoint AF system (90a, 90b) begins to miss the wafer W surface, as is shown in FIG. 35, main controller 20 ends the focus mapping. After that, based on the results of the wafer alignment (EGA) described earlier performed in advance, the latest baselines of the five alignment systems AL1 and $AL2_1$ to $AL2_4$, and the like, main controller 20 performs exposure by the step-and-scan method in a liquid immersion exposure and sequentially transfers a reticle pattern to a plurality of shot areas on wafer W. Afterwards, similar operations are repeatedly performed so as to expose the remaining wafers within the lot.

As is described in detail above, according to exposure apparatus 100 related to the embodiment, for example, while the lot is being processed, main controller 20 measures the positional information (including the θz rotation) of wafer stage WST within the surface (the movement plane) parallel to the XY plane by three heads (encoders), which at least include one each of an X head (X encoder) and a Y head (Y encoder) of the encoder system. Then, based on the measurement results of the positional information and the positional information ((X, Y) coordinate value) in the movement plane of the irradiation point of (the measurement beams outgoing from) the three heads used for measuring the positional information, main controller 20 drives wafer stage WST within the XY plane. In this case, main controller 20 drives wafer stage WST within the XY plane, while computing the positional information of wafer stage WST within the XY plane using the affine transformation relation. Accordingly, it becomes possible to control the movement of wafer stage WST with good precision while switching the head (encoder) used for control during the movement of wafer stage WST, using the encoder system including head units 62A to 62D which respectively have a plurality of Y heads 64 or a plurality of X heads 66.

Further, according to exposure apparatus 100 related to the embodiment, prior to starting the lot processing in which wafer stage WST is driven, such as, for example, during the start-up of the apparatus, as one of a series of calibration of the encoder system that measures the positional information of wafer stage WST in the XY plane, the calibration process of the head position previously described is performed for each head. More specifically, for each head of the encoder system, main controller 20 acquires a measurement value (an X position of wafer stage WST or a Y position) of the head when rotating wafer stage WST at a predetermined angle θ in the XY plane and a measurement value of the rotation angle of wafer stage WST in the XY plane by interferometer system 118, and based on the measurement values and the rotation angle (e) of each head that has been acquired, computes the positional information of the measurement beam emitted from the head in a direction orthogonal to the measurement direction. More specifically, for each of the plurality of Y heads (64, $64_{y1}$, $64_{y2}$) of the encoder system, main controller 20 computes the X positional information of the irradiation point of the measurement beam, and for each of the plurality of X heads 66, main controller 20 computes the Y positional information of the irradiation point of the measurement beam. Then, main controller 20 stores the information that has been computed, along with the design position information related to the measurement direction of the irradiation point of the measurement beam for each head in memory 34.

And then, when driving wafer stage WST as is described above, main controller 20 uses the positional information in the direction orthogonal to the measurement direction of the irradiation point of the measurement beam of each head and the design positional information in the measurement direction of the irradiation point of the measurement beam of each head stored in memory 34, and drives wafer stage WST within the XY plane while computing the positional information of wafer stage WST within the XY plane using the affine transformation relation.

Further, main controller 20 switches an encoder (a head) used for measuring the positional information of wafer stage WST in the XY plane from one of the encoders of the three encoders to another encoder, so that the position of wafer stage WST within the XY plane is maintained before and after the switching. Because of this, although the encoder which is used for the control of the position of wafer stage WST has been switched, the position of wafer stage WST within the XY plane is maintained before and after the switching, which makes an accurate linkage possible. Accordingly, it becomes possible to move wafer stage WST two-dimensionally, precisely along a predetermined course, while performing linkage between a plurality of encoders.

Further, according to exposure apparatus 100 of the embodiment, in the case of moving wafer stage WST in a predetermined direction, such as, for example, the Y-axis direction at the time of wafer alignment time or exposure, wafer stage WST is driven in the Y-axis direction, based on the measurement information of the encoder system and the positional information (including inclination information, e. g., rotation information in the θx direction) of wafer stage WST in a direction different from the Y-axis direction, the characteristic information (e. g., the degree of flatness of the grating surface, and/or a grating formation error) of the scale. More specifically, wafer stage WST is driven to compensate for the measurement errors of the encoder system (encoders 70A and 70C) caused by the displacement (including the inclination) of wafer stage WST in a direction different from the Y-axis direction and the scale. In the embodiment, main controller 20 drives wafer stage WST in the Y-axis direction, based on the measurement values of encoders 70A and 70C that measure positional information of wafer stage WST in a predetermined direction, such as the Y-axis direction, the stage position induced error correction information (the correction information which is computed by formula (10) previously described) that corresponds to the positional information of wafer stage WST in a direction different (a direction besides the measurement direction) from the Y-axis direction at the time of measurement, the correction information (the correction information which takes into consideration the unevenness (degree of flatness) of the Y scale) of the grating pitch of the Y scale, and the correction information of the warp of grid line 38 of the Y scale. In the manner described above, stage drive system 124 is controlled, based on the measurement values of encoders 70A and 70C whose measurement errors of encoders 70A and 70C due to the relative displacement of scales $39Y_1$ and $39Y_2$ and Y head 64 in the direction besides the measurement direction, the grating pitch of Y scales $39Y_1$ and $39Y_2$, and the warp of grid line 38 have been corrected by each of correction information, and wafer stage WST is driven in the Y-axis direction. In this case, the count values of encoders 70A and 70C are substantially the same results as when an ideal grating (diffraction grating) is measured with an ideal encoder (head). An ideal grating (diffraction grating), here, refers to a grating whose surface of the grating is parallel to the movement plane (the surface parallel to the XY plane) of the stage and is a completely flat surface, and the pitch direction of the grating is parallel to the beam of the interferometer and the distance between the grid lines is completely equal. An ideal encoder (head) refers to a head whose optical axis is perpendicular to the movement plane (and the XY plane) of the stage and whose count values do not change by Z displacement, leveling, yawing and the like.

Further, in the case wafer stage WST is moved in the X-axis direction, wafer stage WST is driven in the X-axis direction, based on the measurement information of the encoder system, the positional information (including inclination information, e. g., rotation information in the θy direction) of wafer stage WST in a direction different from the X-axis direction, and the characteristic information (e.g., the degree of flatness of the grating surface, and/or a grating formation error) of the scale. More specifically, wafer stage WST is driven to compensate for the measurement errors of the encoder system (encoders 70B and 70D) caused by the displacement (including the inclination) of wafer stage WST in a direction different from the X-axis direction. In the embodiment, main controller 20 drives wafer stage WST in the X-axis direction, based on the measurement values of encoders 70B and 70D which measure the positional information of wafer stage WST in the X-axis direction, the positional information of wafer stage WST in a direction different from the X-axis direction at the time of the measurement (non-measurement direction), such as, for example, the stage position induced error correction information (the correction information which is computed by formula (11) previously described) that corresponds to the positional information of wafer stage WST in the θy direction, θz direction, and the Z-axis direction measured by Z interferometers 43A and 43B of interferometer system 118, the correction information (the correction information which takes into consideration the unevenness (degree of flatness) of the X scales) of the grating pitch of the X scales, and the correction information of the warp of grid line 37 of the X scales. In the manner described above, stage drive system 124 is controlled, based on the measurement values of encoders 70B and 70D whose measurement errors of encoders 70B and 70D due to the relative displacement of scales $39X_1$ and $39X_2$ and X head 66 in the direction besides the measurement direction, the grating pitch of X scales $39X_1$ and $39X_2$, and the warp of grid line 37 have been corrected by each of correction information, and wafer stage WST is driven in the X-axis direction. In this case, the count values of encoders 70B and 70D are substantially the same results as when an ideal grating (diffraction grating) is measured with an ideal encoder (head). Accordingly, it becomes possible to drive wafer stage WST using an encoder in a desired direction with good precision, without being affected by the relative motion in directions other than the direction (measurement direction) of the head and the scale to be measured, without being affected by the unevenness of the scale, and without being affected by the grating pitch of the scale and the grating warp.

Further, according to exposure apparatus 100 of the embodiment, for relative movement between illumination light IL irradiated on wafer W via reticle R, projection optical system PL, and water Lq from illumination system 10 and wafer W, main controller 20 drives wafer stage WST on which wafer W is placed with good precision, based on the measurement values of each encoder described above, the stage position induced error correction information of each encoder corresponding to the positional information of the wafer stage in the non-measurement direction at the time of the measurement, and the correction information of the grating pitch of each scale and the correction information of the grid line.

Accordingly, by scanning exposure and liquid immersion exposure, it becomes possible to form a desired pattern of reticle R in each shot area on the wafer with good precision.

Further, in the embodiment, as it has been described earlier based on FIGS. 28 and 29, prior to the measurement (EGA alignment measurement) of the alignment marks arranged in the three first alignment shot areas on wafer W by alignment systems AL1, $AL2_2$, and $AL2_3$, main controller 20 switches the measurement unit used for the position control of wafer stage WST from interferometer system 118 to the encoder system (switches the control of the position of wafer table WTB within the XY plane from the irregular control previously described to the control based on the measurement values of at least three encoders out of encoders 70B and 70D and encoders 70A and 70C). According to this, even if there are some errors in the measurement values of the X position and the Y position of wafer stage WST by the encoder system just after the switching, there is an advantage of the errors being consequently canceled by the EGA performed next.

Further, according to the embodiment, on acquiring the stage position induced error correction information of the measurement values of the encoder previously described, main controller 20 changes wafer stage WST into a plurality of different attitudes, and for each attitude, in a state where the attitude of wafer stage WST is maintained based on the measurement results of interferometer system 118, moves wafer stage WST in the Z-axis direction in a predetermined stroke range while irradiating a detection light from head 64 or 66 of the encoder on the specific area of scales $39Y_1$, $39Y_2$, $39X_1$ or $39X_2$, and samples the measurement results of the encoder during the movement. According to this, change information (for example, an error characteristics curve as shown in the graph in FIG. 12) of the measurement values of the encoder corresponding to the position in the direction (Z-axis direction) orthogonal to the movement plane of wafer stage WST for each attitude can be obtained.

Then, by performing a predetermined operation based on this sampling result, namely the change information of the measurement values of the encoder corresponding to the position of wafer stage WST in the Z-axis direction for each attitude, main controller 20 obtains the correction information of the measurement values of the encoder corresponding to the positional information of wafer stage WST in the non-measurement direction. Accordingly, the stage position induced error correction information for correcting the measurement errors of the encoder due to a relative change between the head and the scale in the non-measurement direction can be determined by a simple method.

Further, in the embodiment, in the case of deciding the correction information above, for a plurality of heads that configure the same head unit, such as, for example, a plurality of Y heads 64 that configure head unit 62A, a detection light is irradiated from each Y head 64 on the same specific area of the corresponding Y scale $39Y_1$ and a sampling is performed on the measurement results of the encoder described above, and because the correction information of each encoder configured by each Y head 64 and Y scale $39Y_1$ is decided based on the sampling result, by using this correction information, a geometric error which occurs because of the gradient of the head can also be consequently corrected. In other words, when main controller 20 obtains by the correction information with the plurality of encoders corresponding to the same scale as the object, it obtains the correction information of the encoder serving as the object taking into consideration the geometric error which occurs by the gradient of the head of the object encoder when wafer stage WST is moved in the Z-axis direction. Accordingly, in the embodiment, a cosine error caused by different gradient angles in a plurality of heads is also not generated. Further, even if a gradient does not occur in Y head 64, for example, when a measurement error occurs in an encoder caused by the optical properties (telecentricity) of the head or the like, obtaining the correction information similarly can prevent the measurement error from occurring, which in turn prevents the deterioration of the position control precision of wafer stage WST. That is, in the embodiment, wafer stage WST is driven so as to compensate for the measurement errors (hereinafter also referred to as a head induced error) of the encoder system which occur due to the head unit. Incidentally, for example, correction information of the measurement values of the encoder system can be computed, based on the characteristic information (for example, including the slant of the head and/or the optical properties and the like) of the head unit.

Incidentally in the embodiment above, the case has been described where main controller 20 measures the positional information (including the θz rotation) of wafer stage WST in the surface (movement plane) parallel to the XY plane using three heads (an encoder) of the encoder system, and the position of wafer stage WST in the XY plane is controlled, based on a measurement result of the positional information and positional information ((X, Y) coordinate value) of the three heads (the irradiation point of the measurement beam) in the movement plane used for measuring the positional information, however, the present invention is not limited to this. For example, in the case when a movable body is not allowed to rotate within the movement plane, the degree of freedom that the movable body has is only two degrees of freedom (X, Y) in the movement plane, however, the present invention can be applied even to such a case. That is, even in such a case, when the position of the movable body in the movement plane (the surface parallel to the XY plane) is controlled using an encoder, by using the accurate positional information as positional information of each head in the movement plane, a highly precise position control becomes possible.

Incidentally, in the embodiment above, the measurement values of the encoder system were corrected based on the correction information previously described so as to compensate for the measurement error due to the position of the detection point of the head or the positional shift of the head, however, the present invention is not limited to this, and, for example, the target position to which wafer stage WST is to be positioned can be corrected based on the correction information, while driving wafer stage WST based on the measurement values of the encoder system. Or, especially in the exposure operation, the position of reticle stage RST can be corrected based on the correction information previously described, while, for example, driving wafer stage WST based on the measurement values of the encoder system.

Further, in the embodiment above, as the positional information of the detection point of the head, the position in the direction besides the measurement direction or the positional shift amount from the design value is obtained, however, in the measurement from the second time onward, the amount of change (that is, the positional shift from the previous measurement value) of the position of the detection point of the measurement this time from the position of the detection point from the previous measurement can be obtained. Further, in the embodiment above, when performing the switching and the linkage process of the head previously described, as the positional information of the detection point of the head, the actual measurement value was used for the direction besides the measurement direction and the design value was used for the measurement direction, however, the present invention is not limited to this, and the position of the head can also be actually measured for the measurement direction, and in such a case, the positional information which was actually measured can be used instead of the design value previously described. The positional information of the detection point of the head which was actually measured can be used in a process besides the linkage process, such as, for example, the correction of the encoder measurement value.

Incidentally, in the embodiment above, when the wafer stage is moved in the X-axis direction, for example, the switching of the head and linkage process of head unit 62A and head unit 62C is performed simultaneously, or a part of the process is performed in parallel, however, the process can be performed in head units 62A and 62C at a different timing. In this case, for example, the distance between adjacent heads is to be the same in head units 62A and 62C, and the position of head units 62A and 62C placed in the X-axis direction can be shifted.

Incidentally, in the embodiment above, an invention related to the switching of the head of the encoder and the linkage of the measurement value, an invention related to the correction of various measurement errors (e. g., stage position induced error, head induced error, scale induced error and the like) of the encoder system, an invention (invention about the reset of the encoder system) in which the position control of the wafer stage using the encoder system was started once more after every wafer exchange, an invention related to the switching timing in which the switching operation of the encoder (head) is executed at a timing in synchronization with the position control of the wafer stage, an invention to prepare the schedule for the switching timing based on the movement course of the wafer stage and the like were carried out by the same exposure apparatus. However, these inventions can be executed alone or in any combination.

Further, one or a combination of two or more of the stage position induced error, head induced error (the measurement error of the encoder system that occurs not by the head position but due to the head unit as in the inclination of the head or the optical properties (such as telecentricity)), and the scale induced error can be performed, combined with the correction of the head position induced error.

Incidentally, in each of the embodiments above, in order to simplify the description, main controller 20 had control over each part of the exposure apparatus such as the stage system and the like, however, the present invention is not limited to this, and it is a matter of course that at least a part of the control performed by main controller 20 can be shared with a plurality of controllers. For example, a stage controller, which controls wafer stage WST based on the measurement values of the encoder system, the Z sensor and the interferometer system, can be arranged to operate under main controller 20. Further, the control that main controller 20 performs does not necessarily have to be realized by hardware, and the control can be realized by software using a computer program that sets the operation of main controller 20 or each operation of some controllers that share the control as previously described.

Incidentally, the configuration and the placement of the encoder system, the interferometer system, the multipoint AF system, the Z sensor and the like in the embodiment above is an example among many, and it is a matter of course that the present invention is not limited to this. For example, in the embodiment above, an example was indicated of a case where the pair of Y scales $39Y_1$ and $39Y_2$ used for the measurement of the position in the Y-axis direction and the pair of X scales $39X_1$ and $39X_2$ used for the measurement of the position in the X-axis direction are arranged on wafer table WTB, and corresponding to the scales, the pair of head units 62A and 62C is placed on one side and the other side of the X-axis direction of projection optical system PL, and the pair of head units 62B and 62D is placed on one side and the other side of the Y-axis direction of projection optical system. PL. However, the present invention is not limited to this, and of Y scales $39Y_1$ and $39Y_2$ used for the measurement of the position in the Y-axis direction and X scales $39X_1$ and $39X_2$ used for the measurement of the position in the X-axis direction, at least one of the scales can be arranged singularly on wafer table WTB, without being a pair, or, of the pair of head units 62A and 62C and the pair of head units 62B and 62D, at least one of the head units can be arranged, singularly. Further, the extension direction of the scale and the extension direction of the head unit are not limited to an orthogonal direction such as the X-axis direction and the Y-axis direction in the embodiment above, and it can be any direction as long as the directions intersect each other. Further, the periodic direction of the diffraction grating can be a direction orthogonal to (or intersecting with) the longitudinal direction of each scale, and in such a case, a plurality of heads of the corresponding head unit should be placed in a direction orthogonal to the periodic direction of the diffraction grating. Further, each head unit can have a plurality of heads placed without any gap in a direction orthogonal to the periodic direction of the diffraction grating.

Further, in the embodiment above, the case has been described where the grating section (the X scale and the Y scale) was placed on a surface of wafer stage WST parallel to the XY plane, or to be more specific, on the upper surface, however, the present invention is not limited to this, and the grating section can be placed as a matter of course on the lower surface, as well as the side surface, or a head can be arranged on the movable body side such as the wafer stage, and the a grating (a two-dimensional grating or a one-dimensional grating placed two-dimensionally) can be placed external to the movable body. In this case, when a Z sensor is also placed on the upper surface of the movable body, the grating externally placed can also be used as a reflection surface that reflects the measurement beam from the Z sensor.

Incidentally, in the embodiment above, rotation information (pitching amount) of wafer stage WST in the θx direction was measured by interferometer system 118, however, for example, the pitching amount can be obtained from the measurement values of either of the pair of Z sensors $74_{i,j}$ or $76_{p,q}$. Or, similar to head units 62A and 62C, for example, one Z sensor or a pair of Z sensors can be arranged in proximity each head of head units 62B and 62D, and the pitching amount can be obtained from X scales $39X_1$ and $39X_2$ and the measurement value of the Z sensors that face the scales, respectively. Accordingly, it becomes possible to measure the positional information of wafer stage WST in directions of six degrees of freedom, or more specifically, the X-axis, Y-axis, Z-axis, θx, θy, and θz directions using the encoder and the Z sensor previously described, without using interferometer system 118. The measurement of the positional information of wafer stage WST in directions of six degrees of freedom using the encoder and the Z sensor previously described can be performed not only in the exposure operation but also in the alignment operation and/or the focus mapping operation previously described.

Further, in the embodiment above, wafer stage WST was driven based on the measurement value of the encoder system, for example, in the case of exposure, however, for example, an encoder system the measures the position of reticle stage RST can be added, and reticle stage RST can be driven based on the correction information that corresponds to the measurement values of the encoder system and the positional information of the reticle stage in the non-measurement direction measured by reticle interferometer 116.

Further, in the embodiment above, the case has been described where the apparatus is equipped with one fixed primary alignment system and four movable secondary alignment systems, and alignment marks arranged in the 16 alignment shot areas on the wafer are detected by the sequence according to the five alignment systems. However, the secondary alignment system does not need to be movable, and, further, the number of the secondary alignment systems does not matter. The important thing is that there is at least one alignment system that can detect the alignment marks on the wafer.

Incidentally, in the embodiment above, the exposure apparatus which is equipped with measurement stage MST separately from wafer stage WST was described as in the exposure apparatus disclosed in the pamphlet of International Publication No. WO 2005/074014, however, the present invention is not limited to this, and for example, as is disclosed in, for example, Kokai (Japanese Patent Unexamined Application Publication) No. 10-214783 bulletin and the corresponding U.S. Pat. No. 6,341,007 description, and in the pamphlet of International Publication No. WO 98/40, 791 and the corresponding U.S. Pat. No. 6,262,796 description and the like, even in an exposure apparatus by the twin wafer stage method that can execute the exposure operation and the measurement operation (e. g., mark detection by the alignment system) almost in parallel using two wafer stages, it is possible to perform the position control of each wafer stage the encoder system (refer to FIG. 3 and the like) previously described. By appropriately setting the placement and length of each head unit not only during the exposure operation but also during the measurement operation, the position control of each wafer stage can be performed continuing the use of the encoder system previously described, however, a head unit that can be used during the measurement operation can be arranged, separately from head units (62A to 62D) previously described. For example, four head units can be placed in the shape of a cross with one or two alignment systems in the center, and during the measurement operation above, the positional information of each wafer stage WST can be measured using these head units and the corresponding scales. In the exposure apparatus by the twin wafer stage method, at least two scales each is arranged in the two wafer stages, respectively, and when the exposure operation of the wafer mounted on one of the wafer stages is completed, in exchange with the stage, the other wafer stage on which the next wafer that has undergone mark detection and the like at the measurement position is mounted is placed at the exposure position. Further, the measurement operation performed in parallel with the exposure operation is not limited to the mark detection of wafers and the like by the alignment system, and instead of this, or in combination with this, the surface information (step information) of the wafer can also be detected.

Incidentally, in the embodiment above, the case has been described where Sec-BCHK (interval) is performed using CD bar 46 on the measurement stage MST side while each wafer is exchanged on the wafer stage WST side, however, the present invention is not limited to this, and at least one of an illuminance irregularity measurement (and illuminance measurement), aerial image measurement, wavefront aberration measurement and the like can be performed using a measuring instrument (measurement member) of measurement stage MST, and the measurement results can be reflected in the exposure of the wafer performed later on. To be more concrete, for example, projection optical system PL can be adjusted by adjustment unit 68 based on the measurement results.

Further, in the embodiment above, a scale can also be placed on measurement stage MST, the position control of the measurement stage can be performed using the encoder system (head unit) previously described. More specifically, the movable body that performs the measurement of positional information using the encoder system is not limited to the wafer stage.

Incidentally, when reducing the size and weight of wafer stage WST is taken into consideration, it is desirable to place the scale as close as possible to wafer W on wafer stage WST, however, when the size of the wafer stage is allowed to increase, by increasing the size of the wafer stage and increasing the distance between the pair of scales that is placed facing the stage, positional information of at least two each in the X-axis and Y-axis directions, that is, a total of four positional information, can be measured constantly during the exposure operation. Further, instead of increasing the size of the wafer stage, for example, a part of the scale can be arranged so that it protrudes from the wafer stage, or, by placing the scale on the outer side of wafer stage main body using an auxiliary plate on which at least one scale is arranged, the distance between the pair of scales that face the stage can be increased as in the description above.

Further, in the embodiment above, in order to prevent deterioration in the measurement accuracy caused by adhesion of a foreign material, contamination, and the like to Y scales $39Y_1$ and $39Y_2$, and X scales $39X_1$ and $39X_2$, for example, a coating can be applied on the surface so as to cover at least the diffraction grating, or a cover glass can be arranged. In this case, especially in the case of a liquid immersion type exposure apparatus, a liquid repellent protection film can be coated on the scale (a grating surface), or a liquid repellent film can be formed on the surface (upper surface) of the cover glass. Furthermore, the diffraction grating was formed continually on substantially the entire area in the longitudinal direction of each scale, however, for example, the diffraction grating can be formed intermittently divided into a plurality of areas, or each scale can be configured by a plurality of scales. Further, in the embodiment above, an example was given in the case where an encoder by the diffraction interference method is used as the encoder, however, the present invention is not limited to this, and methods such as the so-called pickup method, the magnetic method and the like can be used, and the so-called scan encoders whose details are disclosed in, for example, U.S. Pat. No. 6,639,686 description and the like, can also be used.

Further, in the embodiment above, as the Z sensor, instead of the sensor by the optical pick-up method referred to above, for example, a sensor configured by a first sensor (the sensor can be a sensor by the optical pick-up method or other optical displacement sensors) that projects a probe beam on a measurement object surface and optically reads the displacement of the measurement object surface in the Z-axis direction by receiving the reflected light, a drive section that drives the first sensor in the Z-axis direction, and a second sensor (e. g. encoders and the like) that measures the displacement of the first sensor in the Z-axis direction can be used. In the Z sensor having the configuration described above, a mode (the first servo control mode) in which the drive section drives the first sensor in the Z-axis direction based on the output of the first sensor so that the distance between the measurement object surface, such as the surface of the scale and the first sensor in the Z-axis direction is always constant, and a mode (the first servo control mode) in which a target value of the second sensor is given from an external section (controller) and the drive section maintains the position of the first sensor in the Z-axis direction so that the measurement values of the second sensor coincides with the target value can be set. In the case of the first servo control mode, as the output of the Z sensor, the output of the measuring section (the second sensor) can be used, and in the case of the second servo control mode, the output of the second sensor can be used. Further, in the case of using such a Z sensor, and an encoder is employed as the second sensor, as a consequence, the positional information of wafer stage WST (wafer table WTB) in directions of six degrees of freedom can be measured using an encoder. Further, in the embodiment above, as the Z sensor, a sensor by other detection methods can be employed.

Further, in the embodiment above, the configuration of the plurality of interferometers used for measuring the positional information of wafer stage WST and their combination are not limited to the configuration and the combination previously described. The important thing is that as long as the positional information of wafer stage WST of the direction except for the measurement direction of the encoder system can be measured, the configuration of the interferometers and their combination does not especially matter. The important thing is that there should be a measurement unit (it does not matter whether it is an interferometer or not) besides the encoder system described above that can measure the positional information of wafer stage WST in the direction except for the measurement direction of the encoder system. For example, the Z sensor previously described can be used as such measurement unit.

Further, in the embodiment above, the Z sensor was arranged besides the multipoint AF system, however, for example, in the case the surface position information of the shot area subject to exposure of wafer W can be detected with the multipoint AF system on exposure, then the Z sensor does not necessarily have to be arranged.

Incidentally, in the embodiment above, pure water (water) was used as the liquid, however, it is a matter of course that the present invention is not limited to this. As the liquid, liquid that is chemically stable, having high transmittance to illumination light IL and safe to use, such as a fluorine-containing inert liquid may be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) the predetermined liquid to (with) pure water can be used. Alternatively, as the liquid, a liquid obtained by adding (mixing) base or acid such as $H^+$, $Cs^+$, $K^+$, $Cl^-$, $SO_4^{2-}$, or $PO_4^{2-}$ to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an $F_2$ laser is used as the light source, fomblin oil can be selected.

Further, in the embodiment above, the recovered liquid may be reused, and in this case, a filter that removes impurities from the recovered liquid is preferably arranged in a liquid recovery unit, a recovery pipe or the like.

Further, in the embodiment above, the case has been described where the exposure apparatus is a liquid immersion type exposure apparatus, however, the present invention is not limited to this, and it can also be applied to a dry type exposure apparatus that performs exposure of wafer W without liquid (water).

Further, in the embodiment above, the case has been described where the present invention is applied to a scanning exposure apparatus by a step-and-scan method or the like. However, the present invention is not limited to this, but may also be applied to a static exposure apparatus such as a stepper. Even with the stepper or the like, by measuring the position of a stage on which an object subject to exposure is mounted by encoders, generation of position measurement error caused by air fluctuations can substantially be nulled likewise. Furthermore, even with the stepper, it becomes possible to set the position of the stage with high precision based on the measurement values of the encoder and each correction information previously described, and as a consequence, it becomes possible to transfer a reticle pattern onto an object with high precision. Further, the present invention can also be applied to a reduction projection exposure apparatus by a step-and-stitch method that synthesizes a shot area and a shot area, an exposure apparatus by a proximity method, a mirror projection aligner, or the like.

Further, the magnification of the projection optical system in the exposure apparatus of the embodiment above is not only a reduction system, but can also be either an equal magnifying system or a magnifying system, and projection optical system PL is not only a dioptric system, but can also be either a catoptric system or a catadioptric system, and in addition, the projected image may be either an inverted image or an upright image. Moreover, the exposure area to which illumination light IL is irradiated via projection optical system PL is an on-axis area that includes optical axis AX within the field of projection optical system PL. However, for example, as is disclosed in the pamphlet of International Publication No. WO 2004/107011, the exposure area can also be an off-axis area that does not include optical axis AX, similar to a so-called inline type catadioptric system, in part of which an optical system (catoptric system or catadioptric system) that has plural reflection surfaces and forms an intermediate image at least once is arranged, and which has a single optical axis. Further, the illumination area and exposure area described above are to have a rectangular shape. However, the shape is not limited to rectangular, and can also be circular arc, trapezoidal, parallelogram or the like.

Further, the light source of the exposure apparatus in the embodiment above is not limited to the ArF excimer laser, and a pulsed laser light source such as a KrF excimer laser (output wavelength 248 nm), an $F_2$ laser (output wavelength 157 nm), an $Ar_2$ laser (output wavelength 126 nm), or a $Kr_2$ laser (output wavelength 146 nm), or an ultra high-pressure mercury lamp that generates a bright line such as the g-line (wavelength 436 nm) or the i-line (wavelength 365 nm) can also be used as the light source. Further, a harmonic wave generating unit of a YAG laser or the like can also be used. Besides the sources above, as is disclosed in, for example, the pamphlet of International Publication No. WO 1999/46835 (the corresponding U.S. Pat. No. 7,023,610 description), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm, development of an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask is underway. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides such an apparatus, the present invention can also be applied to an exposure apparatus that uses charged particle beams such as an electron beam or an ion beam.

Further, in the embodiment above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage on which a wafer or a glass plate is mounted moves relatively with respect to the variable shaped mask, by driving the stage based on the measurement values of an encoder and each correction information previously described while measuring the position of the stage using the encoder system and performing the linkage operation between a plurality of encoders previously described, an equivalent effect as the embodiment described above can be obtained.

Further, as is disclosed in, for example, the pamphlet of International Publication No. WO 2001/035168, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns via a projection optical system and almost simultaneously performs double exposure of one shot area by one scanning exposure, as is disclosed in, for example, Kohyo (published Japanese translation of International Publication for Patent Application) No. 2004-519850 bulletin (the corresponding U.S. Pat. No. 6,611,316 description).

Further, an apparatus that forms a pattern on an object is not limited to the exposure apparatus (lithography system)

described above, and for example, the present invention can also be applied to an apparatus that forms a pattern on an object by an ink-jet method.

Incidentally, an object on which a pattern is to be formed (an object subject to exposure to which an energy beam is irradiated) in the embodiment above is not limited to a wafer, and can be other objects such as a glass plate, a ceramic substrate, a film member, or a mask blank.

The use of the exposure apparatus is not limited only to the exposure apparatus for manufacturing semiconductor devices, but the present invention can also be widely applied to an exposure apparatus for transferring a liquid crystal display device pattern onto a rectangular glass plate and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the movable body drive system, the movable body drive method, or the deciding method of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a two-dimensional plane such as a position setting apparatus for specimen or a wire bonding apparatus in other precision machines.

Further, the exposure apparatus (the pattern formation apparatus) of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of the various publications, the pamphlets of the International Publications, and the U.S. patent application Publication descriptions and the U.S. patent descriptions that are cited in the embodiment above and related to exposure apparatuses and the like are each incorporated herein by reference.

Next, an embodiment of a device manufacturing method in which the exposure apparatus (pattern formation apparatus) described above is used in a lithography process will be described.

Figure 36:
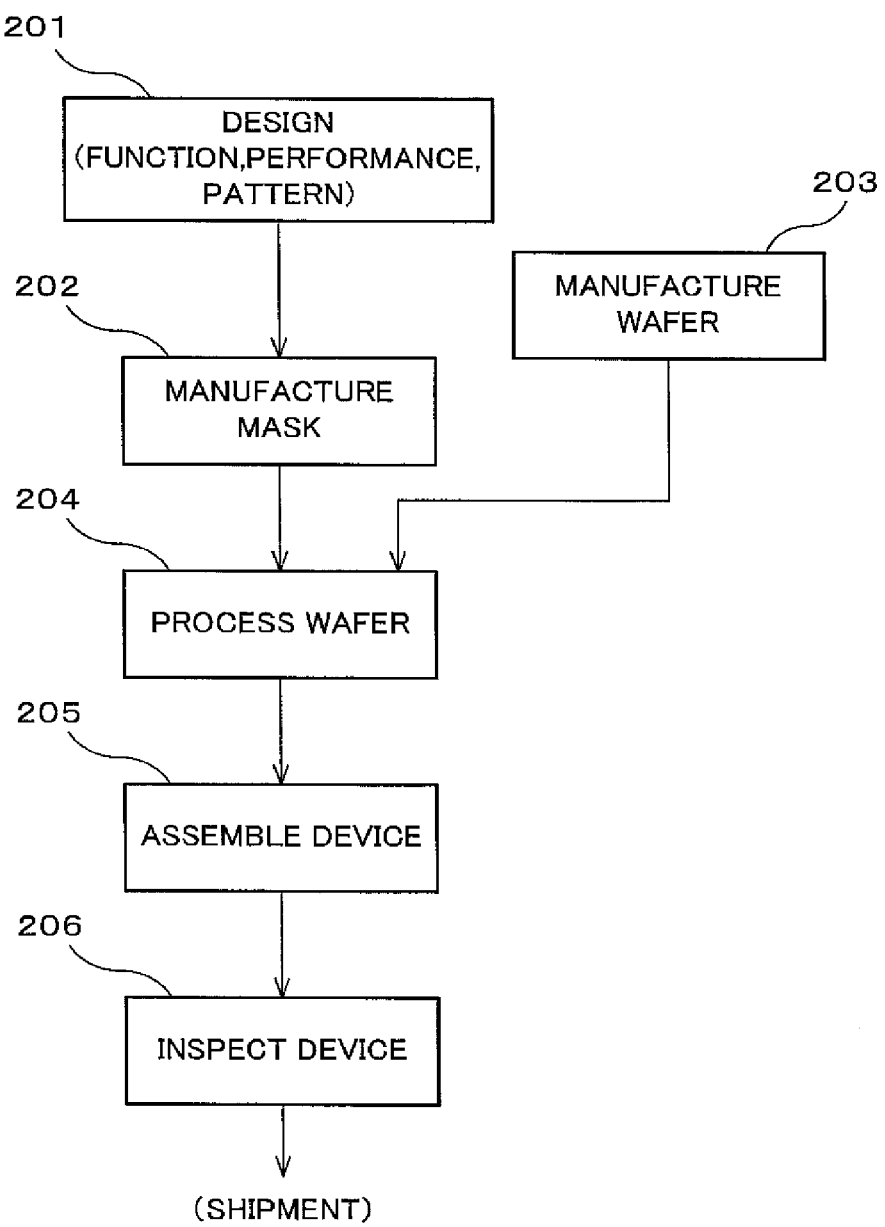
FIG. 36 is a flow chart for explaining an embodiment of the device manufacturing method.

FIG. 36 shows a flowchart of an example when manufacturing a device (a semiconductor chip such as an IC or an LSI, a liquid crystal panel, a CCD, a thin film magnetic head, a micromachine, and the like). As is shown in FIG. 36, first of all, in step 201 (design step), function and performance design of device (such as circuit design of semiconductor device) is performed, and pattern design to realize the function is performed. Then, in step 202 (a mask making step), a mask (reticle) is made on which the circuit pattern that has been designed is formed. Meanwhile, in step 203 (a wafer fabrication step), wafers are manufactured using materials such as silicon.

Next, in step 204 (wafer processing step), the actual circuit and the like are formed on the wafer by lithography or the like in a manner that will be described later, using the mask and the wafer prepared in steps 201 to 203. Then, in step 205 (device assembly step), device assembly is performed using the wafer processed in step 204. Step 205 includes processes such as the dicing process, the bonding process, and the packaging process (chip encapsulation), and the like when necessary.

Finally, in step 206 (an inspecting step), the operation check test of a device made by step 205, the durability test are checked. After these processes, the devices are completed and are shipped out.

Figure 37:
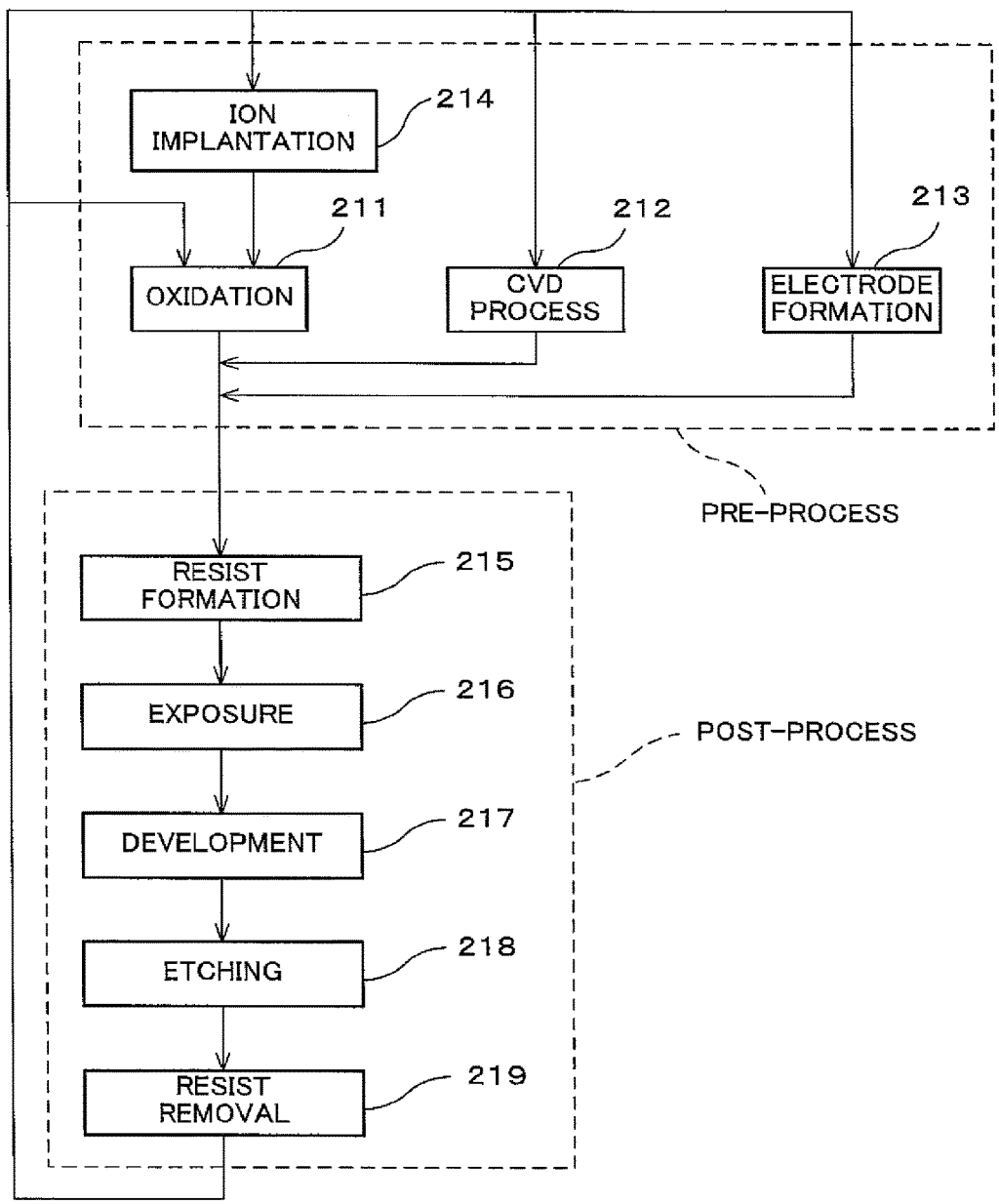
FIG. 37 is a flowchart used to explain a specific example of step 204 in FIG. 36.

FIG. 37 is a flowchart showing a detailed example of step 204 described above. In FIG. 37, in step 211 (an oxidation step), the surface of the wafer is oxidized. In step 212 (CDV step), an insulating film is formed on the wafer surface. In step 213 (an electrode formation step), an electrode is formed on the wafer by deposition. In step 214 (an ion implantation step), ions are implanted into the wafer. Each of the above steps 211 to step 214 constitutes the preprocess in each step of wafer processing, and the necessary processing is chosen and is executed at each stage.

When the above-described preprocess ends in each stage of wafer processing, post-process is executed as follows. First of all, in the post-process, first in step 215 (a resist formation step), a photosensitive agent is coated on the wafer. Then, in step 216 (exposure step), the circuit pattern of the mask is transferred onto the wafer by the exposure apparatus (pattern formation apparatus) described above and the exposure method (pattern formation method) thereof. Next, in step 217 (development step), the wafer that has been exposed is developed, and in step 218 (etching step), an exposed member of an area other than the area where resist remains is removed by etching. Then, in step 219 (resist removing step), when etching is completed, the resist that is no longer necessary is removed.

By repeatedly performing the pre-process and the post-process, multiple circuit patterns are formed on the wafer.

By using the device manufacturing method of the embodiment described above, because the exposure apparatus (pattern forming apparatus) in the embodiment above and the exposure method (pattern forming method) thereof are used in the exposure step (step 216), exposure with high throughput can be performed while maintaining the high overlay accuracy. Accordingly, the productivity of highly integrated microdevices on which fine patterns are formed can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes a substrate with an illumination light via a projection optical system and a liquid, the apparatus comprising:
   a frame member that supports the projection optical system;
   a first detection system provided at the frame member, spaced apart from the projection optical system on one side in a first direction within a predetermined plane, the first detection system detecting a mark of the substrate, and the predetermined plane being orthogonal to an optical axis of the projection optical system;
   a first stage system having a first stage and a first drive system, the first stage being disposed above the projection optical system and holding a mask illuminated with the illumination light, and the first drive system including a first motor to drive the first stage;
   a liquid immersion member provided to surround a lens that is disposed closest to an image plane side, of a plurality of optical elements of the projection optical system, the liquid immersion member having a lower surface to which the substrate is disposed facing, and locally forming a liquid immersion area with the liquid under the lens;
   a base member disposed below the liquid immersion member;
   a second stage system having a second stage and a third stage that are disposed on the base member and a second drive system that includes a second motor to drive the second and the third stages, the second stage having a holder for holding the substrate;
   a measurement system having a first encoder system that measures positional information of the first stage and a second encoder system that measures positional information of the second and the third stages, in the second encoder system one of a grating section and heads being provided at the second stage and the other of the grating section and the heads being provided at the frame member so that the other of the grating section and the heads is disposed on an outer side of the liquid immersion member with respect to the projection optical system, the second encoder system measuring the positional information of the second stage with a plurality of the heads that face the grating section, and the grating section having a reflective grating that is periodic in a direction parallel to the predetermined plane; and
   a controller coupled to the first and the second stage systems and the measurement system, the controller controlling the first and the second drive systems based on correction information for compensating for a measurement error of the second encoder system that occurs due to the heads and measurement information of the first and the second encoder systems so that, in an exposure operation of the substrate, alignment between the mask and the substrate is performed based on detection information of the first detection system and scanning exposure in which the mask and the substrate are each moved relative to the illumination light is performed with the first direction serving as a scanning direction, and also the measurement error is compensated for, wherein the controller:
   controls the second drive system so that the second and the third stages are relatively moved in order to cause the second stage to come close, from the one side in the first direction, to the third stage that is placed facing the projection optical system, and so that the second and the third stages that have come close together are relatively moved from the one side to the other side in the first direction with respect to the liquid immersion member in order to place the second stage to face the projection optical system instead of the third stage while substantially maintaining the liquid immersion area under the lens; and
   controls the second drive system so that, in the exposure operation, the second stage is moved from the one side to the other side in the first direction with respect to the liquid immersion member while facing the liquid immersion member, in order to cause the substrate to be placed facing the lower surface of the liquid immersion member by the second stage, and perform the scanning exposure via the projection optical system and the liquid of the liquid immersion area, from an area located on the one side in the first direction, of a plurality of areas on the substrate.

2. The exposure apparatus according to claim 1, wherein the controller controls the second drive system so that, in the exposure operation, exposure of a step-and-scan method is performed with respect to areas disposed in line in a second direction, of the plurality of areas on the substrate, and the substrate is moved from the other side to the one side in the first direction, in the exposure of the step-and-scan method the scanning exposure and movement of the substrate in the second direction being repeated, and the second direction being orthogonal to the first direction within the predetermined plane.

3. The exposure apparatus according to claim 2, wherein a plate member is disposed on an upper surface of the second stage, and
the controller controls the second drive system so that the liquid immersion area is located on the plate member by movement of the second stage that is disposed to face the projection optical system instead of the third stage, in order to detect the illumination light via the projection optical system, the liquid of the liquid immersion area and the plate member.

4. The exposure apparatus according to claim 3, wherein the controller controls the second drive system so that the scanning exposure is performed following detection of the illumination light.

5. The exposure apparatus according to claim 4, wherein the plate member is disposed on the other side in the first direction with respect to the holder on the upper surface of the second stage, and
the controller controls the second drive system so that the second stage is moved from the one side to the other side in the first direction following the detection of the illumination light and also the scanning exposure is performed from an area located on the one side in the first direction, of the plurality of areas on the substrate.

6. The exposure apparatus according to claim 3, wherein the second stage holds the substrate in a recessed portion on the upper surface of the second stage so that a surface of the substrate and the upper surface of the second stage are substantially flush, the holder being disposed in the recessed portion, and the second stage maintains, with the upper surface, at least a part of the liquid immersion area that moves off from the substrate held in the recessed portion.

7. The exposure apparatus according to claim 6, wherein the plate member is disposed in an opening of the upper surface of the second stage, the opening being different from the recessed portion.

8. The exposure apparatus according to claim 2, wherein the third stage holds a substrate, and the controller controls the second drive system so that an exposure operation of a plurality of substrates is performed using the second and the third stages alternately, and movement of the second and the third stages that have come close together is performed following the exposure operation.

9. The exposure apparatus according to claim 2, wherein the third stage has at least one measurement member that detects the illumination light via the projection optical system and the liquid of the liquid immersion area, and at least one of illuminance measurement, aerial image measurement and wavefront aberration measurement is performed by the at least one measurement member.

10. The exposure apparatus according to claim 2, wherein the grating section has four scale members each of which is disposed substantially parallel to the predetermined plane and has the reflective grating, and in the exposure operation, the positional information of the second stage is measured by at least three of the heads that face at least three of the four scale members, respectively.

11. The exposure apparatus according to claim 10, wherein one head of the at least three heads is switched to another head as the second stage is moved, and after the switching, the positional information of the second stage is measured by at least three heads that include remaining heads and the another head, the remaining heads excluding the one head of the at least three heads used before the switching.

12. The exposure apparatus according to claim 11, wherein before the switching, the positional information of the second stage is measured by three of the heads that face three of the four scale members, respectively, one head of the three heads is switched to the another head that is different from the three heads, and after the switching, the positional information of the second stage is measured by three heads that include two remaining heads and the another head, the two remaining heads excluding the one head of the three heads used before the switching.

13. The exposure apparatus according to claim 12, wherein the controller acquires correction information for the positional information obtained from the another head, based on the positional information obtained from the three heads used before the switching.

14. The exposure apparatus according to claim 13, wherein the correction information is acquired while four heads face the four scale members, respectively, the four heads including the three heads used before the switching and the another head.

15. The exposure apparatus according to claim 12, wherein the positional information of the second stage is measured by four or three of the heads that face four or three of the four scale members, respectively, and a change from one of a state and another state to the other of the state and the another state occurs, as the second stage is moved, wherein in the state, the four heads face the four scale members, respectively, and in the another state, the three heads face the three scale members, respectively.

16. The exposure apparatus according to claim 2, wherein during the exposure operation, as the second stage is moved, another head is used instead of one head of three of the heads that face the grating section, and the positional information of the second stage is measured by three heads including two remaining heads and the another head, instead of the three heads used previously, the another head being different from the three heads used previously, and the two remaining heads excluding the one head of the three heads used previously.

17. The exposure apparatus according to claim 16, wherein the controller acquires correction information for the positional information obtained from the another head, based on the positional information obtained from the three heads including the one head.

18. The exposure apparatus according to claim 17, wherein as the second stage is moved, the another head also faces the grating section, in addition to the three heads including the one head, and further the one head moves off from the grating section and the three heads including the another head face the grating section.

19. The exposure apparatus according to claim 18, wherein the grating section has four scale members each of which is disposed substantially parallel to the predetermined plane and has the reflective grating, and the another head faces another scale member of the four scale members, the another scale member being different from three scale members to which the three heads including the one head face, of the four scale members.

20. The exposure apparatus according to claim 19, wherein the second stage is provided with the plurality of heads, and is moved below the grating section.

21. The exposure apparatus according to claim 2, further comprising:

an aerial image measurement device that detects, via a slit pattern, an image projected via the projection optical system and the liquid of the liquid immersion area, the slit pattern being disposed on an upper surface of the second stage, wherein in detection of the image, the positional information of the second stage is measured by the second encoder system, and the controller controls the second drive system so that the image is projected on the slit pattern following movement of the second and the third stages that have come close together and also the scanning exposure is performed following the detection of the image.

22. The exposure apparatus according to claim 21, wherein a fiducial mark disposed on the upper surface of the second stage is detected by the first detection system, in a detection operation of the mark of the substrate and the fiducial mark, the positional information of the second stage is measured by the second encoder system, and in the alignment, detection information of the first detection system and the aerial image measurement device is used.

23. The exposure apparatus according to claim 22, further comprising:

a second detection system that is disposed at the frame member, spaced apart from the projection optical system on one side in the first direction, and detects positional information of the substrate in a third direction orthogonal to the predetermined plane, wherein in a detection operation of the substrate, the positional information of the second stage is measured by the second encoder system, and in the exposure operation, focus-leveling control of a pattern image of the mask and the substrate is performed based on detection information of the second detection system and the aerial image measurement device, the pattern image being projected via the projection optical system and the liquid of the liquid immersion area.

24. The exposure apparatus according to claim 23, wherein the controller controls the second drive system so that the image is detected, via the slit pattern, at each of positions different from each other in the third direction, in order to acquire best focus information of the projection optical system.

25. A device manufacturing method, comprising:

exposing a wafer as the substrate using the exposure apparatus according to claim 1; and developing the wafer that has been exposed.

26. An exposure method of exposing a substrate with an illumination light via a projection optical system and a liquid, the method comprising:

by a liquid immersion member provided to surround a lens that is disposed closest to an image plane side, of a plurality of optical elements of the projection optical system, locally forming a liquid immersion area with the liquid under the lens, the liquid immersion member having a lower surface to which the substrate is disposed facing;

holding a mask illuminated with the illumination light, with a first stage disposed above the projection optical system, positional information of the first stage being measured by a first encoder system;

holding the substrate with a second stage, of the second stage and a third stage that are disposed on a base member below the liquid immersion member, the third stage being placed facing the projection optical system, positional information of the second and the third stages being measured by a second encoder system, in the second encoder system one of a grating section and heads being provided at the second stage and the other of the grating section and the heads being provided at a frame member so that the other of the grating section and the heads is disposed on an outer side of the liquid immersion member with respect to the projection optical system, the positional information of the second stage being measured by a plurality of the heads that face the grating section, the grating section having a reflective grating that is periodic in a direction parallel to the predetermined plane, and the frame member supporting the projection optical system;

placing the second stage to face a first detection system so that a mark of the substrate is detected by the first detection system, the first detection system being provided at the frame member, spaced apart from the projection optical system on one side in a first direction within a predetermined plane that is orthogonal to an optical axis of the projection optical system;

relatively moving the second and the third stages so that the second stage comes close, from the one side in the first direction, to the third stage that is placed facing the projection optical system;

relatively moving the second and the third stages that have come close together from the one side to the other side in the first direction with respect to the liquid immersion member so that the second stage is placed to face the projection optical system instead of the third stage while substantially maintaining the liquid immersion area under the lens; and moving the first and the second stages based on correction information for compensating for a measurement error of the second encoder system that occurs due to the heads and measurement information of the first and the second encoder systems so that, in an exposure operation of the substrate, alignment between the mask and the substrate is performed based on detection information of the first detection system and scanning exposure in which the mask and the substrate are each moved relative to the illumination light is performed with the first direction serving as a scanning direction, and also the measurement error is compensated for, wherein in the exposure operation, the second stage is moved from the one side to the other side in the first direction with respect to the liquid immersion member while facing the liquid immersion member, so that the substrate is placed to face the lower surface of the liquid immersion member by the second stage, and the scanning exposure is performed via the projection optical system and the liquid of the liquid immersion area, from an area located on the one side in the first direction, of a plurality of areas on the substrate.

27. The exposure method according to claim 26, wherein in the exposure operation, exposure of a step-and-scan method is performed with respect to areas disposed in line in a second direction, of the plurality of areas on the substrate, and the substrate is moved from the other side to the one side in the first direction, in the exposure of the step-and-scan method the scanning exposure and movement of the substrate in the second direction being repeated, and the second direction being orthogonal to the first direction within the predetermined plane.

28. The exposure method according to claim 27, wherein a plate member is disposed on an upper surface of the second stage, and the second stage that is disposed to face the projection optical system instead of the third stage is moved so that the liquid immersion area is located on the plate member, in order to detect the illumination light via the projection optical system, the liquid of the liquid immersion area and the plate member.

29. The exposure method according to claim 28, wherein detection of the illumination light is performed prior to the scanning exposure.

30. The exposure method according to claim 29, wherein the second stage is moved from the one side to the other side in the first direction following the detection of the illumination light so that the scanning exposure is performed from an area located on the one side in the first direction, of the plurality of areas on the substrate.

31. The exposure method according to claim 28, wherein the second stage has a holder for holding the substrate, and holds the substrate in a recessed portion, in which the holder is disposed, on the upper surface of the second stage so that a surface of the substrate and the upper surface of the second stage are substantially flush, and at least a part of the liquid immersion area that moves off from the substrate held in the recessed portion is maintained by the upper surface.

32. The exposure method according to claim 27, wherein a substrate is held by the third stage, and an exposure operation of a plurality of substrates is performed using the second and the third stages alternately, and movement of the second and the third stages that have come close together is performed following the exposure operation.

33. The exposure method according to claim 27, wherein the third stage has at least one measurement member that detects the illumination light via the projection optical system and the liquid of the liquid immersion area, and at least one of illuminance measurement, aerial image measurement and wavefront aberration measurement is performed by the at least one measurement member.

34. The exposure method according to claim 27, wherein the grating section has four scale members each of which is disposed substantially parallel to the predetermined plane and has the reflective grating, and in the exposure operation, the positional information of the second stage is measured by at least three of the heads that face at least three of the four scale members, respectively.

35. The exposure method according to claim 34, wherein one head of the at least three heads is switched to another head as the second stage is moved, and after the switching, the positional information of the second stage is measured by at least three heads that include remaining heads and the another head, the remaining heads excluding the one head of the at least three heads used before the switching.

36. The exposure method according to claim 35, wherein before the switching, the positional information of the second stage is measured by three of the heads that face three of the four scale members, respectively, one head of the three heads is switched to the another head that is different from the three heads, and after the switching, the positional information of the second stage is measured by three heads that include two remaining heads and the another head, the two remaining heads excluding the one head of the three heads used before the switching.

37. The exposure method according to claim 36, wherein correction information for the positional information obtained from the another head is acquired, based on the positional information obtained from the three heads used before the switching.

38. The exposure method according to claim 37, wherein the positional information of the second stage is measured by four or three of the heads that face four or three of the four scale members, respectively, and a change from one of a state and another state to the other of the state and the another state occurs, as the second stage is moved, wherein in the state, the four heads face the four scale members, respectively, and in the another state, the three heads face the three scale members, respectively.

39. The exposure method according to claim 27, wherein during the exposure operation, as the second stage is moved, another head is used instead of one head of three of the heads that face the grating section, and the positional information of the second stage is measured by three heads including two remaining heads and the another head, instead of the three heads used previously, the another head being different from the three heads used previously, and the two remaining heads excluding the one head of the three heads used previously.

40. The exposure method according to claim 39, wherein correction information for the positional information obtained from the another head is acquired, based on the positional information obtained from the three heads including the one head.

41. The exposure method according to claim 40, wherein as the second stage is moved, the another head also faces the grating section, in addition to the three heads including the one head, and further the one head moves off from the grating section and the three heads including the another head face the grating section.

42. The exposure method according to claim 41, wherein the grating section has four scale members each of which is disposed substantially parallel to the predetermined plane and has the reflective grating, and the another head faces another scale member of the four scale members, the another scale member being different from three scale members to which the three heads including the one head face, of the four scale members.

43. The exposure method according to claim 27, wherein an image projected via the projection optical system and the liquid of the liquid immersion area is detected by an aerial image measurement device via a slit pattern disposed on an upper surface of the second stage, and in detection of the image, the positional information of the second stage is measured by the second encoder system, and the image is projected on the slit pattern following movement of the second and the third stages that have come close together and also the scanning exposure is performed following the detection of the image.

44. The exposure method according to claim 43, wherein a fiducial mark disposed on the upper surface of the second stage is detected by the first detection system, in a detection operation of the mark of the substrate and the fiducial mark, the positional information of the second stage is measured by the second encoder system, and in the alignment, detection information of the first detection system and the aerial image measurement device is used.

45. The exposure method according to claim 44, wherein positional information of the substrate in a third direction orthogonal to the predetermined plane is detected by a second detection system disposed at the frame member, spaced apart from the projection optical system on one side in the first direction, in a detection operation of the substrate, the positional information of the second stage is measured by the second encoder system, and in the exposure operation, focus-leveling control of a pattern image of the mask and the substrate is performed based on detection information of the second detection system and the aerial image measurement device, the pattern image being projected via the projection optical system and the liquid of the liquid immersion area.

46. The exposure method according to claim 45, wherein the image is detected, via the slit pattern, at each of positions different from each other in the third direction, in order to acquire best focus information of the projection optical system.

47. A device manufacturing method, comprising:
exposing a wafer as the substrate using the exposure method according to claim 26; and
developing the wafer that has been exposed.

48. A making method of an exposure apparatus that exposes a substrate with an illumination light via a projection optical system and a liquid, the method comprising:
providing a frame member that supports the projection optical system;
providing a first detection system at the frame member, spaced apart from the projection optical system on one side in a first direction within a predetermined plane, the first detection system detecting a mark of the substrate, and the predetermined plane being orthogonal to an optical axis of the projection optical system;
providing a first stage system having a first stage and a first drive system, the first stage being disposed above the projection optical system and holding a mask illuminated with the illumination light, and the first drive system including a first motor to drive the first stage;
providing a liquid immersion member to surround a lens that is disposed closest to an image plane side, of a plurality of optical elements of the projection optical system, the liquid immersion member having a lower surface to which the substrate is disposed facing, and locally forming a liquid immersion area with the liquid under the lens;
providing a base member disposed below the liquid immersion member;
providing a second stage system having a second stage and a third stage that are disposed on the base member and a second drive system that includes a second motor to drive the second and the third stages, the second stage having a holder for holding the substrate;
providing a measurement system having a first encoder system that measures positional information of the first stage and a second encoder system that measures positional information of the second and the third stages, in the second encoder system one of a grating section and heads being provided at the second stage and the other of the grating section and the heads being provided at the frame member so that the other of the grating section and the heads is disposed on an outer side of the liquid immersion member with respect to the projection optical system, the second encoder system measuring the positional information of the second stage with a plurality of the heads that face the grating section, and the grating section having a reflective grating that is periodic in a direction parallel to the predetermined plane; and
providing a controller coupled to the first and the second stage systems and the measurement system, the controller controlling the first and the second drive systems based on correction information for compensating for a measurement error of the second encoder system that occurs due to the heads and measurement information of the first and the second encoder systems so that, in an exposure operation of the substrate, alignment between the mask and the substrate is performed based on detection information of the first detection system and scanning exposure in which the mask and the substrate are each moved relative to the illumination light is performed with the first direction serving as a scanning direction, and also the measurement error is compensated for, wherein
the controller:
controls the second drive system so that the second and the third stages are relatively moved in order to cause the second stage to come close, from the one side in the first direction, to the third stage that is placed facing the projection optical system, and so that the second and the third stages that have come close together are relatively moved from the one side to the other side in the first direction with respect to the liquid immersion member in order to place the second stage to face the projection optical system instead of the third stage while substantially maintaining the liquid immersion area under the lens; and
controls the second drive system so that, in the exposure operation, the second stage is moved from the one side to the other side in the first direction with respect to the liquid immersion member while facing the liquid immersion member, in order to cause the substrate to be placed facing the lower surface of the liquid immersion member by the second stage, and perform the scanning exposure via the projection optical system and the liquid of the liquid immersion area, from an area located on the one side in the first direction, of a plurality of areas on the substrate.

* * * * *